(12) United States Patent
Kadota

(10) Patent No.: US 10,177,739 B2
(45) Date of Patent: Jan. 8, 2019

(54) ELASTIC WAVE DEVICE

(71) Applicant: Murata Manufacturing Co., Ltd., Nagaokakyo-shi, Kyoto-fu (JP)

(72) Inventor: Michio Kadota, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 358 days.

(21) Appl. No.: 15/230,529

(22) Filed: Aug. 8, 2016

(65) Prior Publication Data

US 2016/0344369 A1    Nov. 24, 2016

Related U.S. Application Data

(63) Continuation of application No. PCT/JP2015/054769, filed on Feb. 20, 2015.

(30) Foreign Application Priority Data

Mar. 13, 2014  (JP) .................................. 2014-050381

(51) Int. Cl.
    *H03H 9/64*    (2006.01)
    *H03H 9/02*    (2006.01)
    *H03H 9/145*   (2006.01)

(52) U.S. Cl.
    CPC .......... *H03H 9/64* (2013.01); *H03H 9/02559* (2013.01); *H03H 9/14544* (2013.01)

(58) Field of Classification Search
    CPC ... H03H 9/64; H03H 9/02559; H03H 9/14544
    See application file for complete search history.

(56) References Cited

U.S. PATENT DOCUMENTS 7,626,313 B2 * 12/2009 Yaoi .................... H03H 9/02559
                                                310/313 B
7,705,515 B2 *  4/2010 Nishiyama ......... H03H 9/02559
                                                310/313 A (Continued)

FOREIGN PATENT DOCUMENTS

JP    2008-177885 A    7/2008
JP    2011-166259 A    8/2011

(Continued)

OTHER PUBLICATIONS

English translation of Official Communication issued in corresponding International Application PCT/JP2015/054769, dated Apr. 7, 2015.

*Primary Examiner* — J. San Martin
(74) *Attorney, Agent, or Firm* — Keating & Bennett, LLP

(57) ABSTRACT

An elastic wave device includes an IDT electrode disposed on a $LiNbO_3$ substrate and an aluminum nitride film or a silicon nitride film is stacked to cover the IDT electrode and utilizes a leaky elastic wave. The IDT electrode includes a metal selected from a group consisting of Cu, Al, Au, Pt, and Ni. Euler angles of the $LiNbO_3$ are (0°±5°, θ, 0°±5°), and when X denotes a wavelength-normalized thickness of the IDT electrode and Y denotes θ of the Euler angles, Y is set in a specific range depending on the range of the wavelength-normalized thickness of the IDT electrode, the range of the wavelength-normalized thickness of the aluminum nitride film or the silicon nitride film, and the kind of metal of which the IDT electrode is composed.

4 Claims, 33 Drawing Sheets

(56) References Cited

U.S. PATENT DOCUMENTS

| | | | | |
|---|---|---|---|---|
| 9,484,885 B2* | 11/2016 | Watanabe | ............ | H03H 9/0222 |
| 2004/0164644 A1* | 8/2004 | Nishiyama | ............... | H03H 3/10 |
| | | | | 310/313 A |
| 2007/0090898 A1* | 4/2007 | Kando | ................. | H03H 9/0222 |
| | | | | 333/195 |
| 2007/0120439 A1* | 5/2007 | Kadota | .................... | H03H 3/10 |
| | | | | 310/313 R |
| 2012/0019101 A1* | 1/2012 | Nakahashi | ........... | H03H 9/0028 |
| | | | | 310/313 C |
| 2018/0205403 A1* | 7/2018 | Konno | .................. | H03H 9/145 |

FOREIGN PATENT DOCUMENTS

| | | | | |
|---|---|---|---|---|
| JP | 2013-168864 A | | 8/2013 | |
| WO | WO-2010032383 A1 * | | 3/2010 | ........... H03H 9/0222 |

* cited by examiner

Ni ELECTRODE THICKNESS (λ) AT 0.02 ≤ AlN < 0.075

Ni ELECTRODE THICKNESS (λ) AT 0.075 ≤ AlN < 0.125

ELASTIC WAVE DEVICE

CROSS REFERENCE TO RELATED APPLICATIONS

This application claims the benefit of priority to Japanese Patent Application 2014-050381 filed Mar. 13, 2014 and is a Continuation Application of PCT/JP2015/054769 filed on Feb. 20, 2015, the entire contents of each of these applications are hereby incorporated herein by reference.

BACKGROUND OF THE INVENTION

1. Field of the Invention

The present invention relates to elastic wave devices in which an IDT electrode and a high acoustic velocity film are stacked on a $LiNbO_3$ substrate, and more particularly to an elastic wave device that utilizes a leaky elastic wave.

2. Description of the Related Art

Elastic wave devices, which are used as filters of communication devices or the like, are desired to achieve high frequency and low loss. Japanese Unexamined Patent Application Publication No. 2008-177885 discloses a surface acoustic wave filter that uses a 64°±3° Y-X $LiNbO_3$ substrate or uses 41°±3° Y-X $LiNbO_3$. In Japanese Unexamined Patent Application Publication No. 2008-177885, IDT electrodes are disposed on a piezoelectric substrate composed of $LiNbO_3$. In addition, a protection film composed of $SiO_2$, SiNx, Si, or $Al_2O_3$ is disposed at a surface-acoustic-wave-propagating portion of the $LiNbO_3$ substrate. In Japanese Unexamined Patent Application Publication No. 2008-177885, each reflector electrode includes a busbar electrode substantially at the center in the extending direction of electrode fingers. The busbar electrode extends in the propagation direction of the surface acoustic wave and has a width that is less than or equal to half the wavelength of the surface acoustic wave. This configuration suppresses a leaky wave of a surface acoustic wave in the transversal direction and reduces insertion loss.

However, the acoustic velocity and the insertion loss achieved by the surface acoustic wave device described in Japanese Unexamined Patent Application Publication No. 2008-177885 are not high enough and low enough, respectively.

Leaky elastic waves and Love waves are known as elastic waves that propagate on $LiNbO_3$. Leaky elastic waves have a high acoustic velocity but have a large attenuation constant, which makes it difficult to achieve a low loss. In contrast, Love waves have a low acoustic velocity, which makes it difficult to achieve a high acoustic velocity, but are unlikely to leak.

Therefore, it has been attempted to increase the acoustic velocity by using a leaky elastic wave and by stacking a high acoustic velocity film in the related art. However, since the acoustic velocity is high in a structure in which a high acoustic velocity film is stacked, a leaky elastic wave is output and an attenuation constant undesirably increases.

SUMMARY OF THE INVENTION

Preferred embodiments of the present invention provide an elastic wave device that achieves a high acoustic velocity and a low loss by using a leaky elastic wave having a small attenuation constant.

An elastic wave device according to a first preferred embodiment of the present invention includes a $LiNbO_3$ substrate, an IDT electrode disposed on the $LiNbO_3$ substrate, and an aluminum nitride film disposed on the $LiNbO_3$ substrate to cover the IDT electrode, and utilizes a leaky elastic wave that propagates on the $LiNbO_3$ substrate.

In an elastic wave device according to the first preferred embodiment of the present invention, an IDT electrode includes a metal including, as a main component, one material selected from a group consisting of Cu, Al, Au, Pt, and Ni. Euler angles of the $LiNbO_3$ substrate are (0°±5°, θ, 0°±5°), and when X denotes a wavelength-normalized thickness of the IDT electrode and Y denotes θ of the Euler angles, Y which is θ of the Euler angles is set in any of ranges in Table 1 to Table 5 depending on a kind of the metal of which the IDT electrode is composed and a range of a wavelength-normalized thickness of the aluminum nitride film.

TABLE 1

| Cu electrode | |
|---|---|
| $0.02 \leq <0.075$ | $Y = 119.8 - 1644X + 64107X^2 - 820434X^3 + 4.5 \times 10^6X^4 - 1.2 \times 10^7X^6 + 1.1X^6$ to $Y = 153 + 169X - 363X^2$ |
| $0.075 \leq <0.125$ | $Y = 106.7 - 1278X + 53014X^2 - 700901X^3 + 4.1 \times 10^6X^4 - 1.1 \times 10^7X^5 + 1.1 \times 10^7X^6$ to $Y = 143 + 209X - 739X^2 + 907X^3$ |
| $0.125 \leq <0.175$ | $Y = 89.6 - 493X + 25919X^2 - 255926X^3 + 911653X^4 - 1.1X^5$ to $Y = 132 + 207X - 195X^2$ |
| $0.175 \leq <0.225$ | $Y = 79.4 - 207.6X + 21115X^2 - 220752X^3 + 803734X^4 - 988585X^5$ to $Y = 124 + 547X - 2351X^2 + 3513X^3$ |
| $0.225 \leq <0.275$ | $Y = 70.4 - 35.7X + 13366X^2 - 125408X^3 + 392064X^4 - 406193X^5$ to $Y = 125.8 + 547.4X - 2351X^2 + 3513X^3$ |

TABLE 2

| Al electrode | |
|---|---|
| $0.02 \leq <0.075$ | $Y = 154 - 17X - 18$ to $Y = 154 - 17X + 18$ |
| $0.075 \leq <0.125$ | $Y = 132 - 13X - 18$ to $Y = 132 - 13X + 18$ |
| $0.125 \leq <0.175$ | $Y = 116 - 13X - 18$ to $Y = 116 - 13X + 18$ |
| $0.175 \leq <0.225$ | $Y = 101 - 13X - 18$ to $Y = 101 - 13X + 18$ |
| $0.225 \leq <0.275$ | $Y = 88 - 13X - 18$ to $Y = 88 - 13X + 18$ |

TABLE 3

Au electrode

| | |
|---|---|
| $0.02 \leq <0.075$ | $Y = 143.1 - 2591X + 221241X^2 - 6.66109 \times 10^6X^3 + 7.5 \times 10^7X^4 - 2.9 \times 10^8X^5$ to $Y = 154 + 513X - 2508X^2$ |
| $0.075 \leq <0.125$ | $Y = 113.3 - 1613X + 173621X^2 - 5.4 \times 10^6X^3 + 6.1 \times 10^7X^4 - 2.4 \times 10^8X^5$ to $Y = 151 + 187X + 1187X^2$ |
| $0.125 \leq <0.175$ | $Y = 91.57 - 1590X + 203628X^2 - 5.7 \times 10^6X^3 + 5.8 \times 10^7X^4 - 2.1 \times 10^8X^5$ to $Y = 140 + 265X + 623X^2$ |
| $0.175 \leq <0.225$ | $Y = 103.7 - 559.1X + 42955X^2 - 704717X^3 + 3 \times 10^6X^4$ to $Y = 146 + 191X - 215X^2$ |
| $0.225 \leq <0.275$ | $Y = 88.8 + 26.8X + 66840X^2 - 4.45 \times 10^6X^3 + 1.15 \times 10^8X^4 - 1.25 \times 10^9X^5 + 4.8 \times 10^9X^6$ to $Y = 176 - 450X + 2317X^2$ |

TABLE 4

Pt electrode

| | |
|---|---|
| $0.02 \leq <0.075$ | $Y = 134 + 303X + 2874X^2 - 445059X^3 + 3X^4$ to $Y = 159 + 333X - 1040X^2$ |
| $0.075 \leq <0.125$ | $Y = 101 - 345X + 66704X^2 - 1.4 \times 10^6X^3 + 7.6 \times 10^6X^4$ to $Y = 147 + 350X + 281X^2$ |
| $0.125 \leq <0.175$ | $Y = 94.45 - 2780X + 313312X^2 - 9.1 \times 10^6X^3 + 10 \times 10^7X^4 - 3.8 \times 10^8X^5$ to $Y = 140 + 258X + 918X^2$ |
| $0.175 \leq <0.225$ | $Y = 101.1 + 1132X - 94867X^2 + 3.4 \times 10^6X^3 - 4.8 \times 10^7X^4 + 2.2 \times 10^8X^5$ to $Y = 154 - 66X + 1563X^2$ |
| $0.225 \leq <0.275$ | $Y = 91.1 - 793.7X + 132135X^2 - 6.4 \times 10^6X^3 + 1.4 \times 10^8X^4 - 1.4 \times 10^9X^5 + 5.1 \times 10^9X^6$ to $Y = 175 - 527X + 4617X^2 - 13850X^3$ |

TABLE 5

Ni electrode

| | |
|---|---|
| $0.02 \leq <0.075$ | $Y = 115.9 - 1162X + 47603X^2 - 584771X^3 + 3.1 \times 10^6X^4 - 7.4 \times 10^6X^5 + 6.7 \times 10^6X^6$ to $Y = 154 + 51X + 19.5X^2$ |
| $0.075 \leq <0.125$ | $Y = 100.3 - 769X + 30871X^2 - 326052X^3 + 1.3 \times 10^6X^4 - 1.7 \times 10^6X^5$ to $Y = 134 + 154X - 300X^2$ |
| $0.125 \leq <0.175$ | $Y = 67.99 + 1440X - 46900X^2 + 917682X^3 - 9.1 \times 10^6X^4 + 4.5 \times 10^7X^5 - 1.1 \times 10^8X^6 + 1.1 \times 10^8X^7$ to $Y = 139 + 194X - 177X^2$ |
| $0.175 \leq <0.225$ | $Y = 68.79 + 618.4X - 15149X^2 + 215569X^3 - 1.35 \times 10^6X^4 + 3.64 \times 10^6X^5 - 3.51 \times 10^6X^6$ to $Y = 129 + 642X - 3232X^2 + 5479X^3$ |
| $0.225 \leq <0.275$ | $Y = 59.867 + 826.5X - 15571X^2 + 176484X^3 - 985113X^4 + 2.5 \times 10^6X^5 - 2.3 \times 10^6X^6$ to $Y = 118 + 576X - 2604X^2 + 4075X^3$ |

An elastic wave device according to a second preferred embodiment of the present invention includes a LiNbO$_3$ substrate, an IDT electrode disposed on the LiNbO$_3$ substrate, and a silicon nitride film disposed on the LiNbO$_3$ substrate to cover the IDT electrode, and utilizes a leaky elastic wave that propagates on the LiNbO$_3$ substrate.

In the second preferred embodiment of the present invention, the IDT electrode is composed of a metal including, as a main component, one material selected from a group consisting of Cu, Al, Au, Pt, and Ni. Euler angles of the LiNbO$_3$ substrate are (0°±5°, θ, 0°±5°), and when X denotes a wavelength-normalized thickness of the IDT electrode and Y denotes θ of the Euler angles, Y is in any of ranges in Table 6 to Table 10 depending on a kind of the metal of which the IDT electrode is composed and a range of a wavelength-normalized thickness of the silicon nitride film.

TABLE 6

Cu electrode

| | |
|---|---|
| $0.02 \leq <0.075$ | $Y = 111 - 498X + 41204X^2 - 506285X^3 + 2.1 \times 10^6X^4 - 2.9X^5$ to $Y = 150 + 376X - 1867X^2 + 3151X^3$ |
| $0.075 \leq <0.125$ | $Y = 96.3 - 854X + 42082X^2 - 459289X^3 + 1.86 \times 10^6X^4 - 2.55 \times 10^6X^5$ to $Y = 135 + 333X - 868X^2 + 621X^3$ |
| $0.125 \leq <0.175$ | $Y = 58.42 + 3058X - 122626X^2 + 2.55 \times 10^6X^3 - 2.61 \times 10^7X^4 + 1.35 \times 10^8X^5 - 3.43 \times 10^8X^6 + 3.38 \times 10^8X^7$ to $Y = 125 + 322X - 568X^2$ |
| $0.175 \leq <0.275$ | $Y = 69.36 + 1741X - 69965X^2 + 1.51 \times 10^6X^3 - 1.56 \times 10^7X^4 + 8.037 \times 10^7X^5 - 2.01 \times 10^8X^6 + 1.95 \times 10^8X^7$ to $Y = 126 + 263X - 424X^2$ |
| $0.225 \leq <0.275$ | $Y = 76.57 - 46.58X + 10865X^2 - 95112X^3 + 272166X^4 - 249810X^5$ to $Y = 121 + 263X - 424X^2$ |

TABLE 7

Al electrode

| | |
|---|---|
| $0.02 \leq <0.075$ | $Y = 106 - 124X - 204X^2$ to $Y = 163 - 105X + 714X^2 - 1122X^3$ |
| $0.075 \leq <0.125$ | $Y = 92 + 98X - 72X^2$ to $Y = 153 - 88X + 423X^2$ |
| $0.125 \leq <0.175$ | $Y = 85 + 188X - 409X^2$ to $Y = 144 + 76X - 235X^2$ |
| $0.175 \leq <0.225$ | $Y = 80 + 197X - 433X^2$ to $Y = 141 + 67X - 188X^2$ |
| $0.225 \leq <0.275$ | $Y = 76.7 + 133.1X - 239X^2$ to $Y = 136 + 53X - 134X^2$ |

TABLE 8

Au electrode

| | |
|---|---|
| 0.02 ≤ <0.075 | Y = 138.8 − 521.5X + 59626X² − 1.6 × 10⁶X³ + 9.7 × 10⁶X⁴ to Y = 154.6 + 323X − 1005X² |
| 0.075 ≤ <0.125 | Y = 78.95 − 2244X + 308668X² − 9.23 × 10⁶X³ + 1.03 × 10⁸X⁴ − 3.92 × 10⁸X⁶ to Y = 121.5 + 1406X − 8286X² |
| 0.125 ≤ <0.175 | Y = 75.14 − 972X + 163196X² − 4.73 × 10⁶X³ + 5.02 × 10⁷X⁴ − 1.83X⁵ to Y = 150.8 + 103.8X + 1446.4X² |
| 0.175 ≤ <0.225 | Y = 95.46 − 381X + 38962X² − 766242X³ + 3.89 × 10⁶X⁴ to Y = 139.1 + 191.4X − 215.1X² |
| 0.225 ≤ <0.275 | Y = 90.23 − 363.8X + 15154X² − 181875X³ − 8.63 × 10⁶X⁴ + 5.45 × 10⁷X⁶ to Y = 118.5 + 1461.9X − 8600.4X² |

TABLE 9

Pt electrode

| | |
|---|---|
| 0.02 ≤ <0.075 | Y = 137.8 + 1045.9X − 35270X² + 182370X³ to Y = 178.8 − 459.9X + 2654.2X² |
| 0.075 ≤ <0.125 | Y = 85.3 + 1563.5X − 13505X² − 334251X³ + 2.9 × 10⁶X⁴ to Y = 126.2 + 841.4X + 3530.7X² − 64451X³ |
| 0.125 ≤ <0.175 | Y = 80.25 + 1737.6X − 29616X² + 116182X³ to Y = 134.1 + 233X + 1288X² |
| 0.175 ≤ <0.225 | Y = 102 − 2120X + 171560X² − 4.29 × 10⁶X³ + 4.1 × 10⁷X⁴ − 1.35 × 10⁸X⁵ to Y = 143.8 + 106.3X + 681.3X² |
| 0.225 ≤ <0.275 | Y = 85.45 + 2448X − 171170X² + 4.82 × 10⁶X³ − 5.56 × 10⁷X⁴ + 2.19 × 10⁸X⁵ to Y = 172.2 − 496.4X + 3216X² |

TABLE 10

Ni electrode

| | |
|---|---|
| 0.02 ≤ <0.075 | Y = 77.39 + 889X − 10413X² + 39192X³ − 48758X⁴ to Y = 133.7 + 570.1X − 2561X² + 39863587X³ |
| 0.075 ≤ <0.125 | Y = 96.1 − 265.4X + 17881X² − 193077X³ + 724808X⁴ − 910916X⁵ to Y = 143.1 + 148X − 216.8X² |
| 0.125 ≤ <0.175 | Y = 83.26 − 139X + 17433X² − 212387X³ + 874177X⁴ − 1.2 × 10⁶X⁵ to Y = 143.7 + 208.6X − 275.3X² |
| 0.175 ≤ <0.225 | Y = 72.04 − 196.1X + 23821X² − 258686X³ + 977904X⁴ − 1.2 × 10⁶X⁵ to Y = 126.2 + 498.9X − 1958X² + 2608X³ |
| 0.225 ≤ <0.275 | Y = 69.12 − 307.4X + 22905X² to Y = 120.9 + 428.9X − 1427X² + 1528X³ |

According to the first and second preferred embodiments of the present invention, the IDT electrode is disposed on the LiNbO₃ substrate and the aluminum nitride film or the silicon nitride film is disposed to cover the IDT electrode. Accordingly, the elastic wave device utilizing a leaky elastic wave is capable of achieving a high acoustic velocity. In addition, since Y which is θ of the Euler angles is set in a specific range depending on the kind of metal of which the IDT electrode is composed and the range of the wavelength-normalized thickness of the aluminum nitride film or the silicon nitride film, the attenuation constant is made small. Consequently, both a high acoustic velocity and a low loss are achieved.

The above and other elements, features, steps, characteristics and advantages of the present invention will become more apparent from the following detailed description of the preferred embodiments with reference to the attached drawings.

Figure 29:
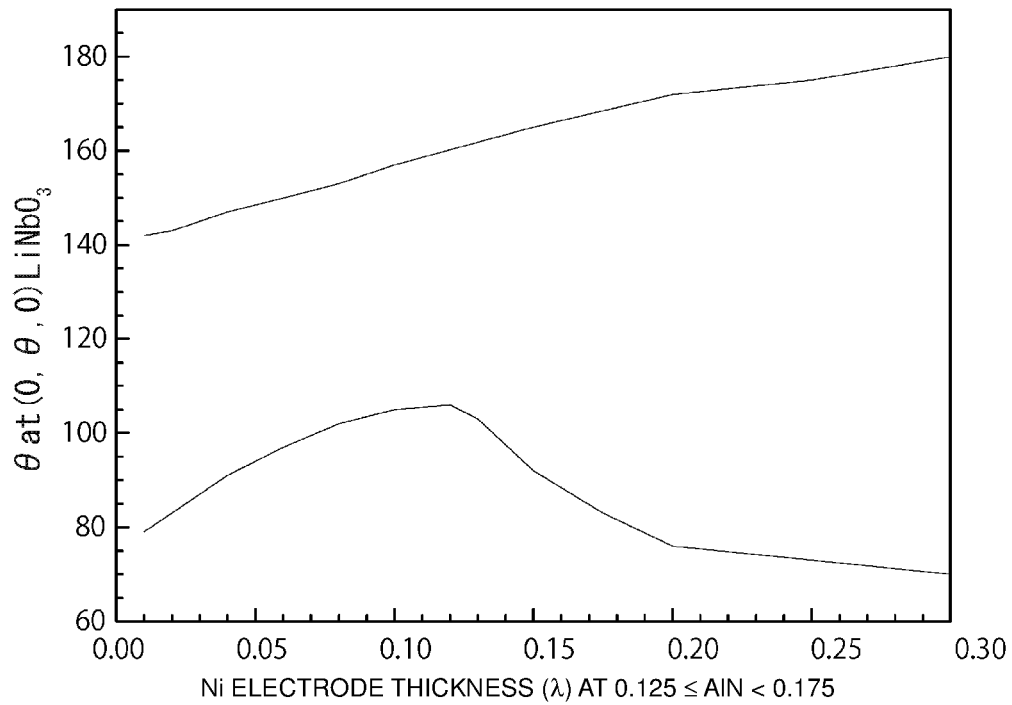

FIG. 29 is a diagram illustrating a line representing the lower limit and a line representing the upper limit of Y which is θ of the Euler angles of LiNbO$_3$ and which makes the attenuation constant α smaller than or equal to about 0.02 when the IDT electrode is composed of Ni and the wavelength-normalized thickness of the AlN film is larger than or equal to about 0.125 and smaller than about 0.175.

Figure 30:
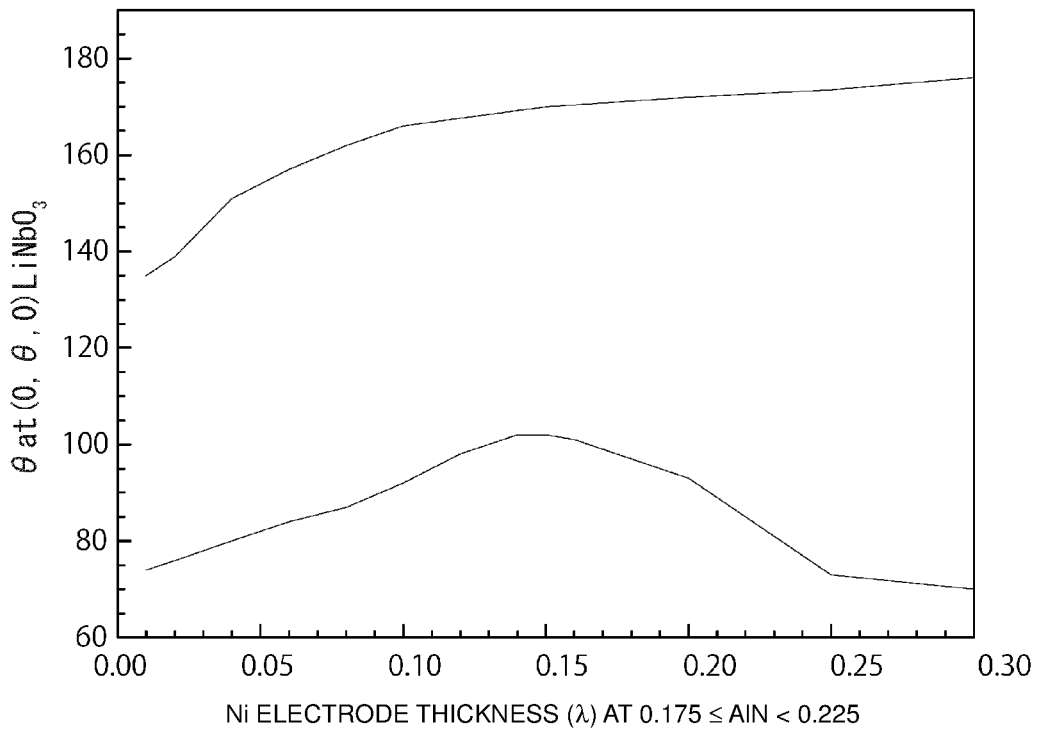

FIG. 30 is a diagram illustrating a line representing the lower limit and a line representing the upper limit of Y which is θ of the Euler angles of LiNbO$_3$ and which makes the attenuation constant α smaller than or equal to about 0.02 when the IDT electrode is composed of Ni and the wavelength-normalized thickness of the AlN film is larger than or equal to about 0.175 and smaller than about 0.225.

Figure 31:
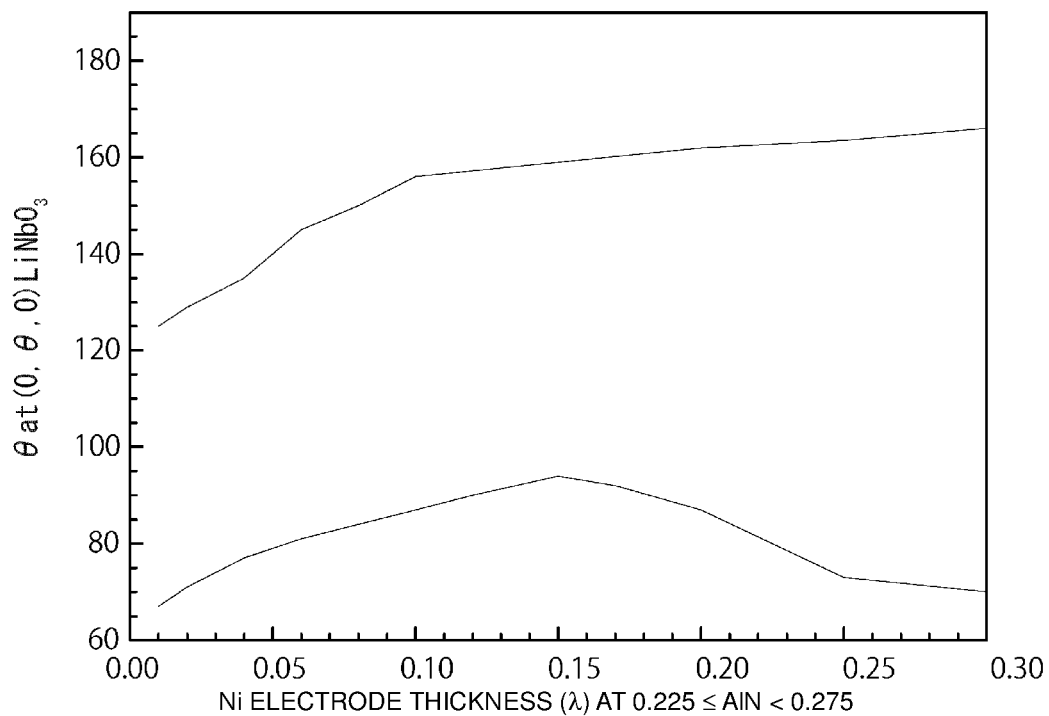

FIG. 31 is a diagram illustrating a line representing the lower limit and a line representing the upper limit of Y which is θ of the Euler angles of LiNbO$_3$ and which makes the attenuation constant α smaller than or equal to about 0.02 when the IDT electrode is composed of Ni and the wavelength-normalized thickness of the AlN film is larger than or equal to about 0.225 and smaller than about 0.275.

Figure 32:
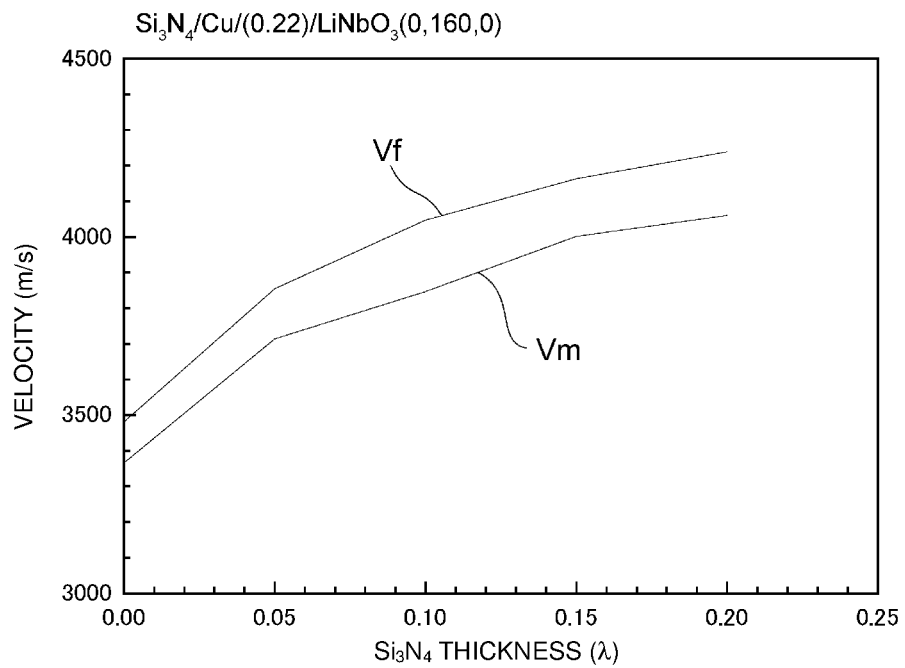

FIG. 32 is a diagram illustrating relationships between a wavelength-normalized thickness of a Si$_3$N$_4$ film and acoustic velocities in a structure in which an electrode composed of Cu having a wavelength-normalized thickness of about 0.22 is disposed on a LiNbO$_3$ substrate having Euler angles of (0°, 160°, 0°) and the Si$_3$N$_4$ film is stacked thereon according to a second preferred embodiment of the present invention.

Figure 33:
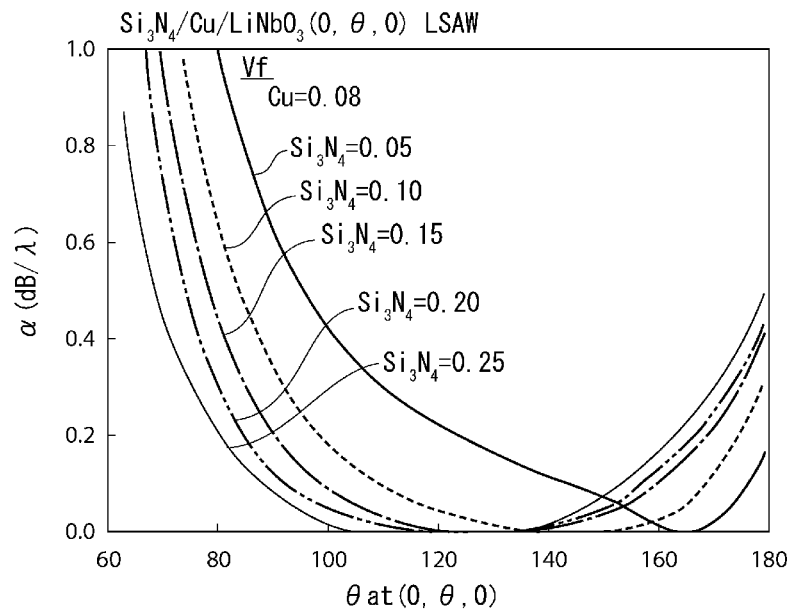

FIG. 33 is a diagram illustrating relationships between θ of the Euler angles and an attenuation constant α in structures in which the IDT electrode composed of Cu having a wavelength-normalized thickness of about 0.08 is disposed on a LiNbO$_3$ substrate having Euler angles of (0°, θ, 0°) and the Si$_3$N$_4$ film of various thicknesses is stacked thereon.

Figure 34:
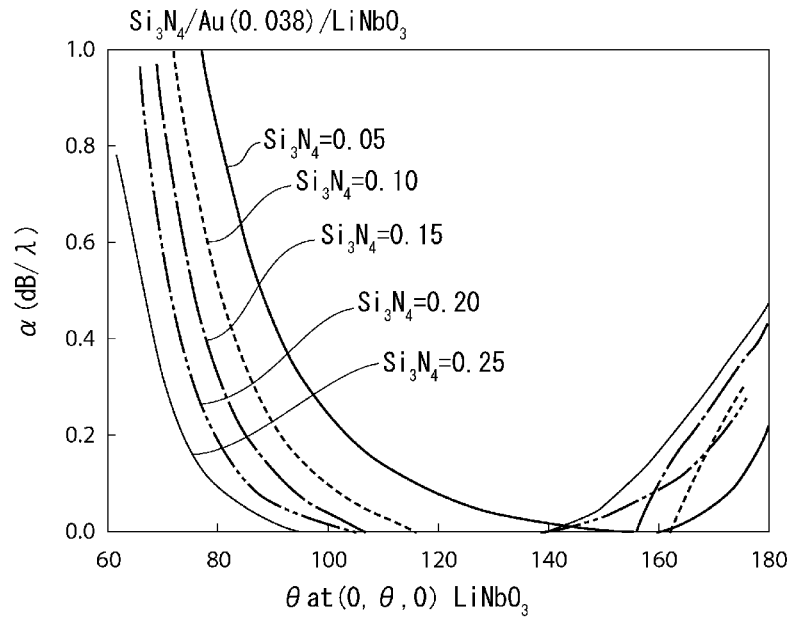

FIG. 34 is a diagram illustrating relationships between θ of the Euler angles and an attenuation constant α in structures in which the IDT electrode composed of Au having a wavelength-normalized thickness of about 0.038 is disposed on a LiNbO$_3$ substrate having Euler angles of (0°, θ, 0°) and the Si$_3$N$_4$ film of various thicknesses is stacked thereon.

Figure 35:
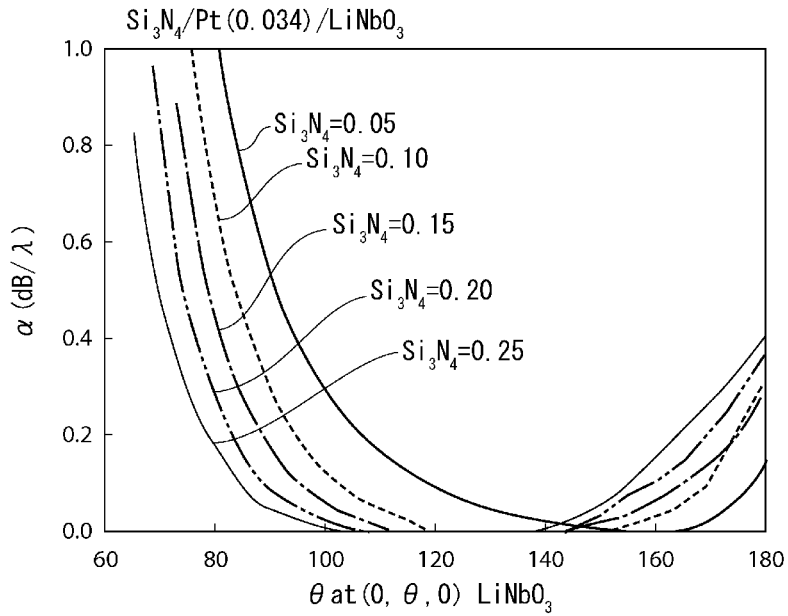

FIG. 35 is a diagram illustrating relationships between θ of the Euler angles and an attenuation constant α in structures in which the IDT electrode composed of Pt having a wavelength-normalized thickness of about 0.034 is disposed on a LiNbO$_3$ substrate having Euler angles of (0°, θ, 0°) and the Si$_3$N$_4$ film of various thicknesses is stacked thereon.

Figure 36:
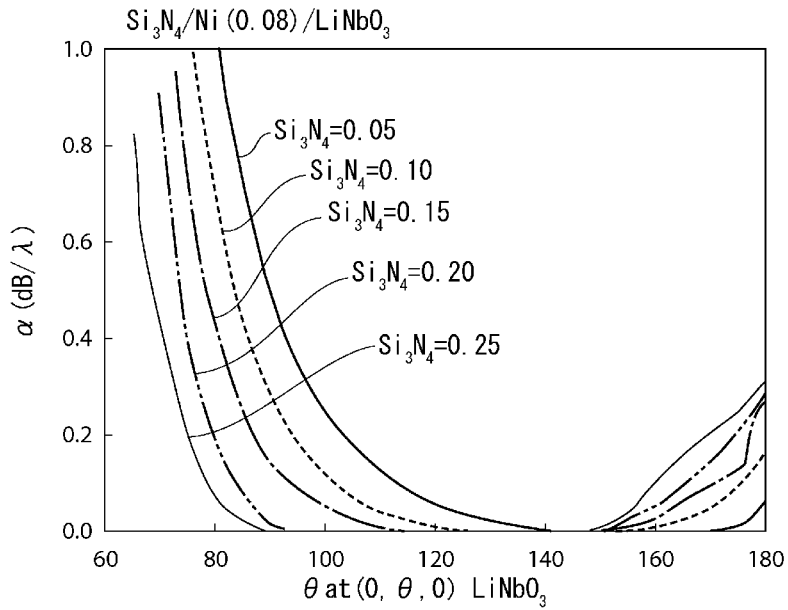

FIG. 36 is a diagram illustrating relationships between θ of the Euler angles and an attenuation constant α in structures in which the IDT electrode composed of Ni having a wavelength-normalized thickness of about 0.08 is disposed on a LiNbO$_3$ substrate having Euler angles of (0°, θ, 0°) and the Si$_3$N$_4$ film of various thicknesses is stacked thereon.

Figure 37:
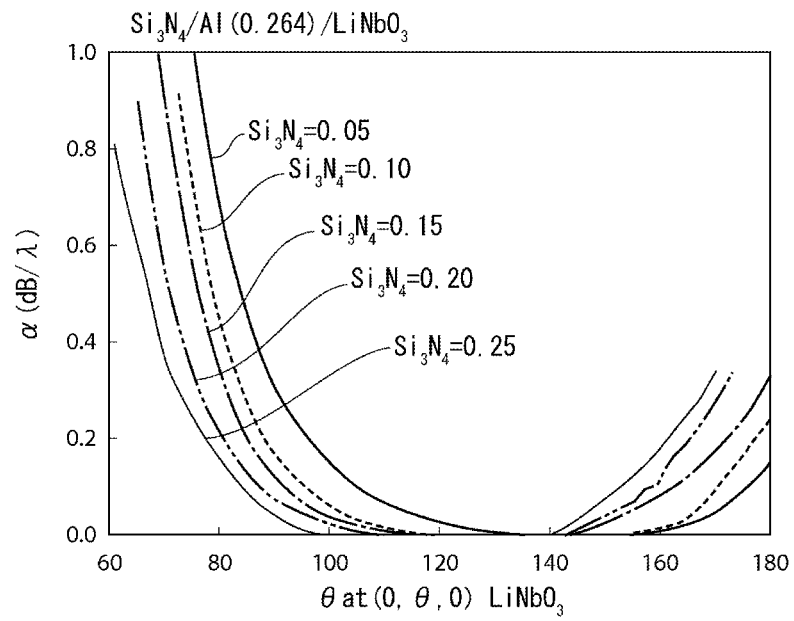

FIG. 37 is a diagram illustrating relationships between θ of the Euler angles and an attenuation constant α in structures in which the IDT electrode composed of Al having a wavelength-normalized thickness of about 0.264 is disposed on a LiNbO$_3$ substrate having Euler angles of (0°, θ, 0°) and the Si$_3$N$_4$ film of various thicknesses is stacked thereon.

Figure 38:
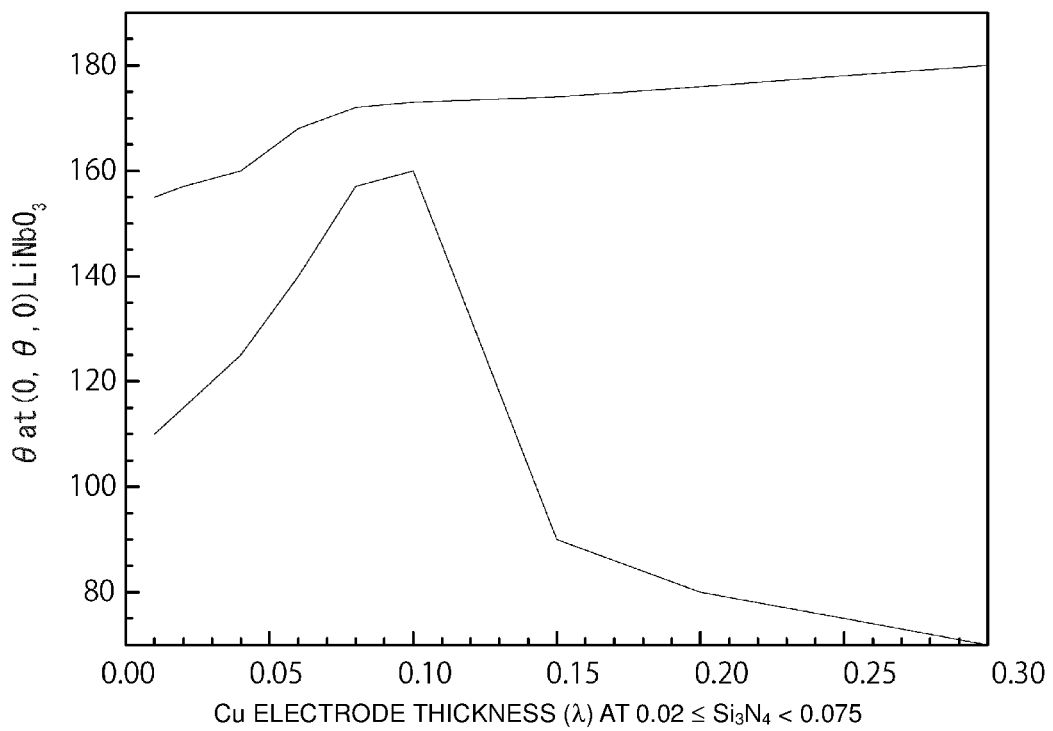

FIG. 38 is a diagram illustrating a line representing the lower limit and a line representing the upper limit of Y which is θ of the Euler angles and which makes the attenuation constant α smaller than or equal to about 0.02 when the IDT electrode is composed of Cu and the wavelength-normalized thickness of the Si$_3$N$_4$ film is larger than or equal to about 0.02 and smaller than about 0.075 according to the second preferred embodiment of the present invention.

Figure 39:
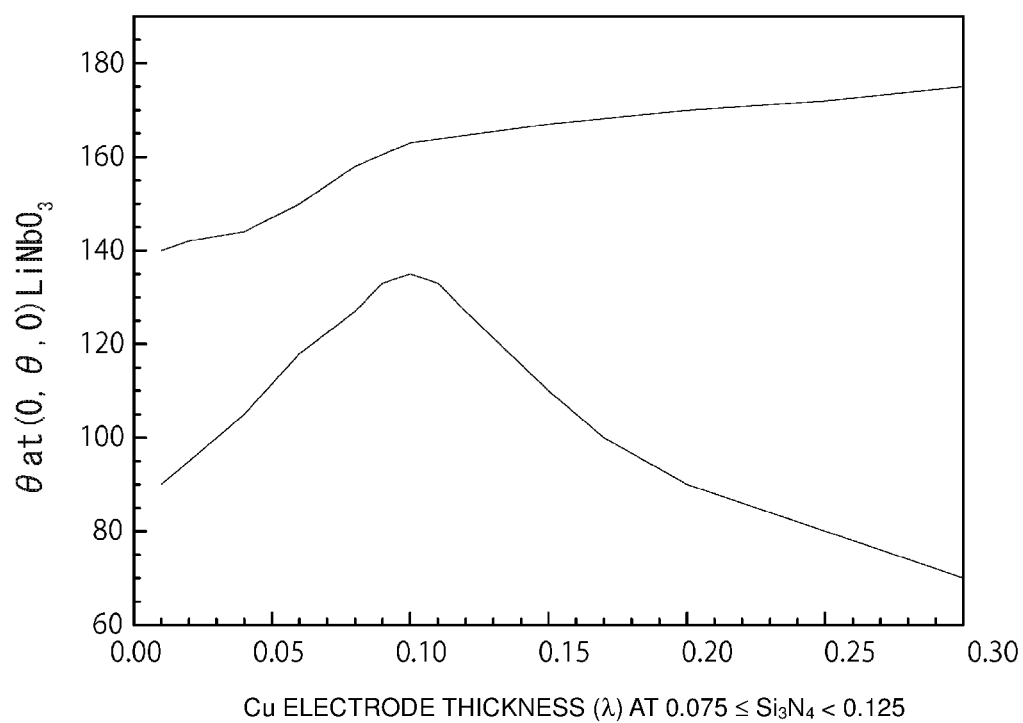

FIG. 39 is a diagram illustrating a line representing the lower limit and a line representing the upper limit of Y which is θ of the Euler angles and which makes the attenuation constant α smaller than or equal to about 0.02 when the IDT electrode is composed of Cu and the wavelength-normalized thickness of the Si$_3$N$_4$ film is larger than or equal to about 0.075 and smaller than about 0.125 according to the second preferred embodiment of the present invention.

Figure 40:
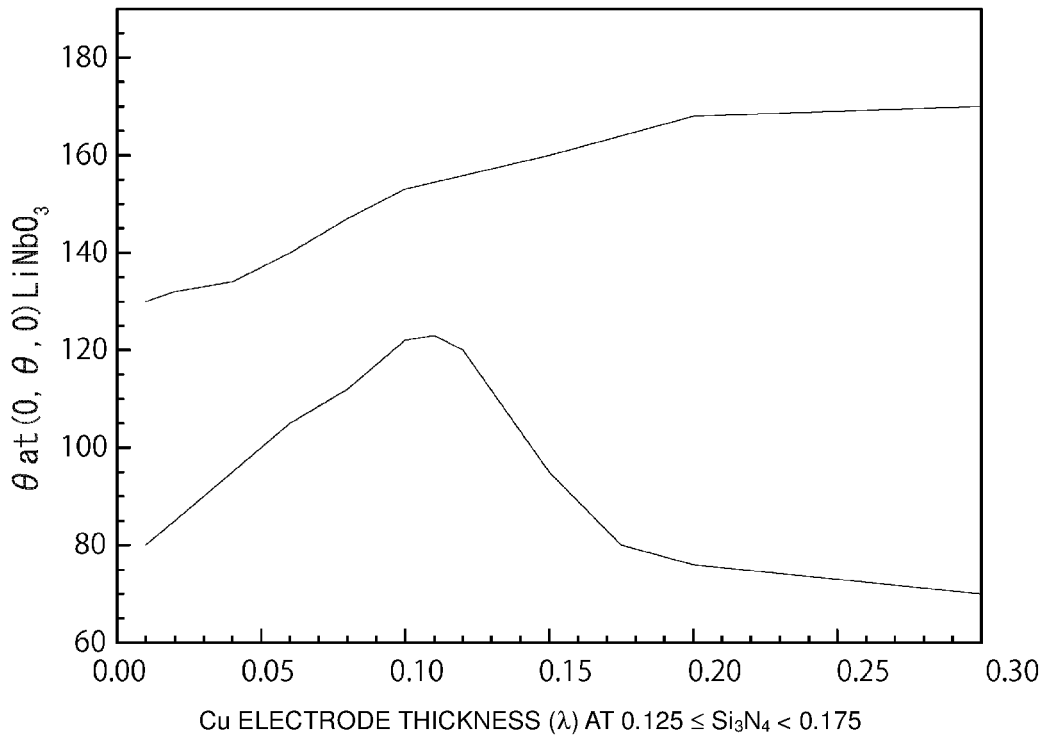

FIG. 40 is a diagram illustrating a line representing the lower limit and a line representing the upper limit of Y which is θ of the Euler angles and which makes the attenuation constant α smaller than or equal to about 0.02 when the IDT electrode is composed of Cu and the wavelength-normalized thickness of the Si$_3$N$_4$ film is larger than or equal to about 0.125 and smaller than about 0.175 according to the second preferred embodiment of the present invention.

Figure 41:
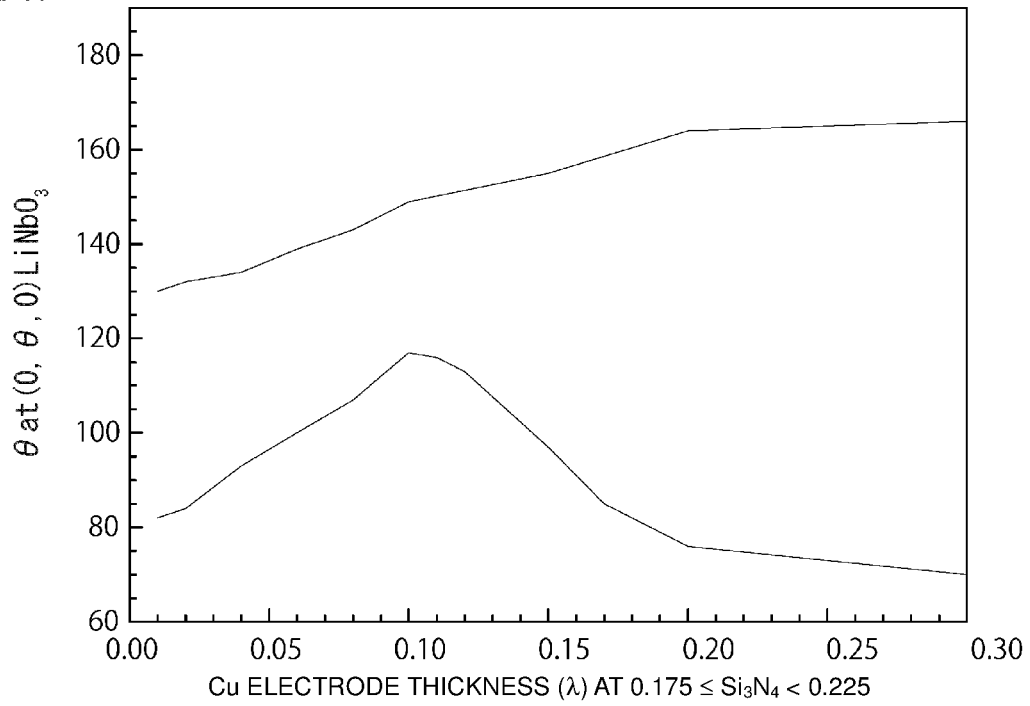

FIG. 41 is a diagram illustrating a line representing the lower limit and a line representing the upper limit of Y which is θ of the Euler angles and which makes the attenuation constant α smaller than or equal to about 0.02 when the IDT electrode is composed of Cu and the wavelength-normalized thickness of the Si$_3$N$_4$ film is larger than or equal to about 0.175 and smaller than about 0.225 according to the second preferred embodiment of the present invention.

Figure 42:
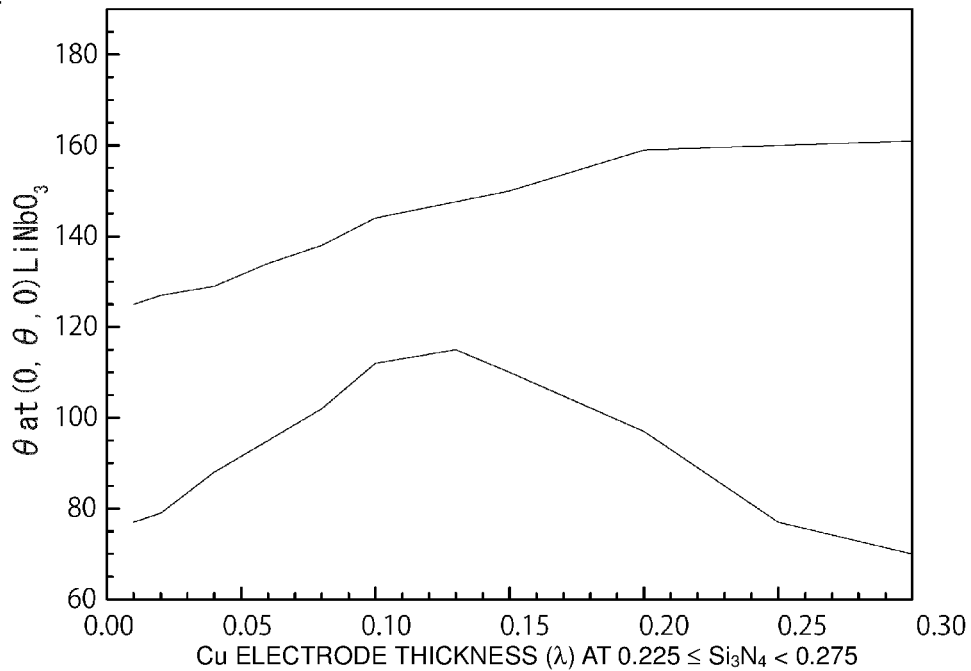

FIG. 42 is a diagram illustrating a line representing the lower limit and a line representing the upper limit of Y which is θ of the Euler angles and which makes the attenuation constant α smaller than or equal to about 0.02 when the IDT electrode is composed of Cu and the wavelength-normalized thickness of the Si$_3$N$_4$ film is larger than or equal to about 0.225 and smaller than about 0.275 according to the second preferred embodiment of the present invention.

Figure 43:
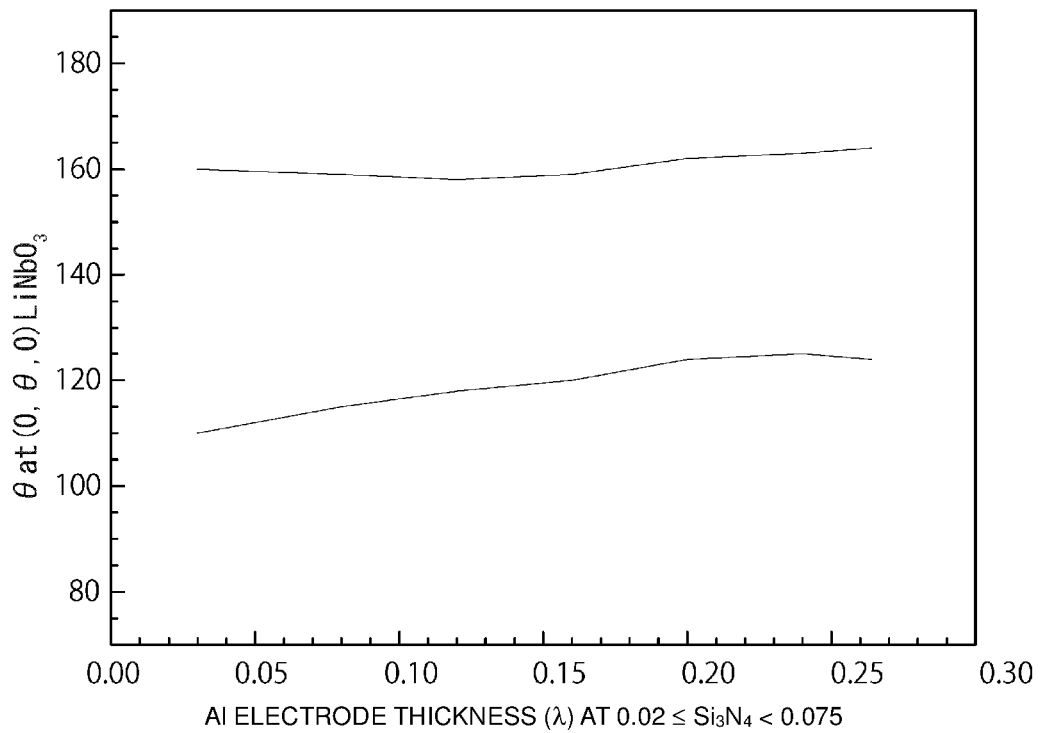

FIG. 43 is a diagram illustrating a line representing the lower limit and a line representing the upper limit of Y which is θ of the Euler angles and which makes the attenuation constant α smaller than or equal to about 0.02 when the IDT electrode is composed of Al and the wavelength-normalized thickness of the Si$_3$N$_4$ film is larger than or equal to about 0.02 and smaller than about 0.075 according to the second preferred embodiment of the present invention.

Figure 44:
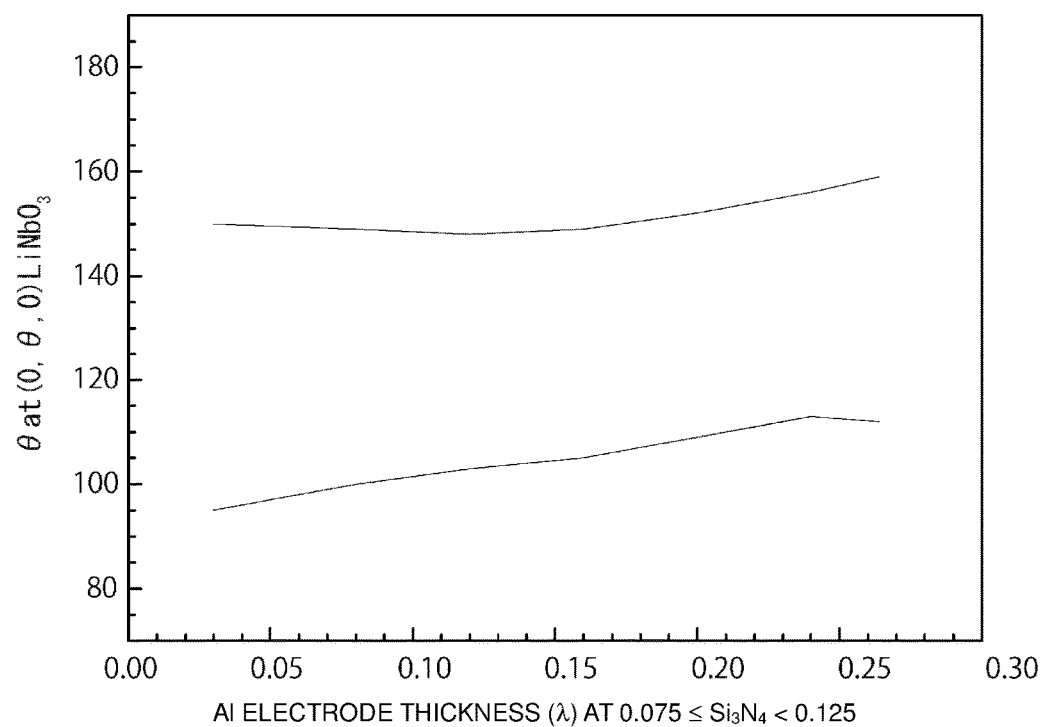

FIG. 44 is a diagram illustrating a line representing the lower limit and a line representing the upper limit of Y which is θ of the Euler angles and which makes the attenuation constant α smaller than or equal to about 0.02 when the IDT electrode is composed of Al and the wavelength-normalized thickness of the Si$_3$N$_4$ film is larger than or equal to about 0.075 and smaller than about 0.125 according to the second preferred embodiment of the present invention.

Figure 45:
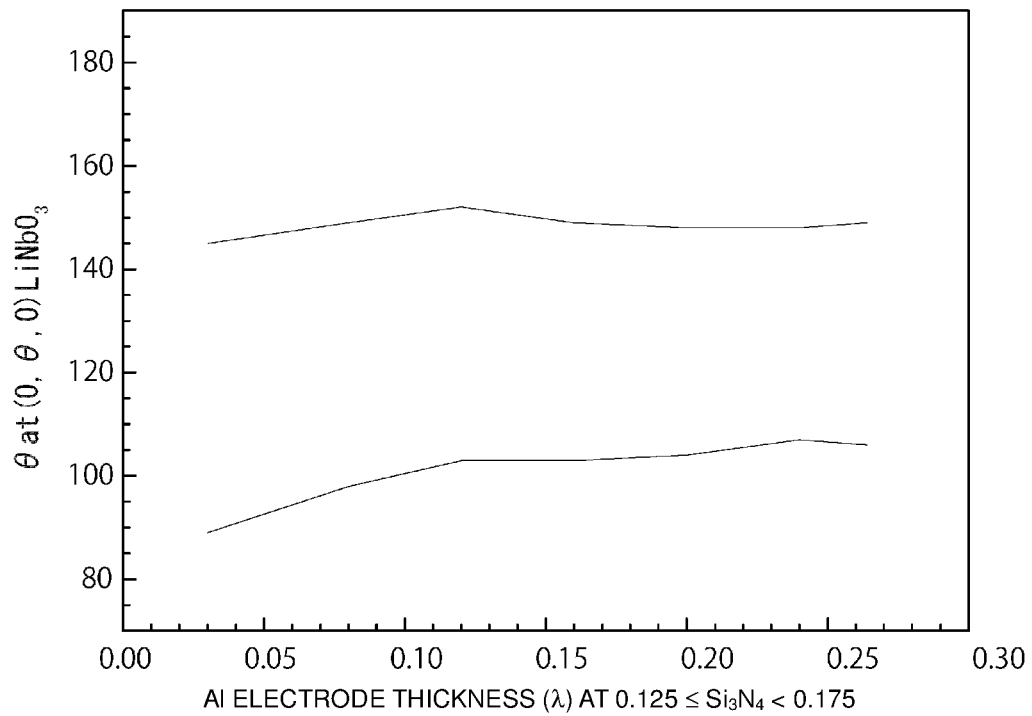

FIG. 45 is a diagram illustrating a line representing the lower limit and a line representing the upper limit of Y which is θ of the Euler angles and which makes the attenuation constant α smaller than or equal to about 0.02 when the IDT electrode is composed of Al and the wavelength-normalized thickness of the Si$_3$N$_4$ film is larger than or equal to about 0.125 and smaller than about 0.175 according to the second preferred embodiment of the present invention.

Figure 46:
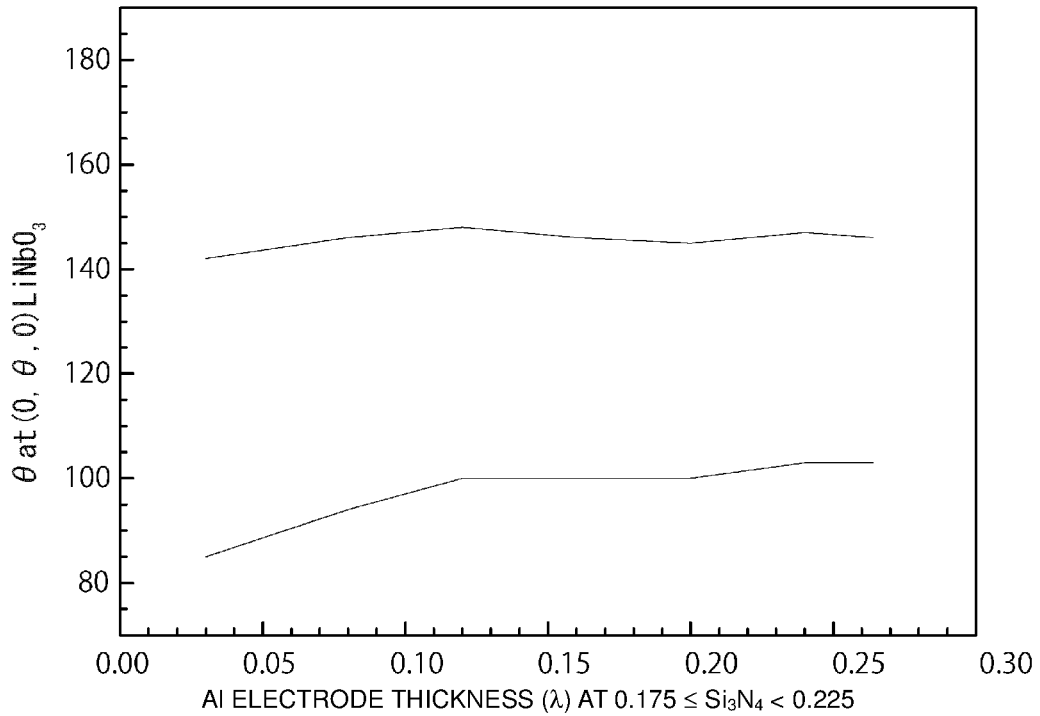

FIG. 46 is a diagram illustrating a line representing the lower limit and a line representing the upper limit of Y which is θ of the Euler angles and which makes the attenuation constant α smaller than or equal to about 0.02 when the IDT electrode is composed of Al and the wavelength-normalized thickness of the Si$_3$N$_4$ film is larger than or equal to about 0.175 and smaller than about 0.225 according to the second preferred embodiment of the present invention.

Figure 47:
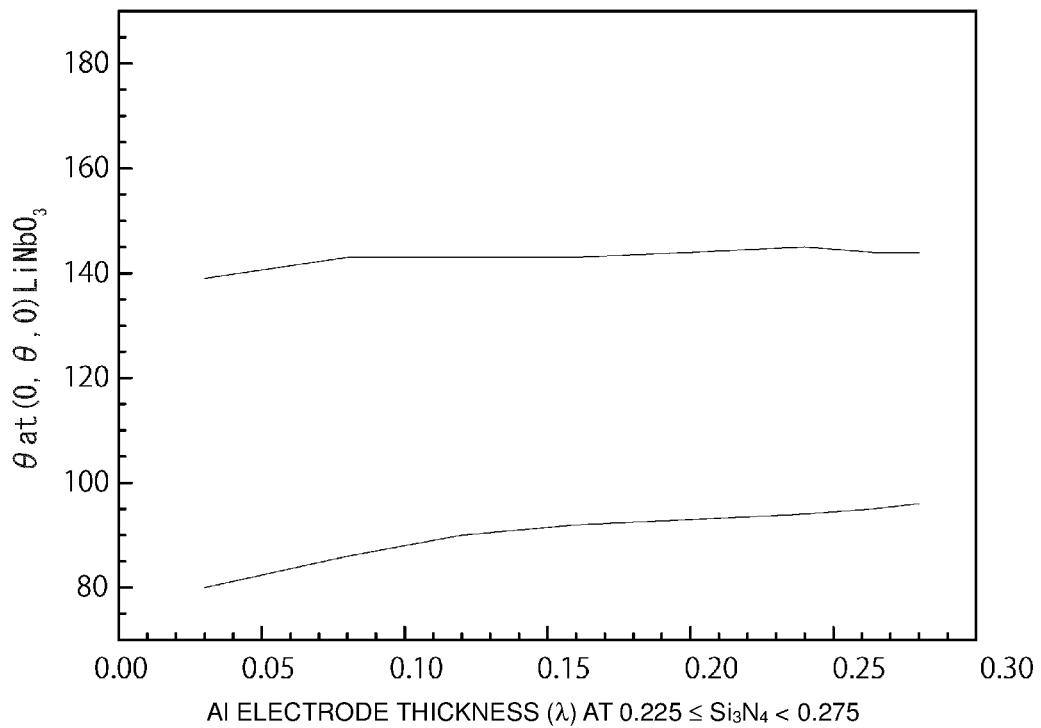

FIG. 47 is a diagram illustrating a line representing the lower limit and a line representing the upper limit of Y which is θ of the Euler angles and which makes the attenuation constant α smaller than or equal to about 0.02 when the IDT electrode is composed of Al and the wavelength-normalized thickness of the $Si_3N_4$ film is larger than or equal to about 0.225 and smaller than about 0.275 according to the second preferred embodiment of the present invention.

Figure 48:
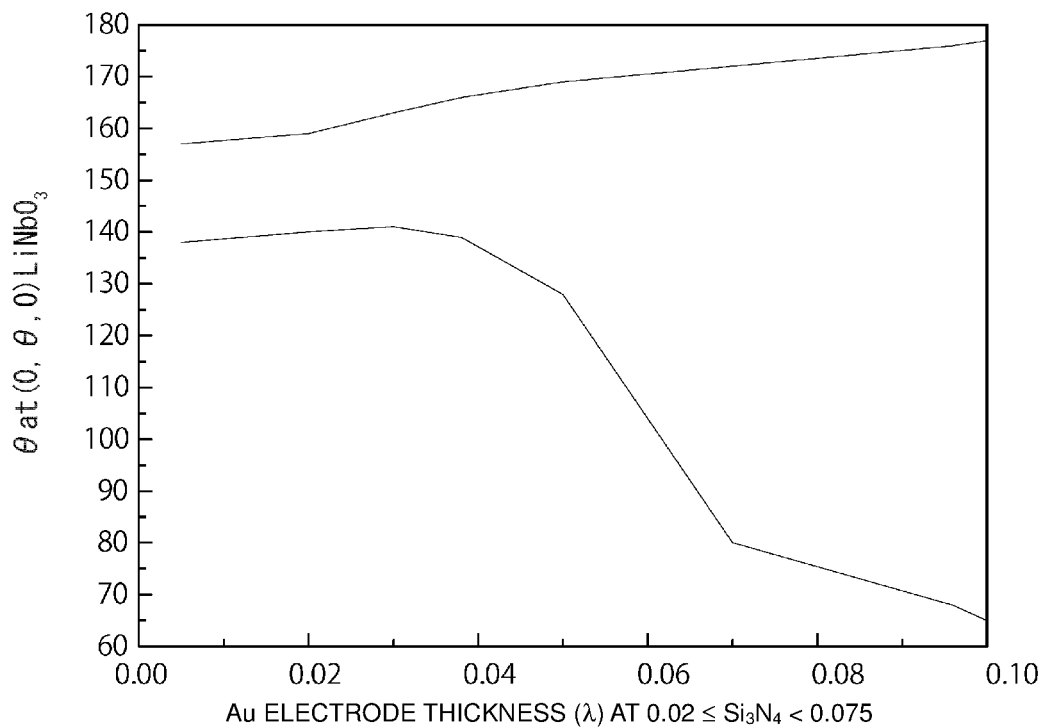

FIG. 48 is a diagram illustrating a line representing the lower limit and a line representing the upper limit of Y which is θ of the Euler angles and which makes the attenuation constant α smaller than or equal to about 0.02 when the IDT electrode is composed of Au and the wavelength-normalized thickness of the $Si_3N_4$ film is larger than or equal to about 0.02 and smaller than about 0.075 according to the second preferred embodiment of the present invention.

Figure 49:
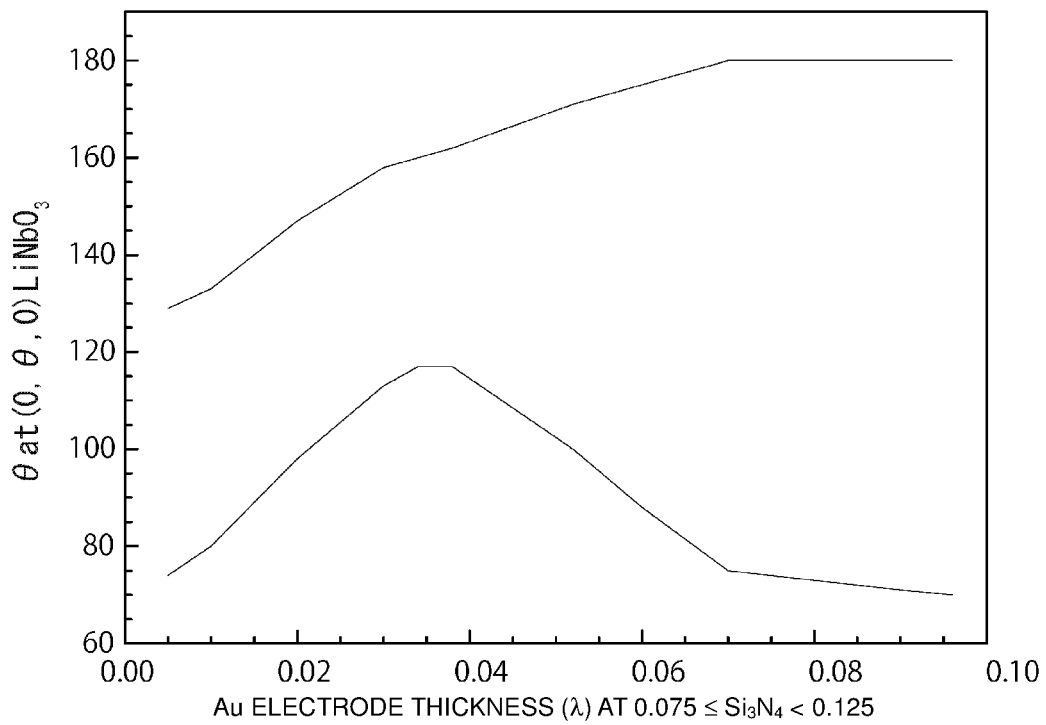

FIG. 49 is a diagram illustrating a line representing the lower limit and a line representing the upper limit of Y which is θ of the Euler angles and which makes the attenuation constant α smaller than or equal to about 0.02 when the IDT electrode is composed of Au and the wavelength-normalized thickness of the $Si_3N_4$ film is larger than or equal to about 0.075 and smaller than about 0.125 according to the second preferred embodiment of the present invention.

Figure 50:
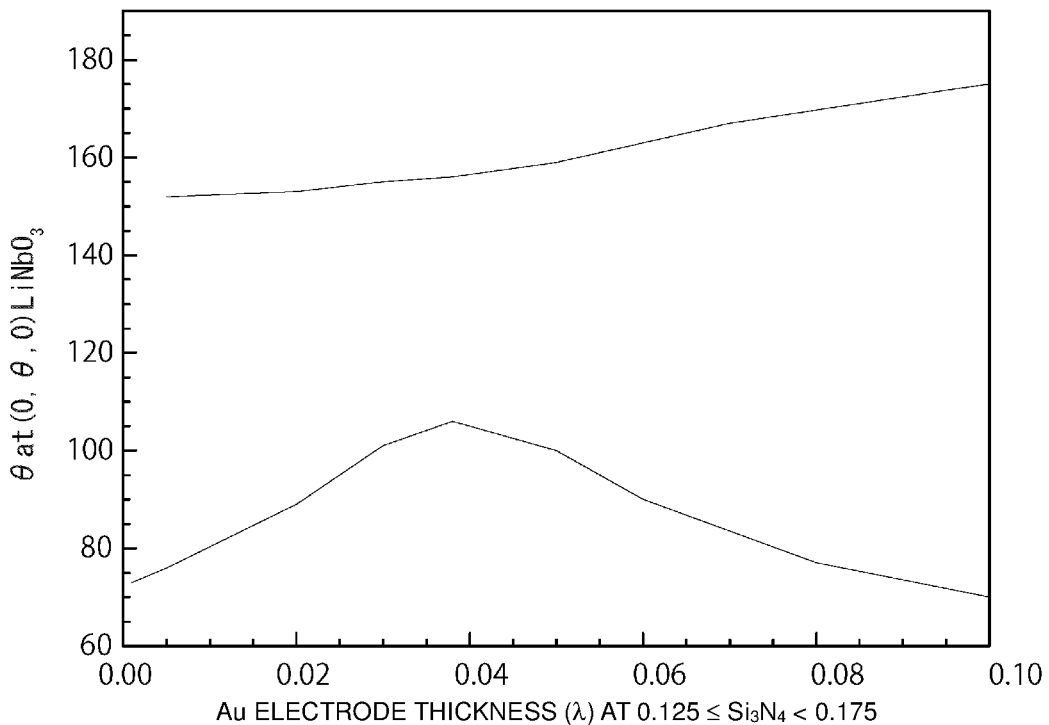

FIG. 50 is a diagram illustrating a line representing the lower limit and a line representing the upper limit of Y which is θ of the Euler angles and which makes the attenuation constant α smaller than or equal to about 0.02 when the IDT electrode is composed of Au and the wavelength-normalized thickness of the $Si_3N_4$ film is larger than or equal to about 0.125 and smaller than about 0.175 according to the second preferred embodiment of the present invention.

Figure 51:
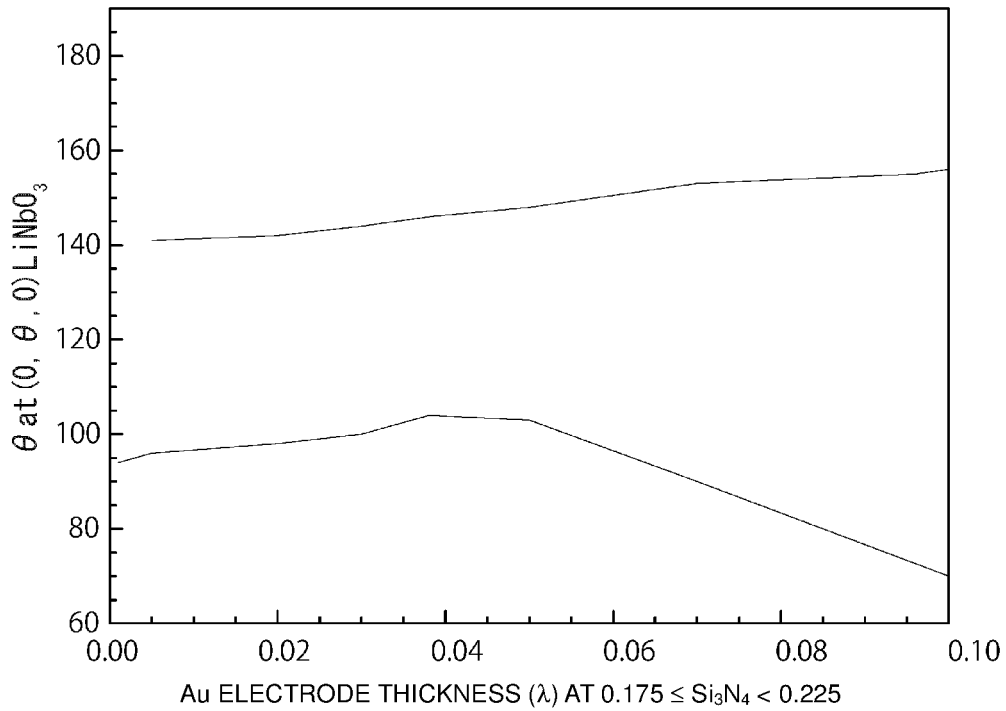

FIG. 51 is a diagram illustrating a line representing the lower limit and a line representing the upper limit of Y which is θ of the Euler angles and which makes the attenuation constant α smaller than or equal to about 0.02 when the IDT electrode is composed of Au and the wavelength-normalized thickness of the $Si_3N_4$ film is larger than or equal to about 0.175 and smaller than about 0.225 according to the second preferred embodiment of the present invention.

Figure 52:
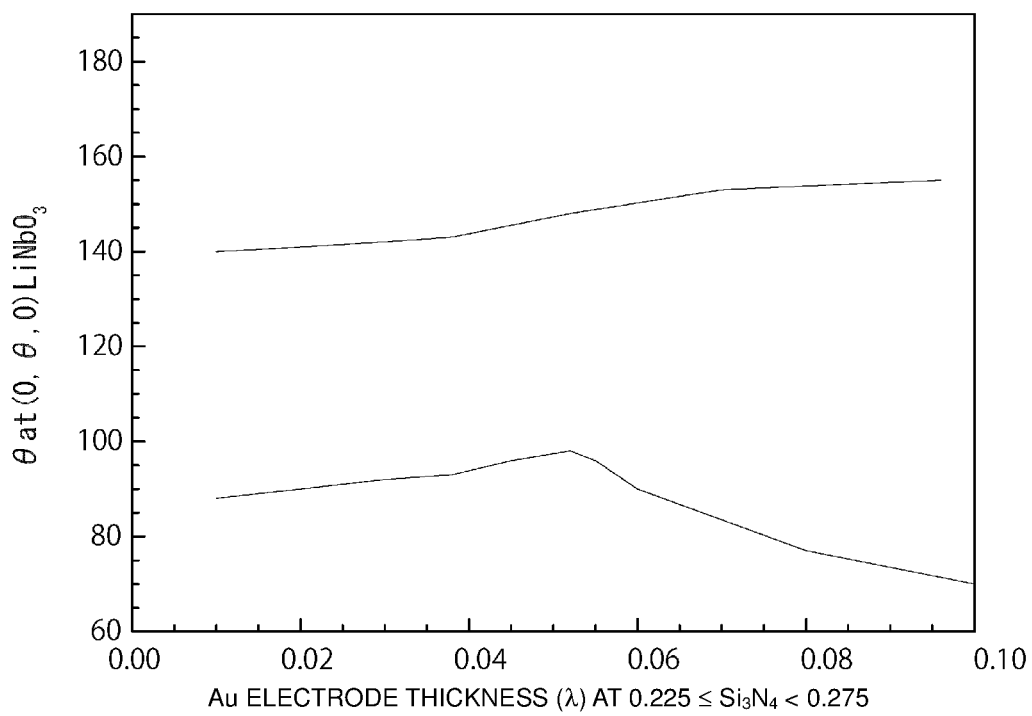

FIG. 52 is a diagram illustrating a line representing the lower limit and a line representing the upper limit of Y which is θ of the Euler angles and which makes the attenuation constant α smaller than or equal to about 0.02 when the IDT electrode is composed of Au and the wavelength-normalized thickness of the $Si_3N_4$ film is larger than or equal to about 0.225 and smaller than about 0.275 according to the second preferred embodiment of the present invention.

Figure 53:
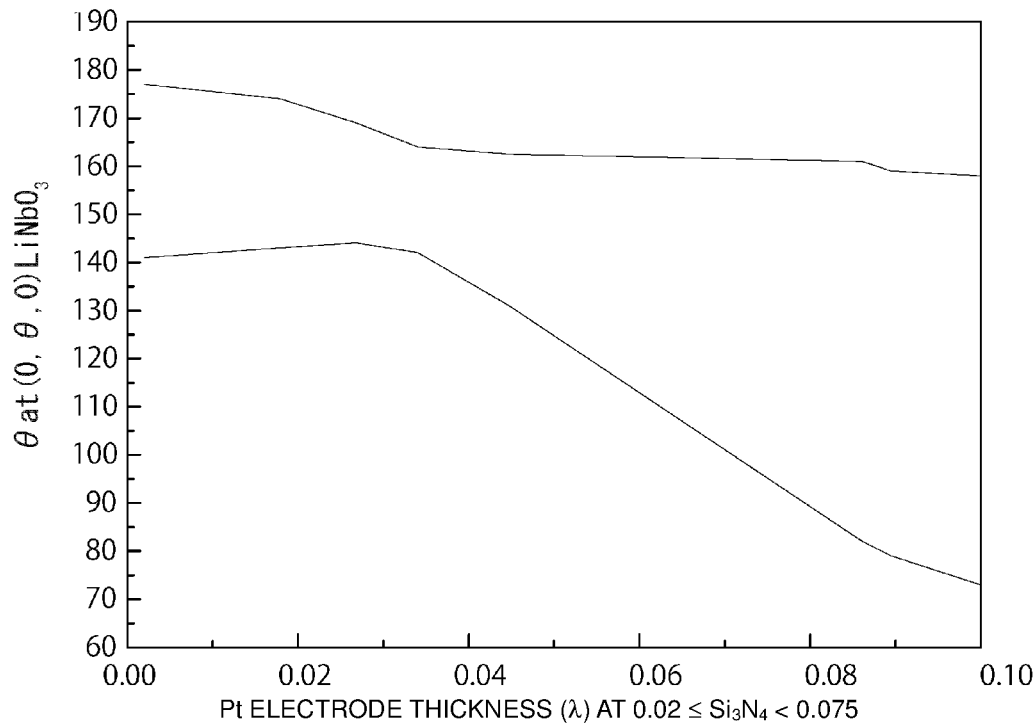

FIG. 53 is a diagram illustrating a line representing the lower limit and a line representing the upper limit of Y which is θ of the Euler angles and which makes the attenuation constant α smaller than or equal to about 0.02 when the IDT electrode is composed of Pt and the wavelength-normalized thickness of the $Si_3N_4$ film is larger than or equal to about 0.02 and smaller than about 0.075 according to the second preferred embodiment of the present invention.

Figure 54:
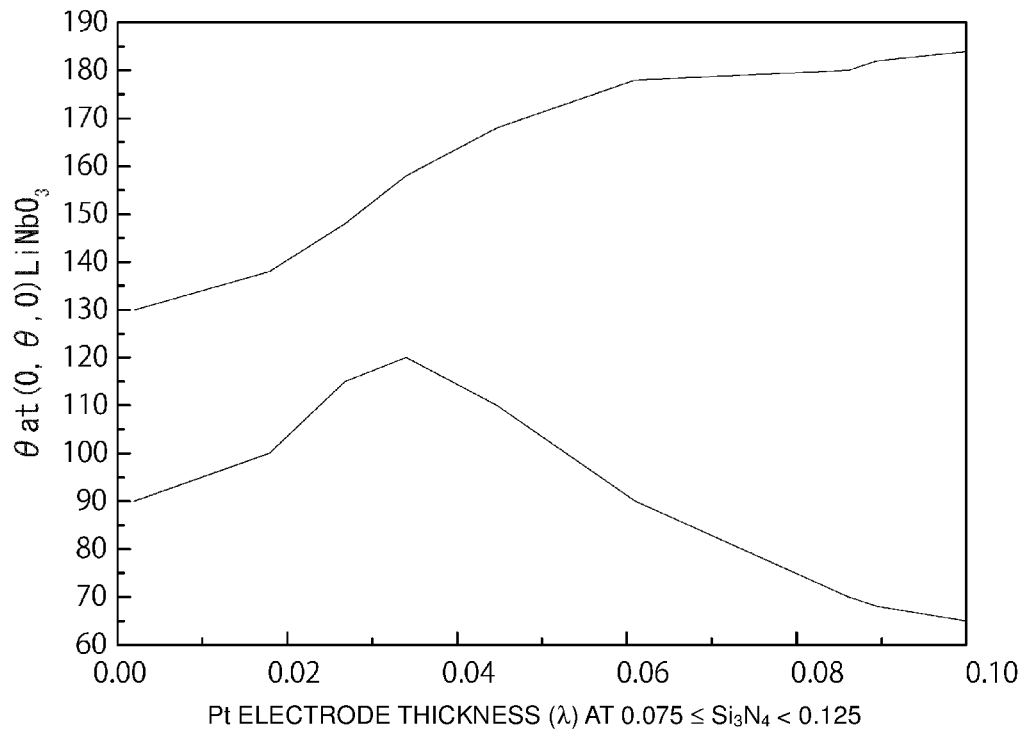

FIG. 54 is a diagram illustrating a line representing the lower limit and a line representing the upper limit of Y which is θ of the Euler angles and which makes the attenuation constant α smaller than or equal to about 0.02 when the IDT electrode is composed of Pt and the wavelength-normalized thickness of the $Si_3N_4$ film is larger than or equal to about 0.075 and smaller than about 0.125 according to the second preferred embodiment of the present invention.

Figure 55:
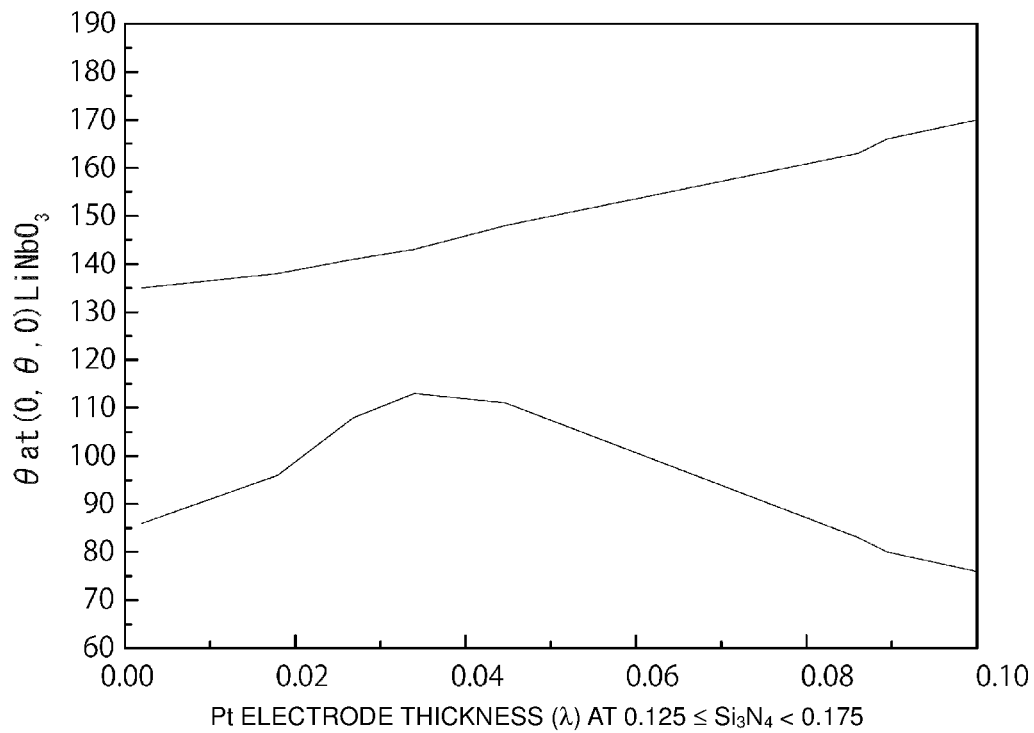

FIG. 55 is a diagram illustrating a line representing the lower limit and a line representing the upper limit of Y which is θ of the Euler angles and which makes the attenuation constant α smaller than or equal to about 0.02 when the IDT electrode is composed of Pt and the wavelength-normalized thickness of the $Si_3N_4$ film is larger than or equal to about 0.125 and smaller than about 0.175 according to the second preferred embodiment of the present invention.

Figure 56:
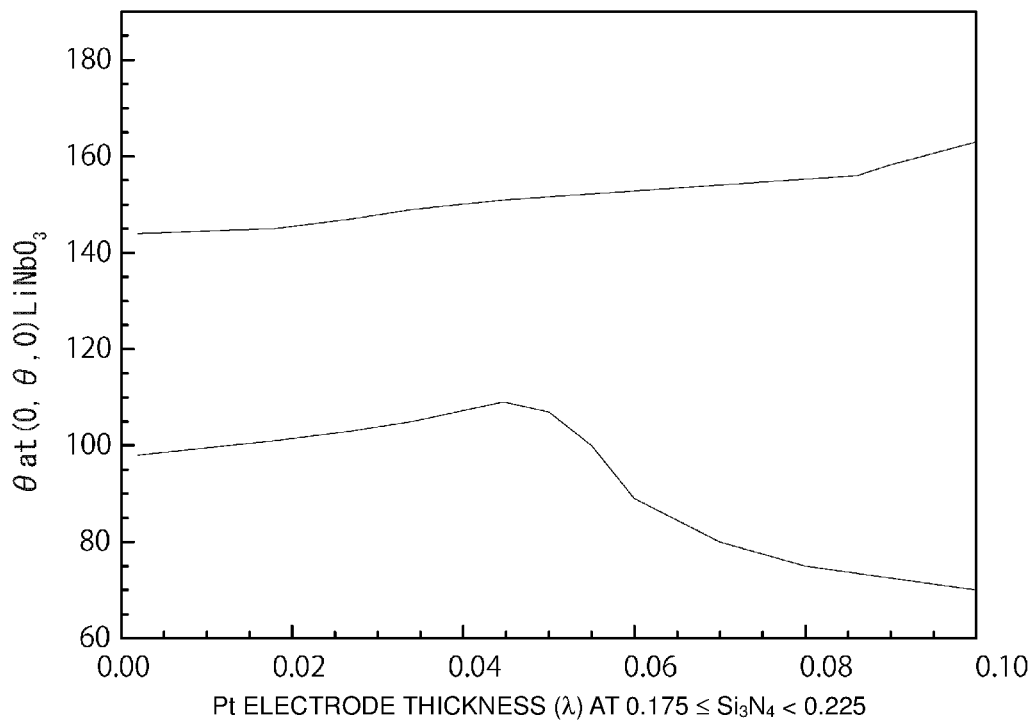

FIG. 56 is a diagram illustrating a line representing the lower limit and a line representing the upper limit of Y which is θ of the Euler angles and which makes the attenuation constant α smaller than or equal to about 0.02 when the IDT electrode is composed of Pt and the wavelength-normalized thickness of the $Si_3N_4$ film is larger than or equal to about 0.175 and smaller than about 0.225 according to the second preferred embodiment of the present invention.

Figure 57:
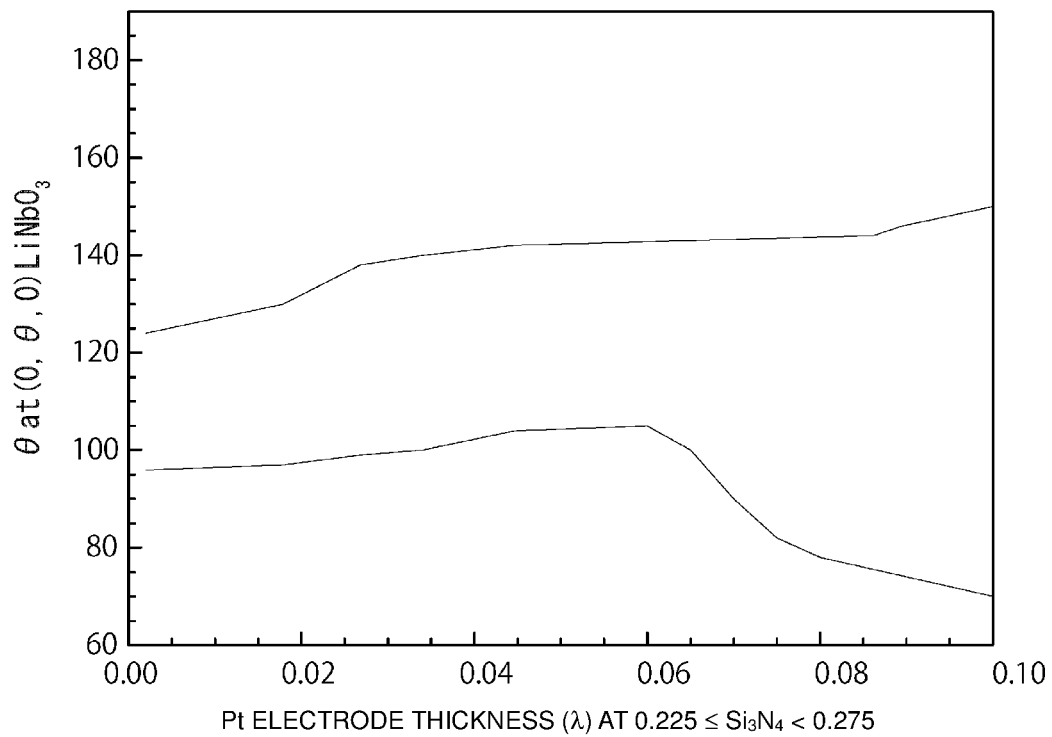

FIG. 57 is a diagram illustrating a line representing the lower limit and a line representing the upper limit of Y which is θ of the Euler angles and which makes the attenuation constant α smaller than or equal to about 0.02 when the IDT electrode is composed of Pt and the wavelength-normalized thickness of the $Si_3N_4$ film is larger than or equal to about 0.225 and smaller than about 0.275 according to the second preferred embodiment of the present invention.

Figure 58:
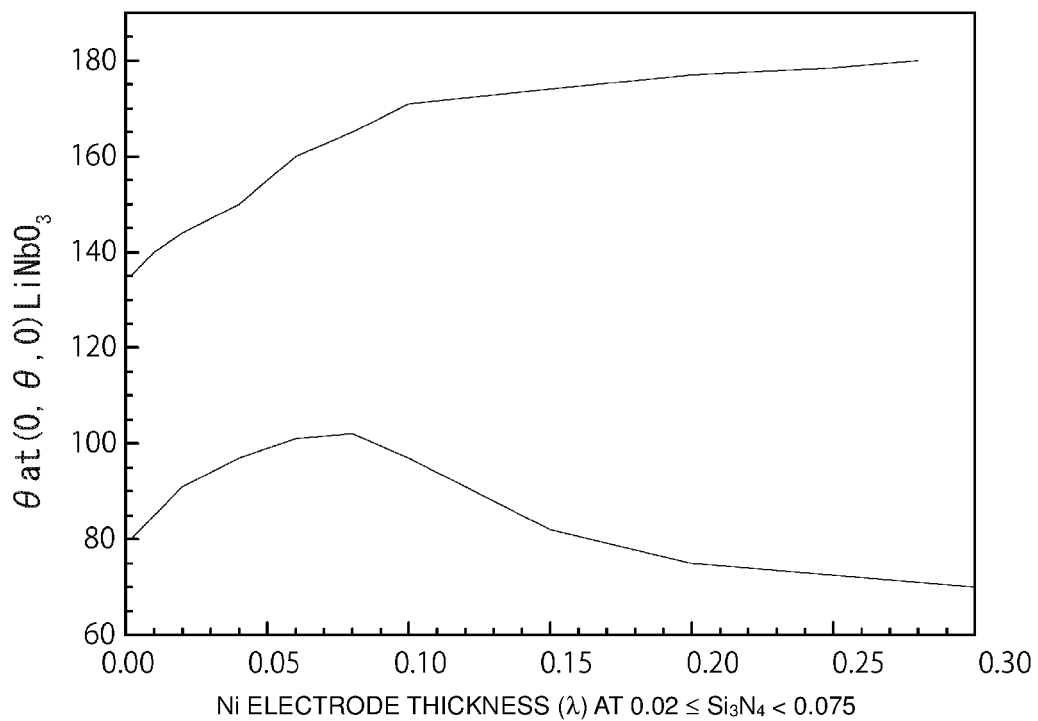

FIG. 58 is a diagram illustrating a line representing the lower limit and a line representing the upper limit of Y which is θ of the Euler angles and which makes the attenuation constant α smaller than or equal to about 0.02 when the IDT electrode is composed of Ni and the wavelength-normalized thickness of the $Si_3N_4$ film is larger than or equal to about 0.02 and smaller than about 0.075 according to the second preferred embodiment of the present invention.

Figure 59:
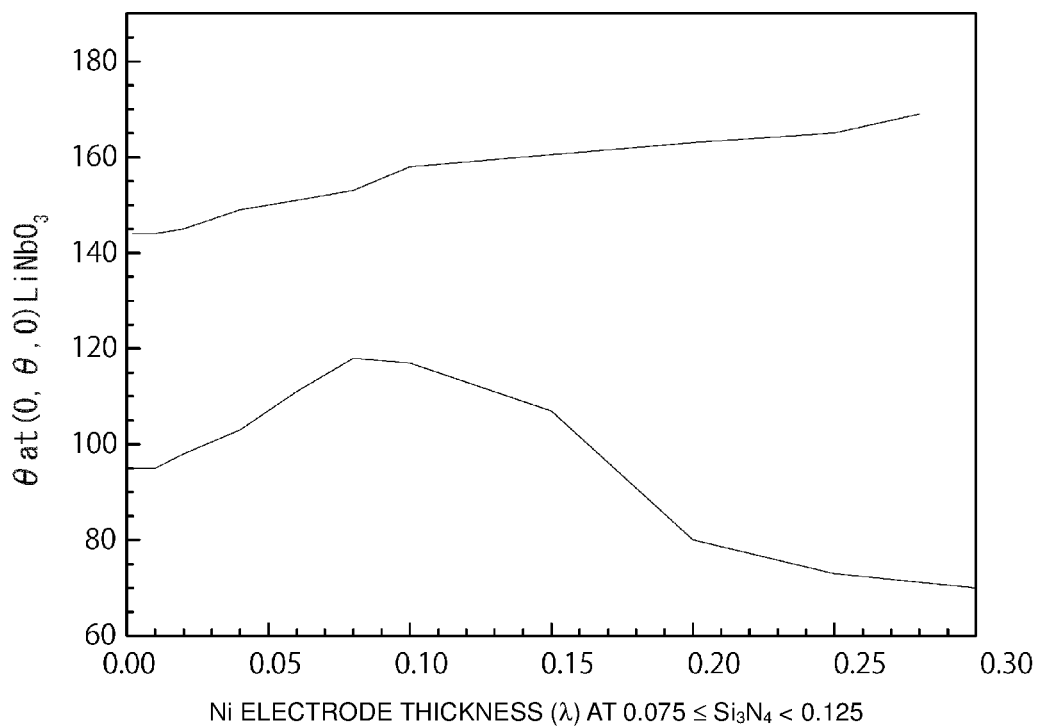

FIG. 59 is a diagram illustrating a line representing the lower limit and a line representing the upper limit of Y which is θ of the Euler angles and which makes the attenuation constant α smaller than or equal to about 0.02 when the IDT electrode is composed of Ni and the wavelength-normalized thickness of the $Si_3N_4$ film is larger than or equal to about 0.075 and smaller than about 0.125 according to the second preferred embodiment of the present invention.

Figure 60:
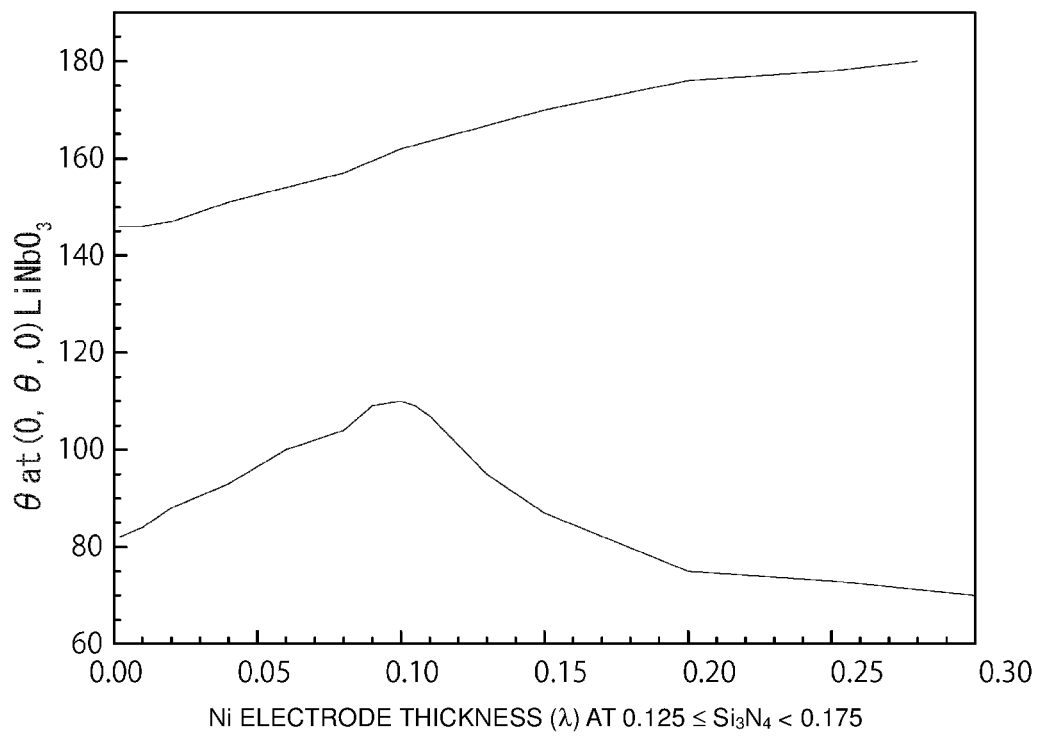

FIG. 60 is a diagram illustrating a line representing the lower limit and a line representing the upper limit of Y which is θ of the Euler angles and which makes the attenuation constant α smaller than or equal to about 0.02 when the IDT electrode is composed of Ni and the wavelength-normalized thickness of the $Si_3N_4$ film is larger than or equal to about 0.125 and smaller than about 0.175 according to the second preferred embodiment of the present invention.

Figure 61:
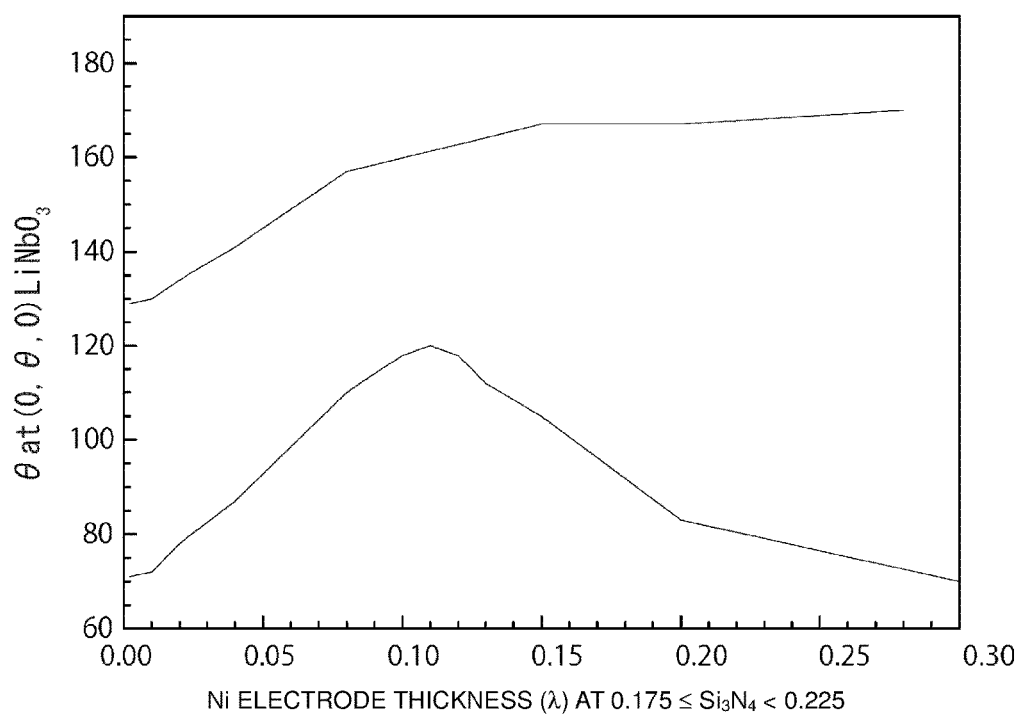

FIG. 61 is a diagram illustrating a line representing the lower limit and a line representing the upper limit of Y which is θ of the Euler angles and which makes the attenuation constant α smaller than or equal to about 0.02 when the IDT electrode is composed of Ni and the wavelength-normalized thickness of the $Si_3N_4$ film is larger than or equal to about 0.175 and smaller than about 0.225 according to the second preferred embodiment of the present invention.

Figure 62:
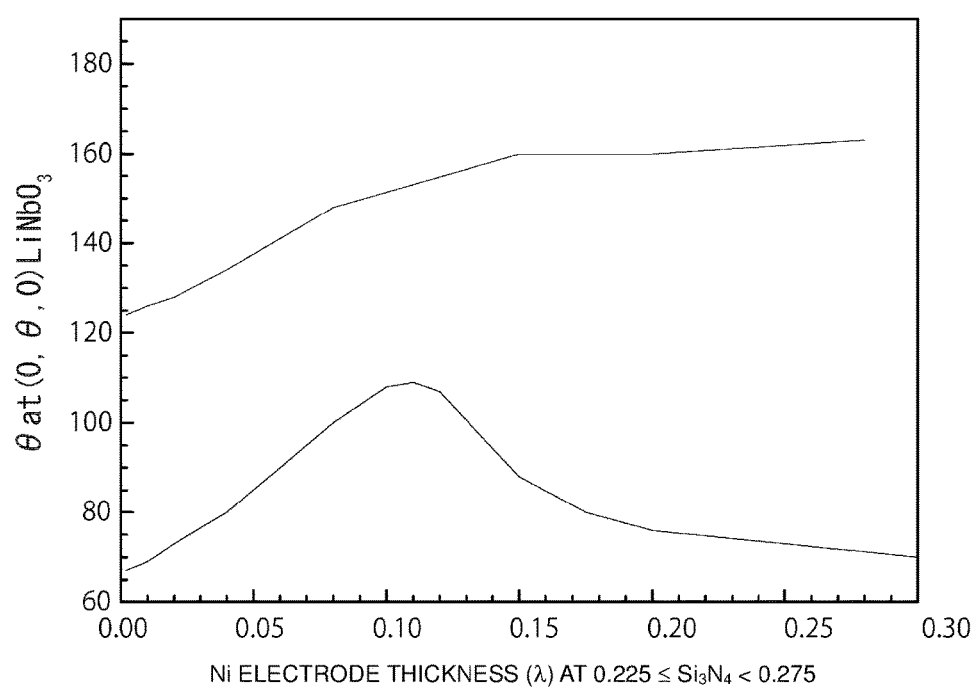

FIG. 62 is a diagram illustrating a line representing the lower limit and a line representing the upper limit of Y which is θ of the Euler angles and which makes the attenuation constant α smaller than or equal to about 0.02 when the IDT electrode is composed of Ni and the wavelength-normalized thickness of the $Si_3N_4$ film is larger than or equal to about 0.225 and smaller than about 0.275 according to the second preferred embodiment of the present invention.

DETAILED DESCRIPTION OF THE PREFERRED EMBODIMENTS

Preferred embodiments of the present invention will be described below with reference to the drawings.

Figure 1:
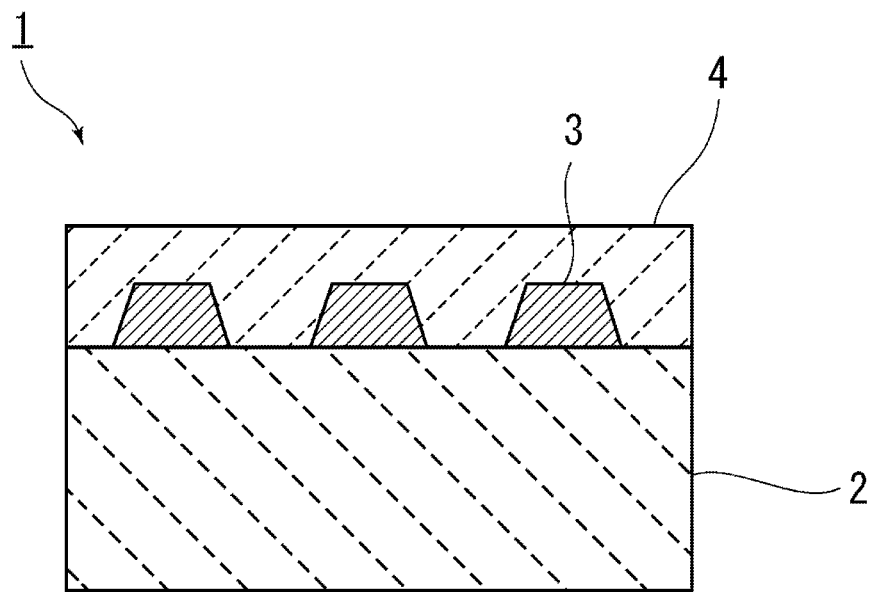
FIG. 1 is a schematic front cross-sectional view of an elastic wave device according to a first preferred embodiment of the present invention.

FIG. 1 is a schematic front cross-sectional view of an elastic wave device according to a first preferred embodiment of the present invention. An elastic wave device 1 includes a $LiNbO_3$ substrate 2, an IDT electrode 3 disposed on the $LiNbO_3$ substrate 2, and an aluminum nitride film 4 disposed on the $LiNbO_3$ substrate 2 to cover the IDT electrode 3.

The elastic wave device 1 according to this preferred embodiment utilizes a leaky elastic wave that propagates on the $LiNbO_3$ substrate 2. As described above, a high acoustic velocity is able to be achieved when a leaky elastic wave is utilized. Since the aluminum nitride film 4 is stacked as a high acoustic velocity film in this preferred embodiment, a higher acoustic velocity is able to be achieved.

As described above, when a leaky elastic wave is utilized, an attenuation constant α undesirably increases because of leakage. To address this issue, the inventor has discovered that both a high acoustic velocity and a low loss are able to be achieved if the IDT electrode is composed of a specific metal and if θ of Euler angles of the $LiNbO_3$ substrate is set in a specific range depending on the kind of metal of which the IDT electrode is composed and the range of the wavelength-normalized thickness of the aluminum nitride film, and has conceived of preferred embodiments of the present invention.

In the elastic wave device 1 according to this preferred embodiment, the metal of which the IDT electrode is composed is a metal including, as a main component, one material selected from a group consisting of Cu, Al, Au, Pt, and Ni. The term "main component" refers to the most dominant metal by weight. In addition, a very thin film such as an adhesion-enhancing layer or a protection layer may be stacked as one of the layers constituting the electrode. The Euler angles of the $LiNbO_3$ substrate 2 are (0°±5°, θ, 0°±5°). When X denotes a wavelength-normalized thickness of the IDT electrode 3 and Y denotes θ of the Euler angles, Y which is θ of the Euler angles is set in any of the ranges in Table 11 to Table 15 depending on the kind of metal and the range of the wavelength-normalized thickness of the aluminum nitride film 4. With this configuration, a high acoustic velocity and a low loss are able to be achieved. This will be described in more detail below.

TABLE 11

Cu electrode

| | |
|---|---|
| $0.02 \leq <0.075$ | $Y = 119.8 - 1644X + 64107X^2 - 820434X^3 + 4.5 \times 10^6 X^4 - 1.2 \times 10^7 X^5 + 1.1X^6$ to $Y = 153 + 169X - 363X^2$ |
| $0.075 \leq <0.125$ | $Y = 106.7 - 1278X + 53014X^2 - 700901X^3 + 4.1 \times 10^6 X^4 - 1.1 \times 10^7 X^5 + 1.1 \times 10^7 X^6$ to $Y = 143 + 209X - 739X^2 + 907X^3$ |
| $0.125 \leq <0.175$ | $Y = 89.6 - 493X + 25919X^2 - 255926X^3 + 911653X^4 - 1.1X^5$ to $Y = 132 + 207X - 195X^2$ |
| $0.175 \leq <0.225$ | $Y = 79.4 - 207.6X + 21115X^2 - 220752X^3 + 803734X^4 - 988585X^5$ to $Y = 124 + 547X - 2351X^2 + 3513X^3$ |
| $0.225 \leq <0.275$ | $Y = 70.4 - 35.7X + 13366X^2 - 125408X^3 + 392064X^4 - 406193X^5$ to $Y = 125.8 + 547.4X - 2351X^2 + 3513X^3$ |

TABLE 12

Al electrode

| | |
|---|---|
| $0.02 \leq <0.075$ | $Y = 154 - 17X - 18$ to $Y = 154 - 17X + 18$ |
| $0.075 \leq <0.125$ | $Y = 132 - 13X - 18$ to $Y = 132 - 13X + 18$ |
| $0.125 \leq <0.175$ | $Y = 116 - 13X - 18$ to $Y = 116 - 13X + 18$ |
| $0.175 \leq <0.225$ | $Y = 101 - 13X - 18$ to $Y = 101 - 13X + 18$ |
| $0.225 \leq <0.275$ | $Y = 88 - 13X - 18$ to $Y = 88 - 13X + 18$ |

TABLE 13

Au electrode

| | |
|---|---|
| $0.02 \leq <0.075$ | $Y = 143.1 - 2591X + 221241X^2 - 6.66109 \times 10^6 X^3 + 7.5 \times 10^7 X^4 - 2.9 \times 10^8 X^5$ to $Y = 154 + 513X - 2508X^2$ |
| $0.075 \leq <0.125$ | $Y = 113.3 - 1613X + 173621X^2 - 5.4 \times 10^6 X^3 + 6.1 \times 10^7 X^4 - 2.4 \times 10^8 X^5$ to $Y = 151 + 187X + 1187X^2$ |
| $0.125 \leq <0.175$ | $Y = 91.57 - 1590X + 203628X^2 - 5.7 \times 10^6 X^3 + 5.8 \times 10^7 X^4 - 2.1 \times 10^8 X^5$ to $Y = 140 + 265X + 623X^2$ |
| $0.175 \leq <0.225$ | $Y = 103.7 - 559.1X + 42955X^2 - 704717X^3 + 3 \times 10^6 X^4$ to $Y = 146 + 191X - 215X^2$ |
| $0.225 \leq <0.275$ | $Y = 88.8 + 26.8X + 66840X^2 - 4.45 \times 10^6 X^3 + 1.15 \times 10^8 X^4 - 1.25 \times 10^9 X^5 + 4.8 \times 10^9 X^6$ to $Y = 176 - 450X + 2317X^2$ |

TABLE 14

Pt electrode

| | |
|---|---|
| $0.02 \leq <0.075$ | $Y = 134 + 303X + 2874X^2 - 445059X^3 + 3X^4$ to $Y = 159 + 333X - 1040X^2$ |
| $0.075 \leq <0.125$ | $Y = 101 - 345X + 66704X^2 - 1.4 \times 10^6 X^3 + 7.6 \times 10^6 X^4$ to $Y = 147 + 350X + 281X^2$ |
| $0.125 \leq <0.175$ | $Y = 94.45 - 2780X + 313312X^2 - 9.1 \times 10^6 X^3 + 10 \times 10^7 X^4 - 3.8 \times 10^8 X^5$ to $Y = 140 + 258X + 918X^2$ |
| $0.175 \leq <0.225$ | $Y = 101.1 + 1132X - 94867X^2 + 3.4 \times 10^6 X^3 - 4.8 \times 10^7 X^4 + 2.2 \times 10^8 X^5$ to $Y = 154 - 66X + 1563X^2$ |
| $0.225 \leq <0.275$ | $Y = 91.1 - 793.7X + 132135X^2 - 6.4 \times 10^6 X^3 + 1.4 \times 10^8 X^4 - 1.4 \times 10^9 X^5 + 5.1 \times 10^9 X^6$ to $Y = 175 - 527X + 4617X^2 - 13850X^3$ |

TABLE 15

| | Ni electrode |
|---|---|
| $0.02 \leq <0.075$ | $Y = 115.9 - 1162X + 47603X^2 - 584771X^3 + 3.1 \times 10^6X^4 - 7.4 \times 10^6X^5 + 6.7 \times 10^6X^6$ to $Y = 154 + 51X + 19.5X^2$ |
| $0.075 \leq <0.125$ | $Y = 100.3 - 769X + 30871X^2 - 326052X^3 + 1.3 \times 10^6X^4 - 1.7 \times 10^6X^5$ to $Y = 134 + 154X - 300X^2$ |
| $0.125 \leq <0.175$ | $Y = 67.99 + 1440X - 46900X^2 + 917682X^3 - 9.1 \times 10^6X^4 + 4.5 \times 10^7X^5 - 1.1 \times 10^8X^6 + 1.1 \times 10^8X^7$ to $Y = 139 + 194X - 177X^2$ |
| $0.175 \leq <0.225$ | $Y = 68.79 + 618.4X - 15149X^2 + 215569X^3 - 1.35 \times 10^6X^4 + 3.64 \times 10^6X^5 - 3.51 \times 10^6X^6$ to $Y = 129 + 642X - 3232X^2 + 5479X^3$ |
| $0.225 \leq <0.275$ | $Y = 59.867 + 826.5X - 15571X^2 + 176484X^3 - 985113X^4 + 2.5 \times 10^6X^5 - 2.3 \times 10^6X^6$ to $Y = 118 + 576X - 2604X^2 + 4075X^3$ |

Figure 2:
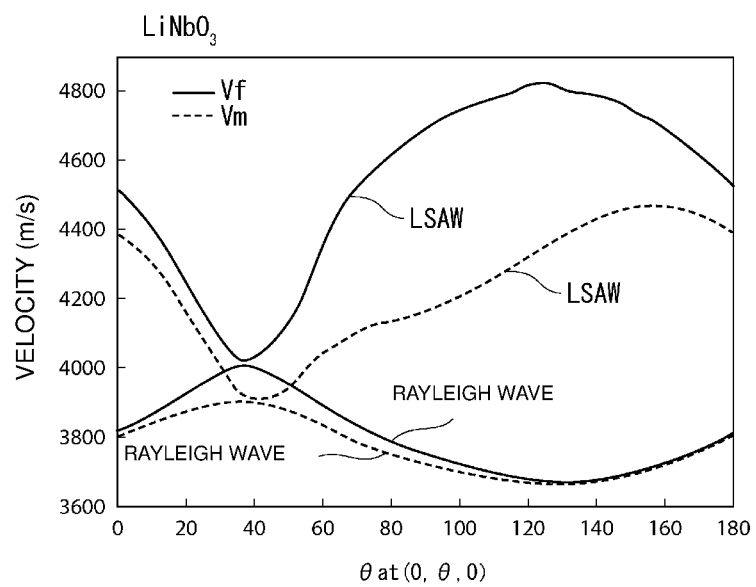
FIG. 2 is a diagram illustrating relationships between θ of the Euler angles and acoustic velocities of a leaky elastic wave and a Rayleigh wave that propagate on LiNbO₃.

FIG. 2 is a diagram illustrating relationships between θ of the Euler angles of (0°, θ, 0°) of the LiNbO₃ substrate 2 and acoustic velocities of a leaky elastic wave and a Rayleigh wave that propagate on the LiNbO₃. In FIG. 2, the leaky elastic wave is denoted as LSAW. In addition, Vf denotes an acoustic velocity in a state where the surface of the substrate is free, whereas Vm denotes an acoustic velocity in a metallized state, that is, in a state where the surface of the substrate is short-circuited.

As is apparent from FIG. 2, the acoustic velocity of the leaky elastic wave is higher than that of the Rayleigh wave in a wide range where θ is from 0° to 180°. This indicates that a high acoustic velocity is able to be achieved by using a leaky elastic wave. FIG. 2 also indicates that the acoustic velocity of the leaky elastic wave changes as θ of the Euler angles changes.

Figure 3:
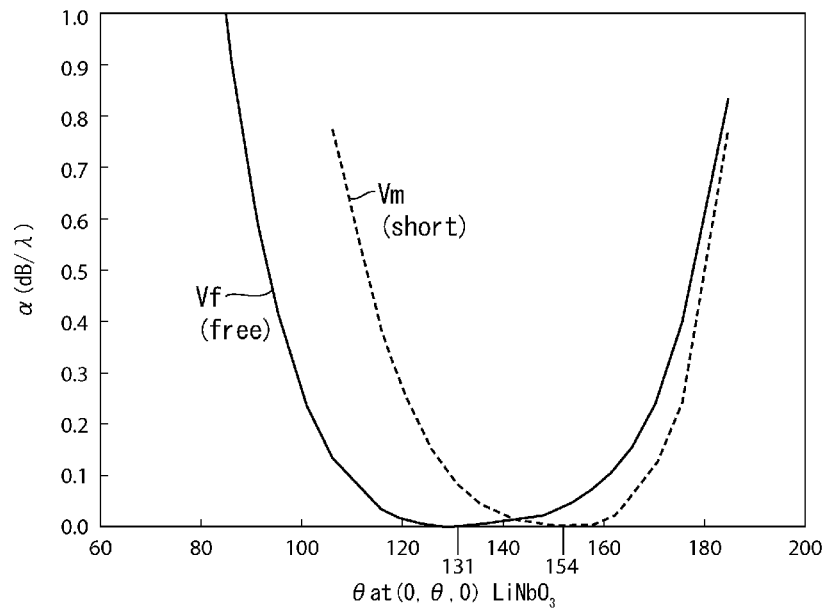
FIG. 3 is a diagram illustrating relationships between θ of the Euler angles of LiNbO₃ and attenuation constants at an acoustic velocity Vf in a free state and at an acoustic velocity Vm in a short-circuit state.

The inventor investigated how an attenuation constant α (dB/λ) changes at the acoustic velocity in the free state and the acoustic velocity in the short-circuit state by changing θ of the Euler angles of the LiNbO₃ substrate. FIG. 3 illustrates the result. As is apparent from FIG. 3, the attenuation constant α at the acoustic velocity Vf in the free state becomes the minimum when θ of the Euler angles is equal to approximately 131°. In addition, the attenuation constant α at the acoustic velocity Vm in the short-circuit state becomes the minimum, that is, substantially 0, when θ is equal to approximately 154°.

This suggests that the attenuation constant α is able to be made small by selecting the value of θ of the Euler angles.

Figure 4:
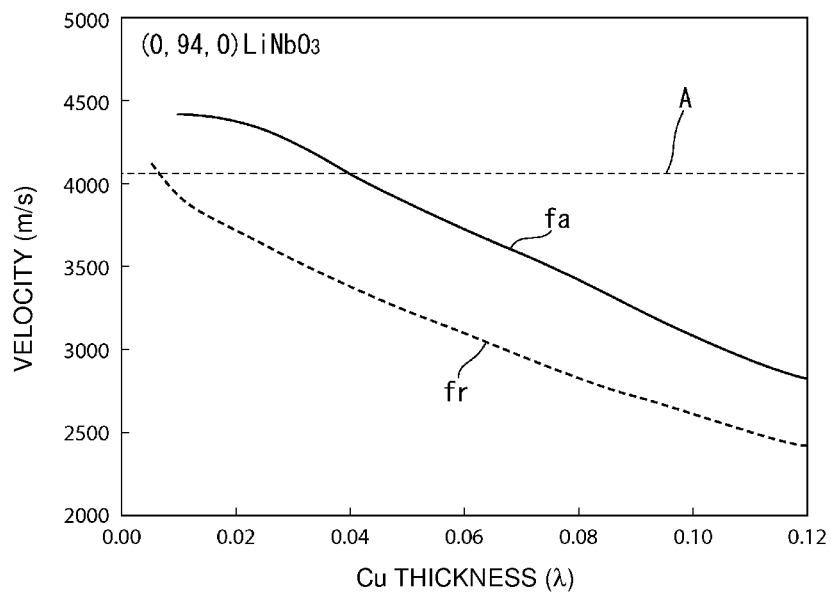
FIG. 4 is a diagram illustrating relationships between a Cu wavelength-normalized thickness and acoustic velocities at a resonant frequency fr and an anti-resonant frequency fa in a structure in which an IDT electrode composed of Cu is disposed on a LiNbO₃ substrate having Euler angles of (0°, 94°, 0°).

FIG. 4 is a diagram illustrating relationships between a Cu wavelength-normalized thickness and the acoustic velocities in a structure in which the IDT electrode 3 composed of Cu is disposed on a LiNbO₃ substrate having Euler angles of (0°, 94°, 0°). Here, fa corresponds to the acoustic velocity at an anti-resonant frequency, that is, in the free state; whereas fr corresponds to the acoustic velocity at a resonant frequency, that is, the acoustic velocity in the short-circuit state. In addition, a dashed line A denotes an acoustic velocity of a slow transversal wave.

As is apparent from FIG. 4, the acoustic velocity decreases as the Cu wavelength-normalized thickness increases. It is considered that a propagating wave is a Love wave in a portion where the acoustic velocity is lower than the transversal-wave acoustic velocity A, i.e., about 4080 m/s.

Figure 5:
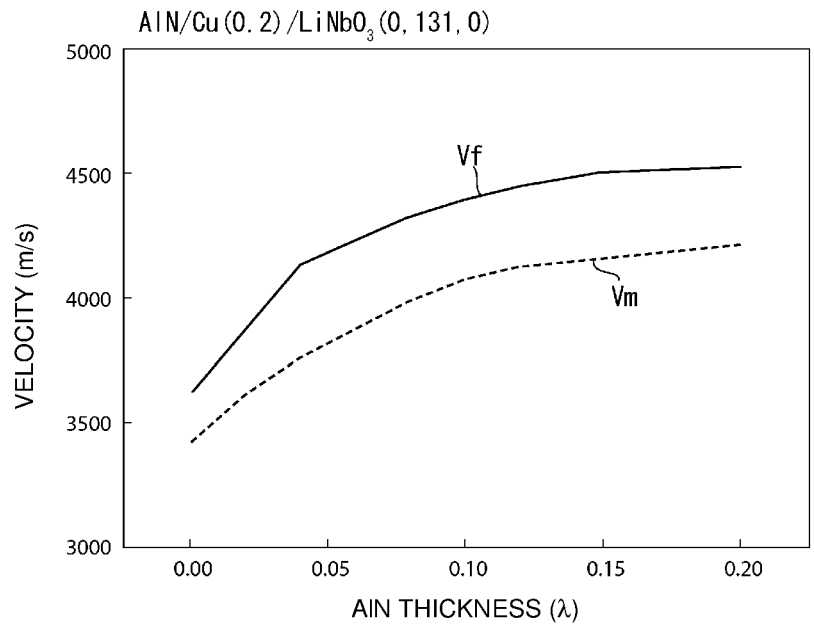
FIG. 5 is a diagram illustrating relationships between a wavelength-normalized thickness of an AlN film and acoustic velocities in a structure in which an IDT electrode composed of a Cu film having a wavelength-normalized thickness of about 0.2 is disposed on a LiNbO₃ substrate having Euler angles of (0°, 131°, 0°) and the AlN film is stacked thereon.

FIG. 5 is a diagram illustrating relationships between the wavelength-normalized thickness of the aluminum nitride film and the acoustic velocities in a structure in which the IDT electrode 3 composed of Cu having a wavelength-normalized thickness of about 0.2 is stacked on a LiNbO₃ substrate having Euler angles of (0°, 131°, 0°) and the aluminum nitride film is further stacked as a high acoustic velocity film. As is apparent from FIG. 5, the acoustic velocity increases as the wavelength-normalized thickness of the aluminum nitride film increases in the structure in which the aluminum nitride film is stacked. It is considered that the propagating wave is a leaky elastic wave in a region where the velocity is higher than or equal to about 4080 m/s, that is, at velocities higher than the acoustic velocity of the slow transversal wave.

As is apparent from the result illustrated in FIG. 5, a leaky elastic wave having an acoustic velocity that is higher than the acoustic velocity of the slow transversal wave is able to be propagated by stacking the aluminum nitride film, which is a high acoustic velocity film.

Accordingly, the inventor investigated a relationship between the acoustic velocity Vf in the free state and the attenuation constant α by changing θ and the wavelength-normalized thickness of the aluminum nitride film to about 0.05, about 0.10, about 0.15, about 0.20, or about 0.25 using the LiNbO₃ substrate 2 having Euler angles of (0°, θ, 0°).

Note that the wavelength-normalized thickness is a value obtained by normalizing a thickness by a wavelength that is determined by a period of electrode fingers of the IDT electrode. The IDT electrode 3 composed of Cu was used, and the wavelength-normalized thickness thereof was fixed to about 0.08.

Figure 6:
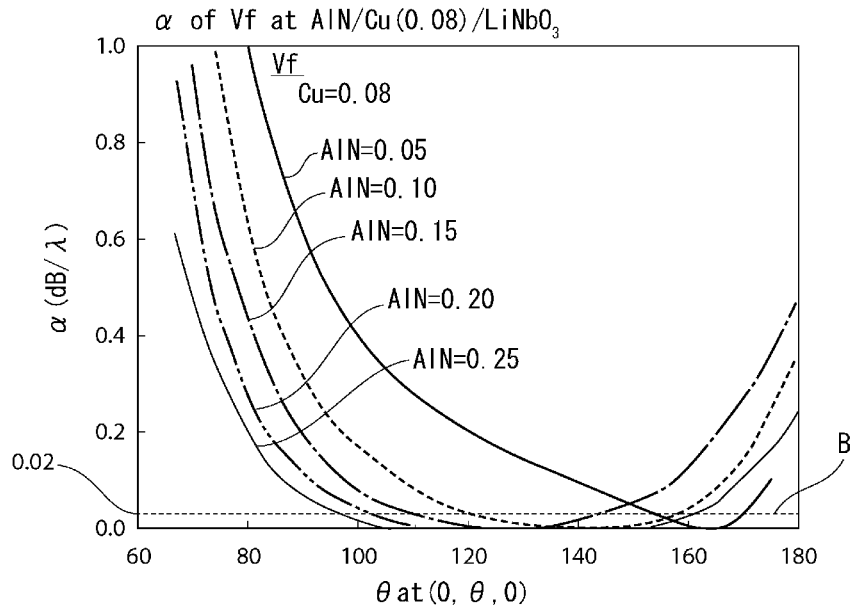
FIG. 6 is a diagram illustrating relationships between the wavelength-normalized thickness of the AlN film, θ of the Euler angles, and an attenuation constant α in structures in which an IDT electrode composed of Cu having a wavelength-normalized thickness of about 0.08 is disposed on a LiNbO₃ substrate and the AlN film of various thicknesses is stacked thereon.

FIG. 6 illustrates the result.

As is apparent from FIG. 6, the attenuation constant α is able to be made small if θ of the Euler angles is selected depending on the wavelength-normalized thickness of the AlN film. In general, the attenuation constant is desired to be smaller than or equal to about 0.02. FIG. 6 suggests that the attenuation constant α can be made smaller than or equal to about 0.02 by setting θ of the Euler angles in a specific range depending on the wavelength-normalized thickness of the AlN film.

For example, a dashed line B in FIG. 6 denotes the attenuation constant α of about 0.02. Accordingly, the attenuation constant α can be made smaller than or equal to about 0.02 if θ of the Euler angles is set in a range from about 97° to about 163° when the wavelength-normalized thickness of the AlN film is 0.25, for example.

Figure 7:
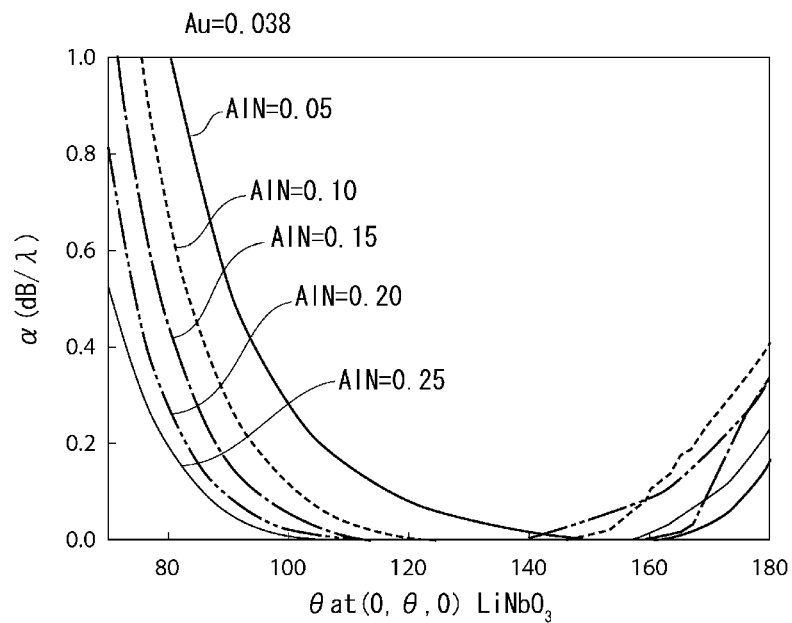
FIG. 7 is a diagram illustrating relationships between the wavelength-normalized thickness of the AlN film, θ of the Euler angles, and an attenuation constant α in structures in which an IDT electrode composed of Au having a wavelength-normalized thickness of about 0.038 is disposed on a LiNbO₃ substrate and the AlN film of various thicknesses is stacked thereon.
Figure 8:
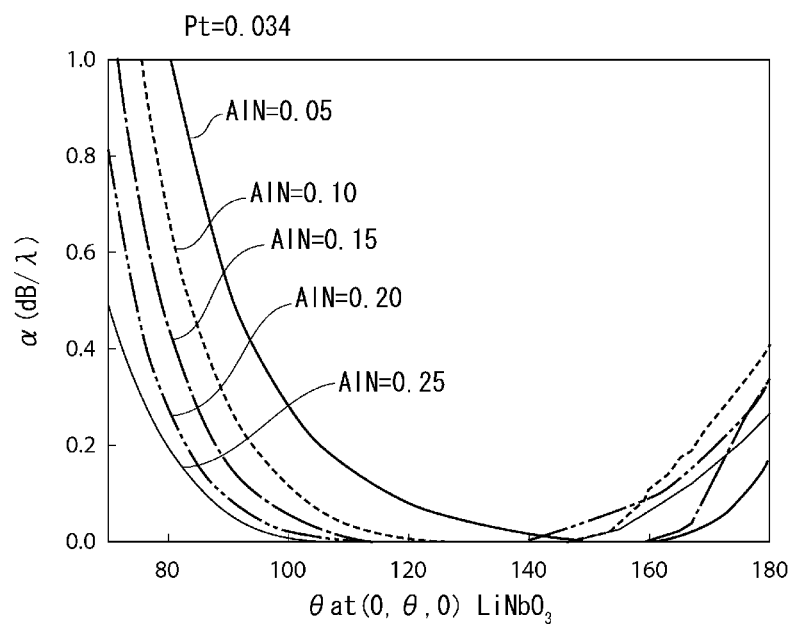
FIG. 8 is a diagram illustrating relationships between the wavelength-normalized thickness of the AlN film, θ of the Euler angles, and an attenuation constant α in structures in which an IDT electrode composed of Pt having a wavelength-normalized thickness of about 0.034 is disposed on a LiNbO₃ substrate and the AlN film of various thicknesses is stacked thereon.
Figure 9:
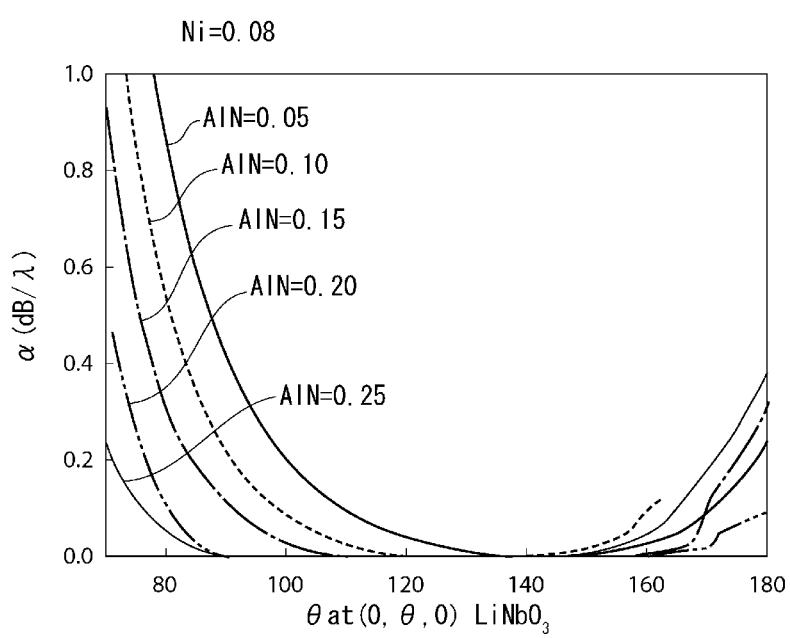
FIG. 9 is a diagram illustrating relationships between the wavelength-normalized thickness of the AlN film, θ of the Euler angles, and an attenuation constant α in structures in which an IDT electrode composed of Ni having a wavelength-normalized thickness of about 0.08 is disposed on a LiNbO$_3$ substrate and the AlN film of various thicknesses is stacked thereon.
Figure 10:
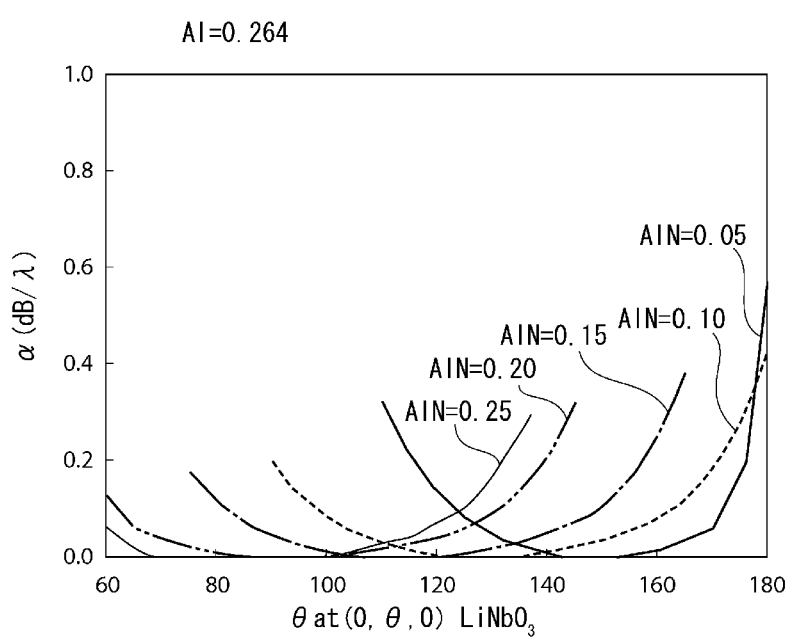
FIG. 10 is a diagram illustrating relationships between the wavelength-normalized thickness of the AlN film, θ of the Euler angles, and an attenuation constant α in structures in which an IDT electrode composed of Al having a wavelength-normalized thickness of about 0.264 is disposed on a LiNbO$_3$ substrate and the AlN film of various thicknesses is stacked thereon.

FIG. 7 illustrates a result obtained when the IDT electrode 3 is composed of an Au film having a wavelength-normalized thickness of about 0.038 instead of Cu. FIG. 8 illustrates a result obtained when the IDT electrode 3 is composed of a Pt film having a wavelength-normalized thickness of about 0.034 instead of Cu. FIG. 9 illustrates a result obtained when the IDT electrode 3 is composed of a Ni film having a wavelength-normalized thickness of about 0.08. FIG. 10 illustrates a result obtained when the IDT electrode is composed of an Al film having a wavelength-normalized thickness of about 0.264 instead of Cu.

As is apparent from FIG. 7 to FIG. 10, the attenuation constant α can be made smaller than or equal to about 0.02 if θ of the Euler angles is set in a specific range depending on the wavelength-normalized thickness of the AlN film also in the case where the IDT electrode 3 composed of Au, Pt, Ni, or Al instead of Cu is used.

Based on the aforementioned results, the inventor discovered a specific range of θ of the Euler angles that can make the attenuation constant α smaller than or equal to about 0.02 for each kind of metal of which the IDT electrode is composed and for each range of the wavelength-normalized thickness of the aluminum nitride film. Such a specific range is each of the ranges in Table 11 to Table 15 described above. The case of using the IDT electrode composed of Cu, which corresponds to Table 11, will be described by way of example. When the IDT electrode is composed of Cu and the wavelength-normalized thickness of the AlN film is larger than or equal to about 0.02 and smaller than about 0.075, Y is set in a range from about $119.8-1644X+64107X^2-820434X^3+4.5\times10^6X^4-1.2\times10^7X^5+1.1X^6$ to $153+169X-363X^2$, where Y denotes θ of the Euler angles and X denotes the wavelength-normalized thickness of the IDT electrode.

Figure 11:
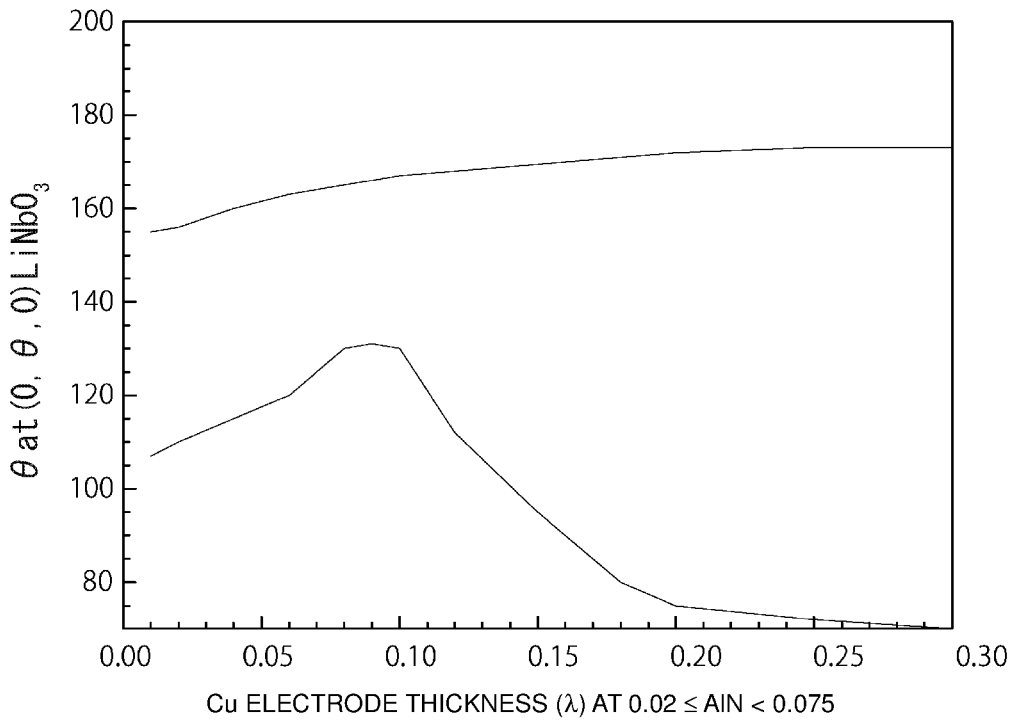
FIG. 11 is a diagram illustrating a line representing the lower limit and a line representing the upper limit of Y which is θ of the Euler angles of LiNbO$_3$ and which makes the attenuation constant α smaller than or equal to about 0.02 when the IDT electrode is composed of Cu and the wavelength-normalized thickness of the AlN film is larger than or equal to about 0.02 and smaller than about 0.075.
Figure 12:
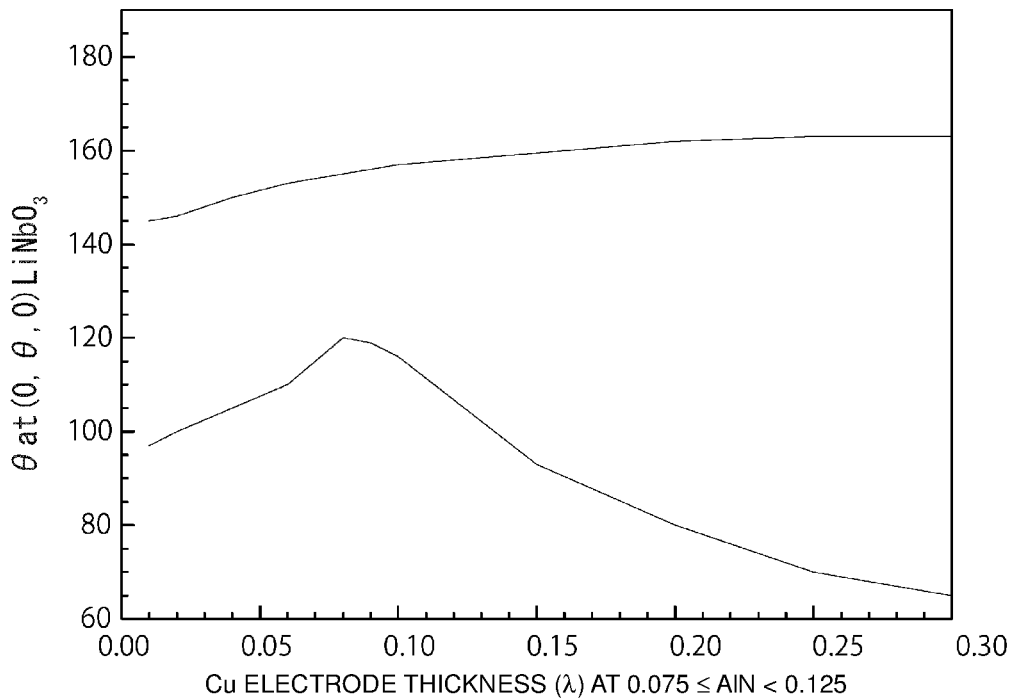
FIG. 12 is a diagram illustrating a line representing the lower limit and a line representing the upper limit of Y which is θ of the Euler angles of LiNbO$_3$ and which makes the attenuation constant α smaller than or equal to about 0.02 when the IDT electrode is composed of Cu and the wavelength-normalized thickness of the AlN film is larger than or equal to about 0.075 and smaller than about 0.125.
Figure 13:
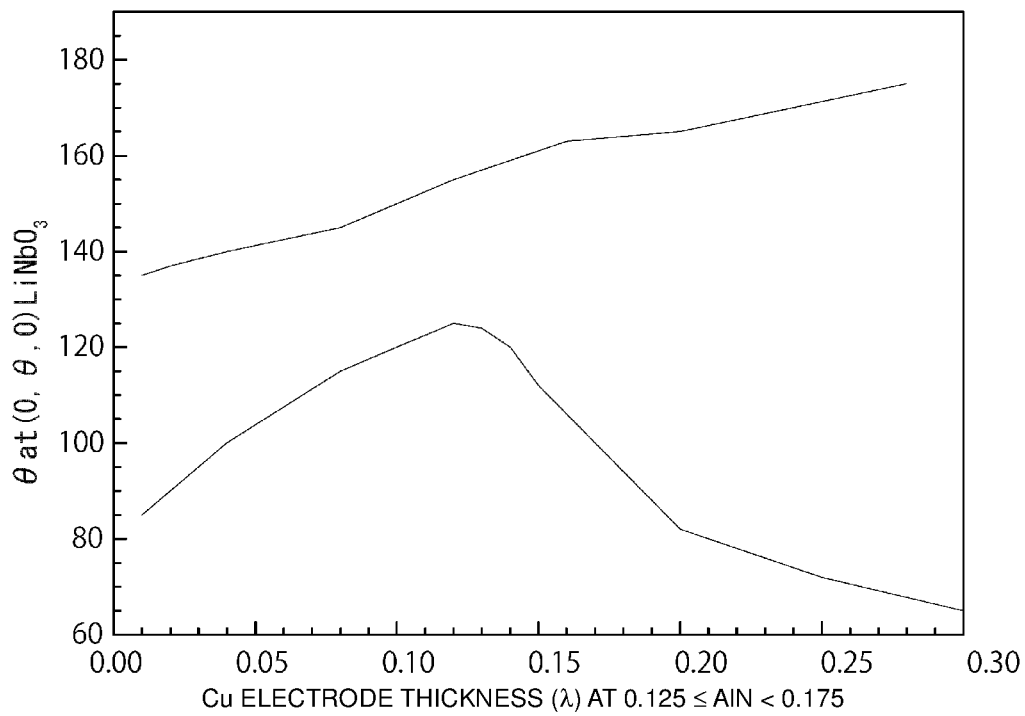
FIG. 13 is a diagram illustrating a line representing the lower limit and a line representing the upper limit of Y which is θ of the Euler angles of LiNbO$_3$ and which makes the attenuation constant α smaller than or equal to about 0.02 when the IDT electrode is composed of Cu and the wavelength-normalized thickness of the AlN film is larger than or equal to about 0.125 and smaller than about 0.175.
Figure 14:
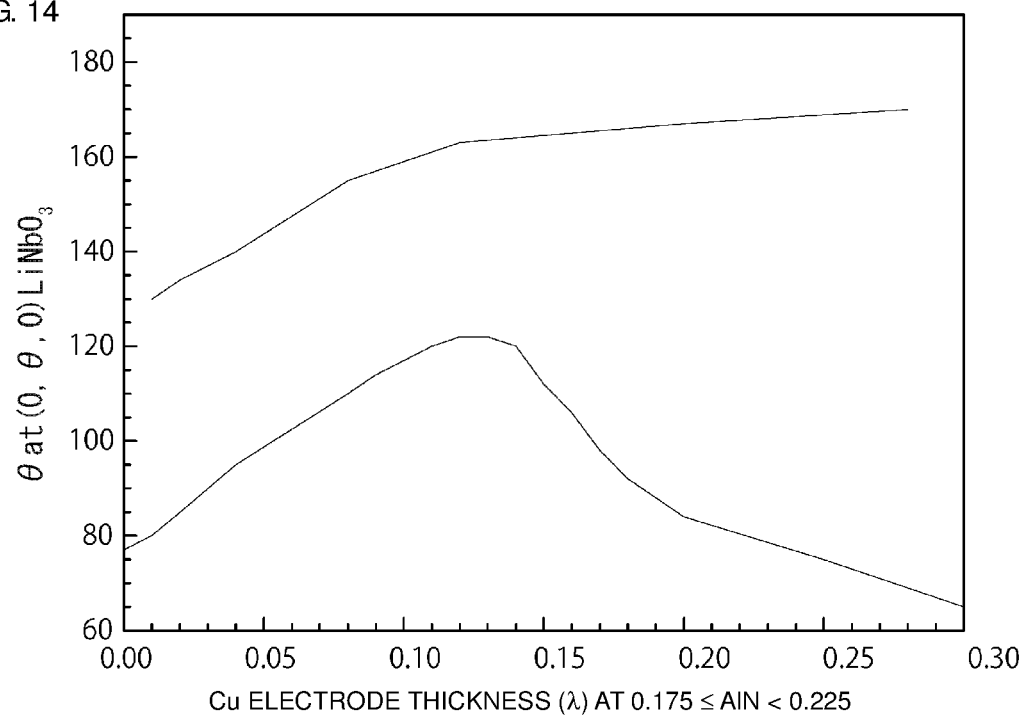
FIG. 14 is a diagram illustrating a line representing the lower limit and a line representing the upper limit of Y which is θ of the Euler angles of LiNbO$_3$ and which makes the attenuation constant α smaller than or equal to about 0.02 when the IDT electrode is composed of Cu and the wavelength-normalized thickness of the AlN film is larger than or equal to about 0.175 and smaller than about 0.225.
Figure 15:
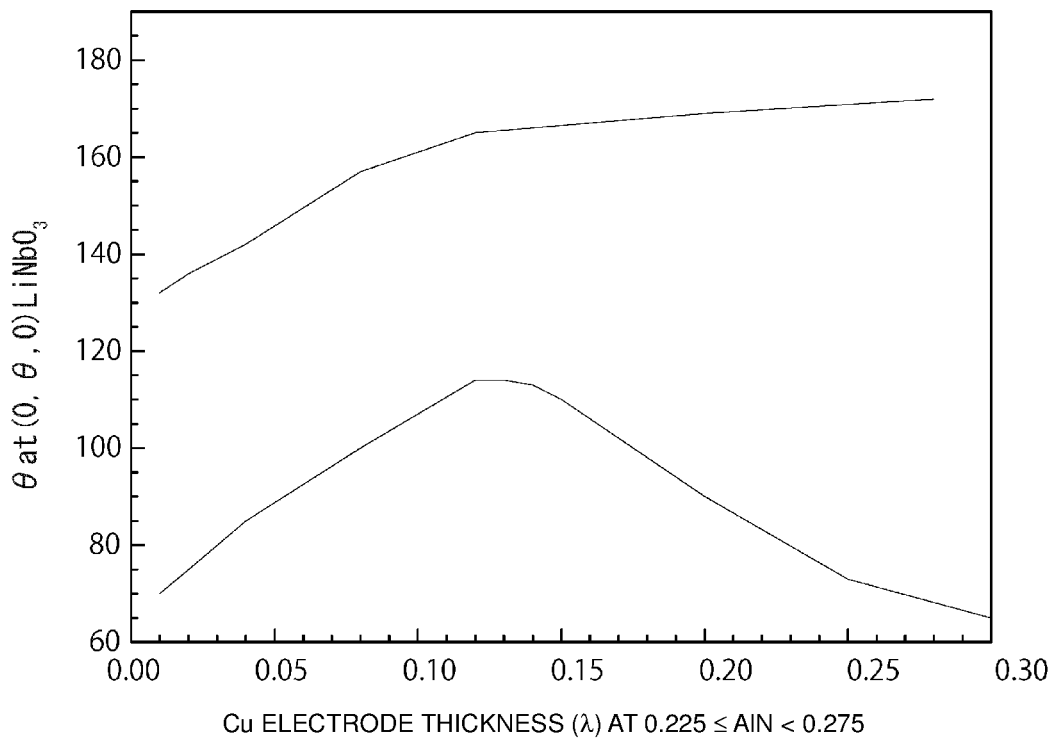
FIG. 15 is a diagram illustrating a line representing the lower limit and a line representing the upper limit of Y which is θ of the Euler angles of LiNbO$_3$ and which makes the attenuation constant α smaller than or equal to about 0.02 when the IDT electrode is composed of Cu and the wavelength-normalized thickness of the AlN film is larger than or equal to about 0.225 and smaller than about 0.275.

In other words, a lower line in FIG. 11 is the line represented by the mathematical expression of the lower limit, and an upper line in FIG. 11 is the line represented by the mathematical expression of the upper limit. Accordingly, θ of the Euler angles is selected depending on the wavelength-normalized thickness of the AlN film so that θ is in a range from the line representing the lower limit to the line representing the upper limit in FIG. 11.

To determine each set of the upper limit and the lower limit illustrated in Table 11, the range of θ that makes the attenuation constant α smaller than or equal to about 0.02 is determined depending on the range of the wavelength-normalized thickness of the AlN film and the wavelength-normalized thickness X of Cu.

FIG. 12 to FIG. 15 are diagrams each illustrating lines of a corresponding one of the other sets of the upper limit and the lower limit illustrated in Table 11. As for FIG. 12 to FIG. 15, θ of the Euler angles is set in a specific range to be at or above the lower line representing the lower limit and at or below the upper line representing the upper limit. In such a way, the attenuation constant α can be made smaller than or equal to about 0.02 as in the case illustrated in FIG. 11.

When the IDT electrode is composed of Al, Y is set in a range from the lower limit to the upper limit of Y illustrated in Table 12 described above. That is, Y which is θ of the Euler angles is selected depending on the range of the wavelength-normalized thickness of the AlN film and the wavelength-normalized thickness X of the IDT electrode composed of Al in a structure in which the AlN film is stacked on the IDT electrode 3 composed of Al. Y=154−17X in FIG. 16 denotes a line at the center between the upper limit and the lower limit of the case where the wavelength-normalized thickness of the AlN film is larger than or equal to about 0.02 and smaller than about 0.075. In Table 12, the lower limit of Y is 154−17X−18 and the upper limit thereof is 154−17X+18 when the wavelength-normalized thickness of the AlN film is larger than or equal to about 0.02 and smaller than about 0.075. Y=154−17X in FIG. 16 denotes a line of the middle value of these upper and lower limits.

Figure 16:
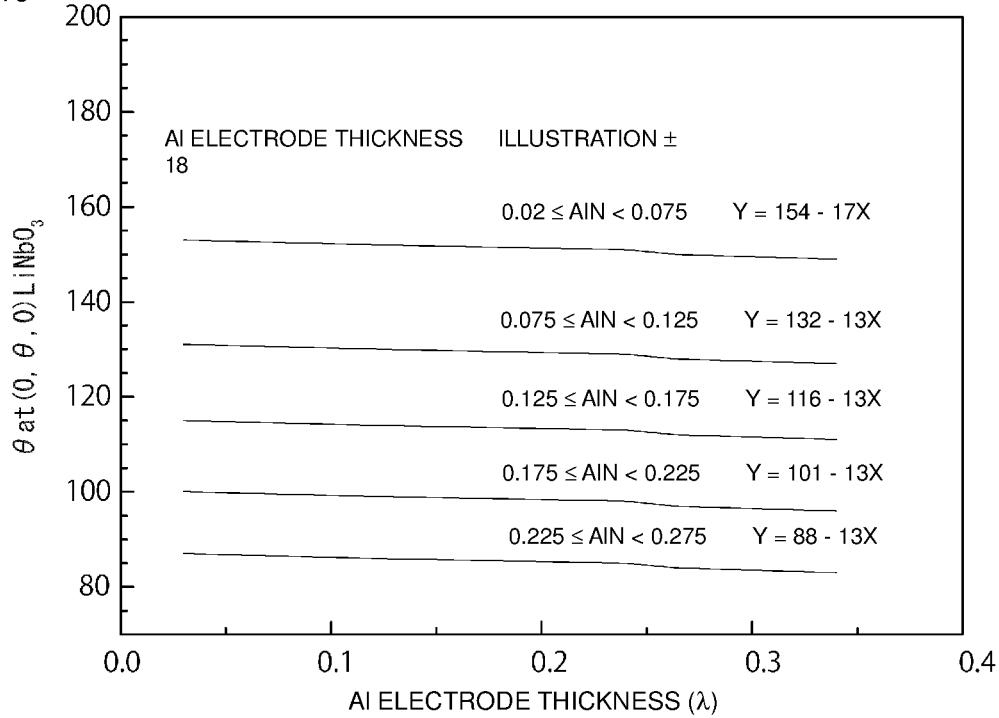
FIG. 16 is a diagram illustrating lines each representing the middle value of a corresponding range of Y which corresponds to θ of the Euler angles and which makes the attenuation constant α smaller than or equal to about 0.02 depending on a range of the wavelength-normalized thickness of the AlN film when the IDT electrode is composed of Al.
Figure 17:
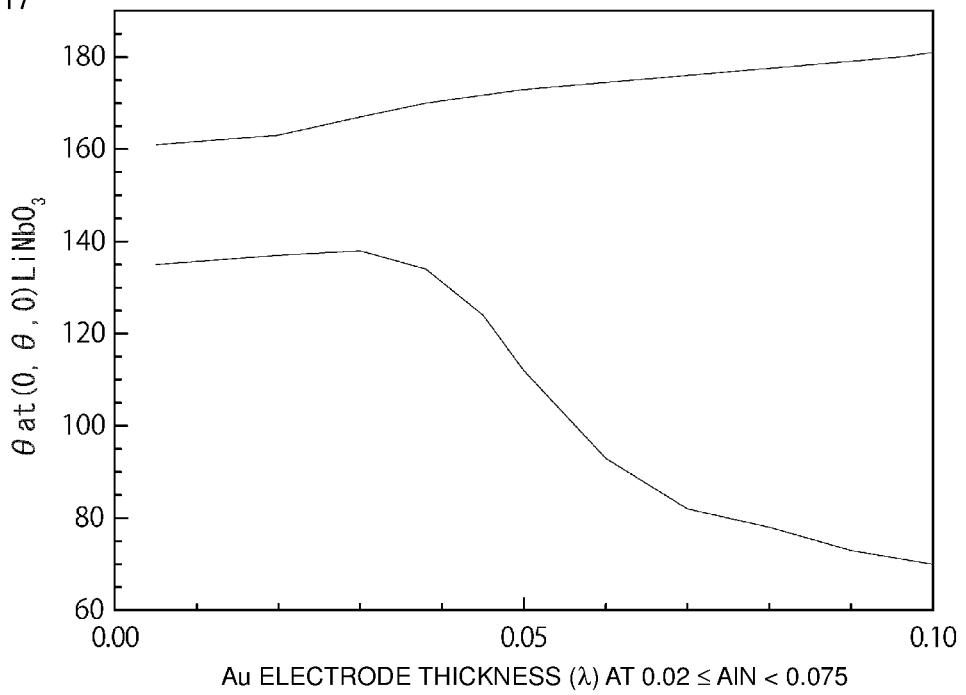
FIG. 17 is a diagram illustrating a line representing the lower limit and a line representing the upper limit of Y which is θ of the Euler angles of LiNbO$_3$ and which makes the attenuation constant α smaller than or equal to about 0.02 when the IDT electrode is composed of Au and the wavelength-normalized thickness of the AlN film is larger than or equal to about 0.02 and smaller than about 0.075.
Figure 18:
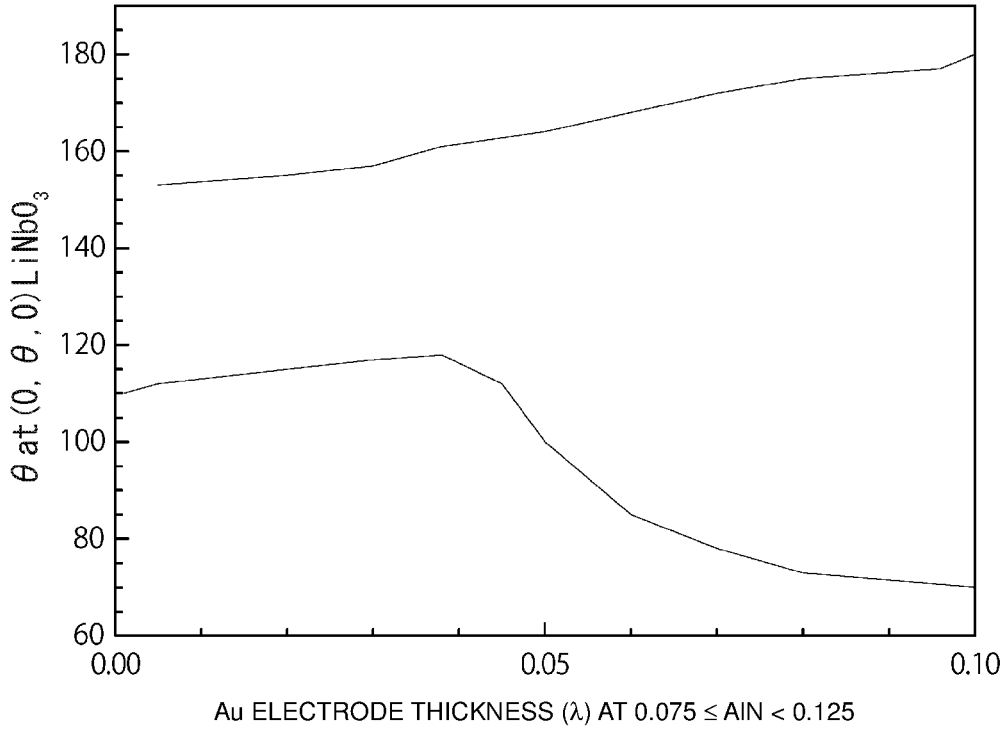
FIG. 18 is a diagram illustrating a line representing the lower limit and a line representing the upper limit of Y which is θ of the Euler angles of LiNbO$_3$ and which makes the attenuation constant α smaller than or equal to about 0.02 when the IDT electrode is composed of Au and the wavelength-normalized thickness of the AlN film is larger than or equal to about 0.075 and smaller than about 0.125.
Figure 19:
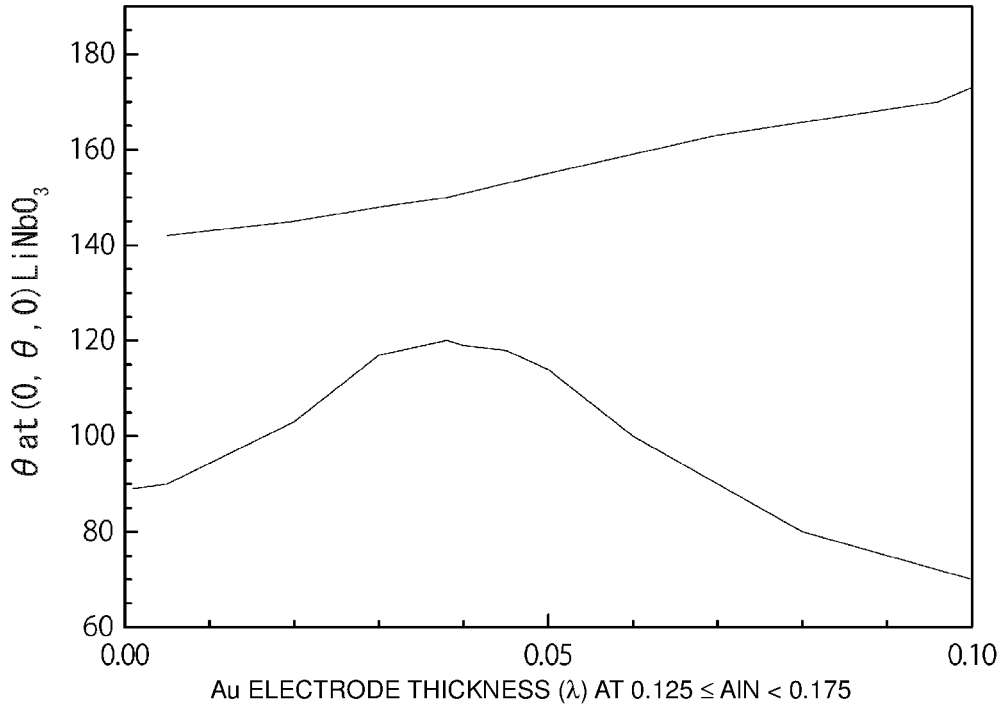
FIG. 19 is a diagram illustrating a line representing the lower limit and a line representing the upper limit of Y which is θ of the Euler angles of LiNbO$_3$ and which makes the attenuation constant α smaller than or equal to about 0.02 when the IDT electrode is composed of Au and the wavelength-normalized thickness of the AlN film is larger than or equal to about 0.125 and smaller than about 0.175.
Figure 20:
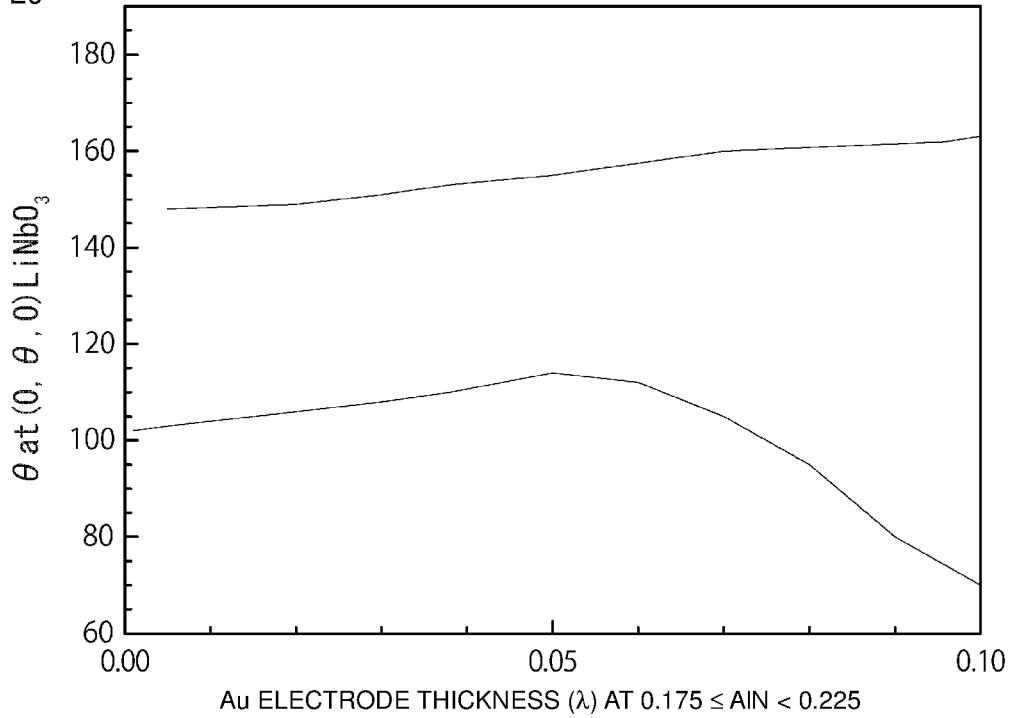
FIG. 20 is a diagram illustrating a line representing the lower limit and a line representing the upper limit of Y which is θ of the Euler angles of LiNbO$_3$ and which makes the attenuation constant α smaller than or equal to about 0.02 when the IDT electrode is composed of Au and the wavelength-normalized thickness of the AlN film is larger than or equal to about 0.175 and smaller than about 0.225.
Figure 21:
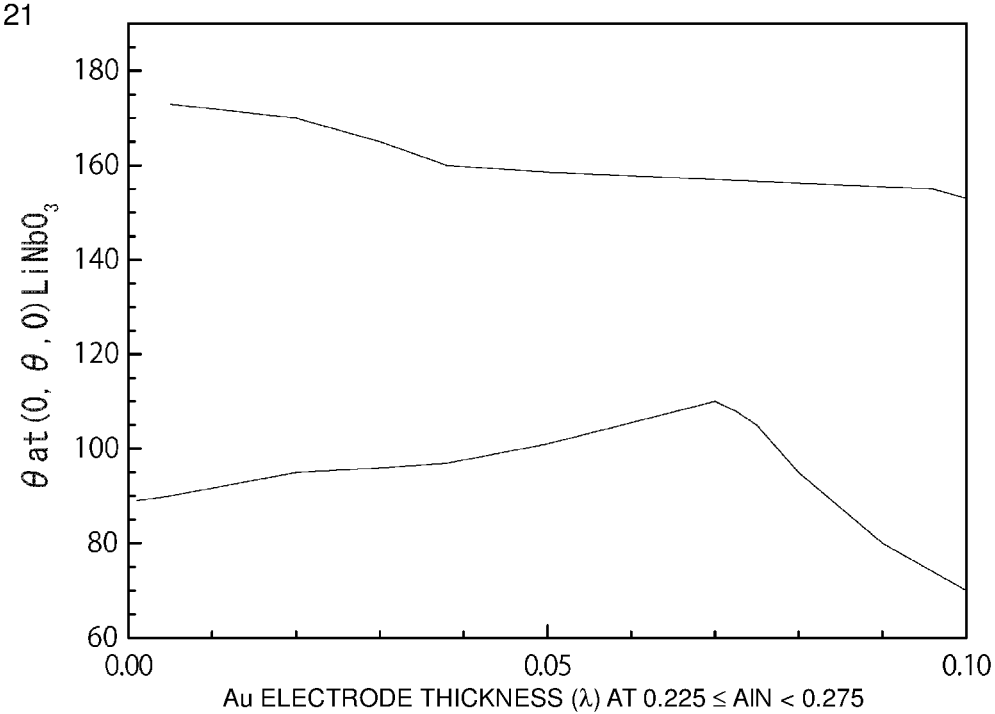
FIG. 21 is a diagram illustrating a line representing the lower limit and a line representing the upper limit of Y which is θ of the Euler angles of LiNbO$_3$ and which makes the attenuation constant α smaller than or equal to about 0.02 when the IDT electrode is composed of Au and the wavelength-normalized thickness of the AlN film is larger than or equal to about 0.225 and smaller than about 0.275.
Figure 22:
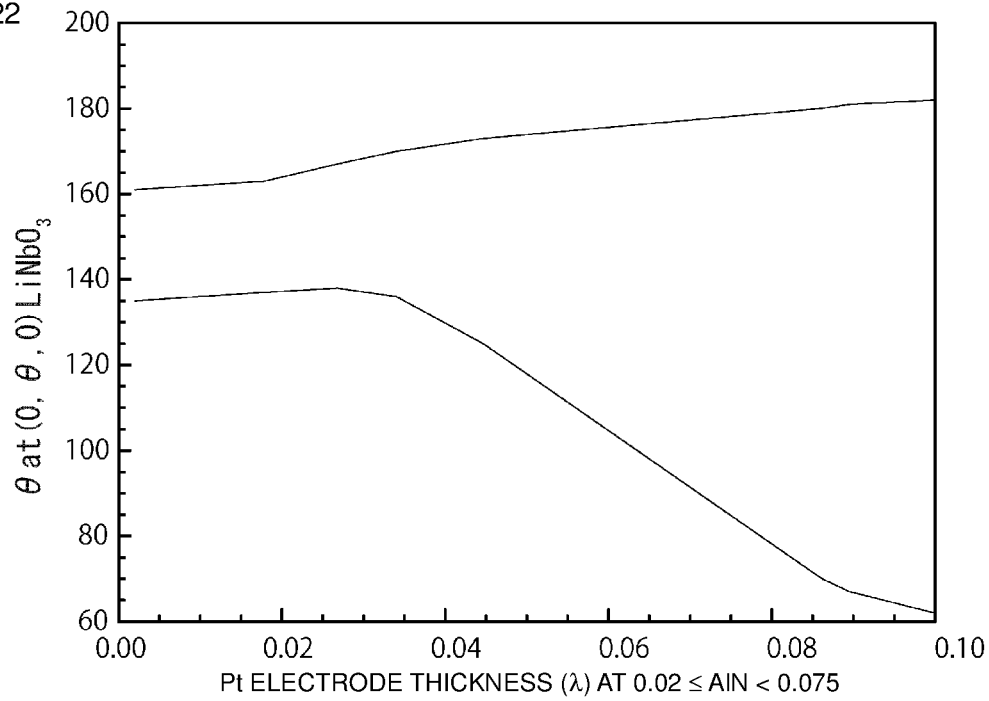
FIG. 22 is a diagram illustrating a line representing the lower limit and a line representing the upper limit of Y which is θ of the Euler angles of LiNbO$_3$ and which makes the attenuation constant α smaller than or equal to about 0.02 when the IDT electrode is composed of Pt and the wavelength-normalized thickness of the AlN film is larger than or equal to about 0.02 and smaller than about 0.075.
Figure 23:
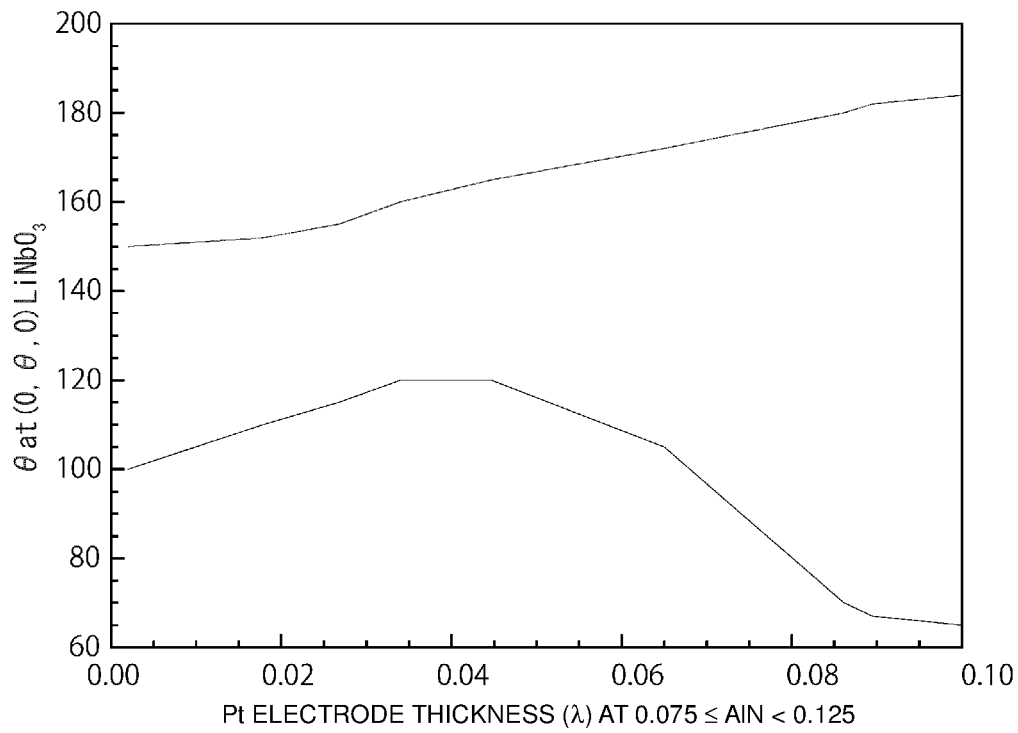
FIG. 23 is a diagram illustrating a line representing the lower limit and a line representing the upper limit of Y which is θ of the Euler angles of LiNbO$_3$ and which makes the attenuation constant α smaller than or equal to about 0.02 when the IDT electrode is composed of Pt and the wavelength-normalized thickness of the AlN film is larger than or equal to about 0.075 and smaller than about 0.125.
Figure 24:
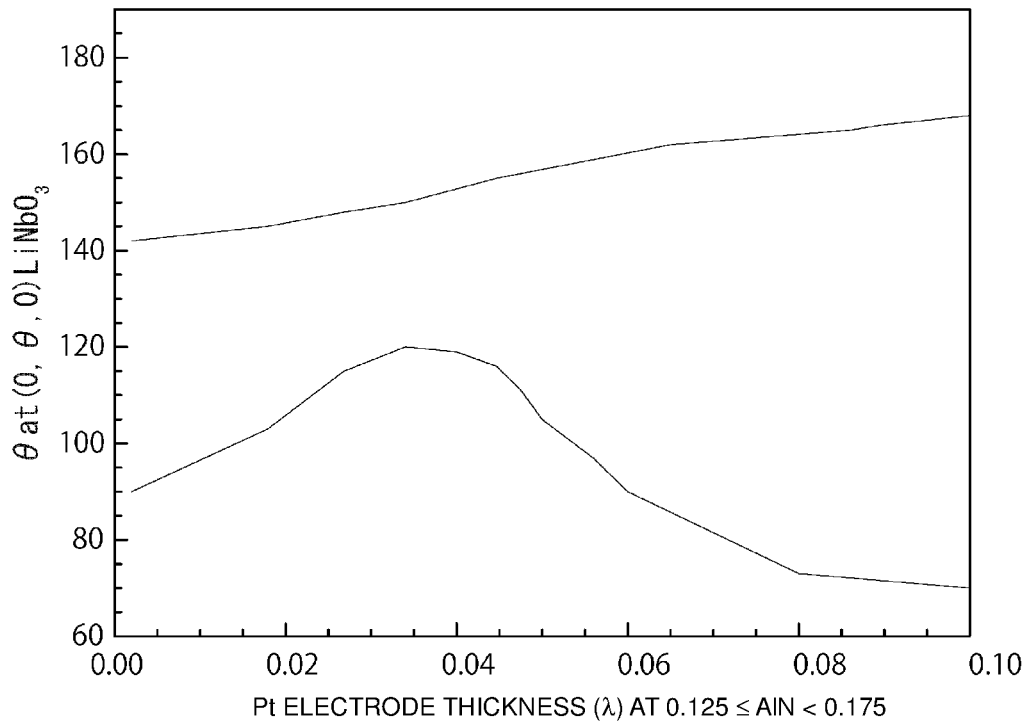
FIG. 24 is a diagram illustrating a line representing the lower limit and a line representing the upper limit of Y which is θ of the Euler angles of LiNbO$_3$ and which makes the attenuation constant α smaller than or equal to about 0.02 when the IDT electrode is composed of Pt and the wavelength-normalized thickness of the AlN film is larger than or equal to about 0.125 and smaller than about 0.175.
Figure 25:
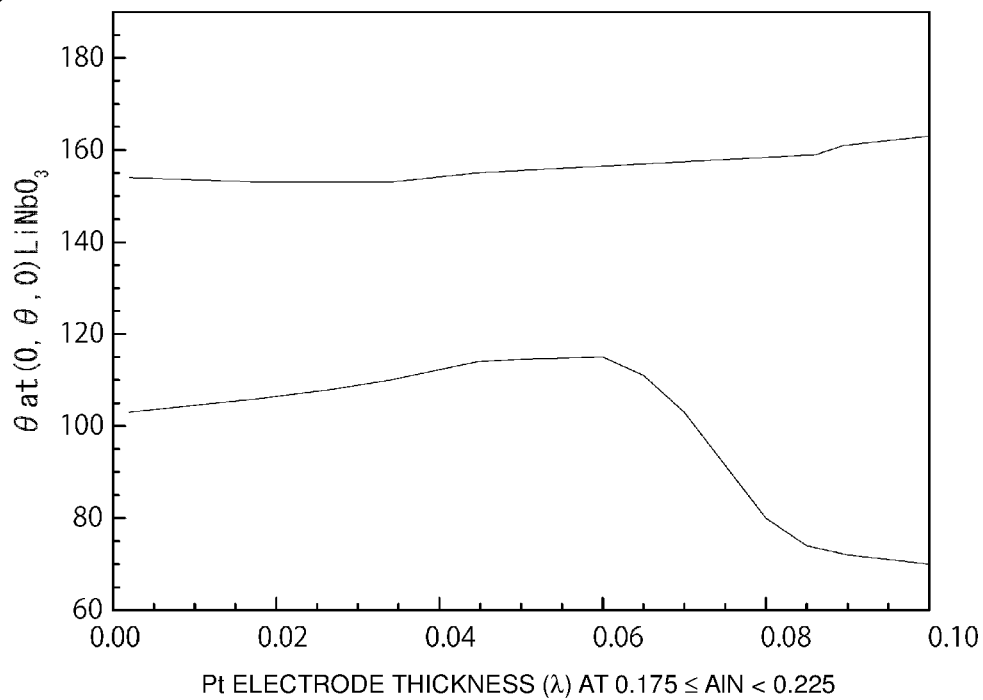
FIG. 25 is a diagram illustrating a line representing the lower limit and a line representing the upper limit of Y which is θ of the Euler angles of LiNbO$_3$ and which makes the attenuation constant α smaller than or equal to about 0.02 when the IDT electrode is composed of Pt and the wavelength-normalized thickness of the AlN film is larger than or equal to about 0.175 and smaller than about 0.225.
Figure 26:
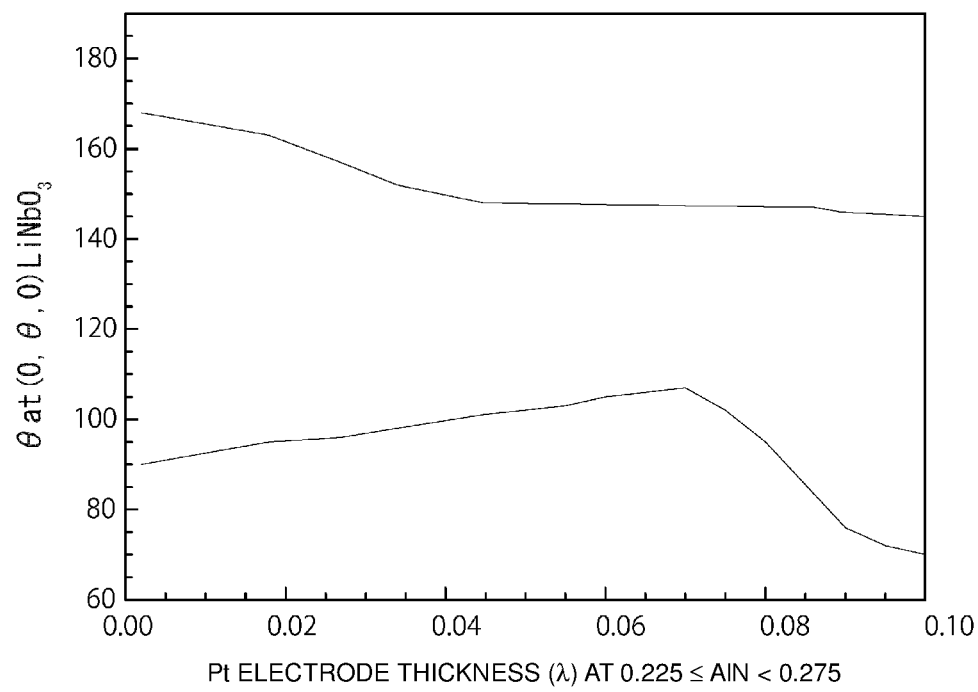
FIG. 26 is a diagram illustrating a line representing the lower limit and a line representing the upper limit of Y which is θ of the Euler angles of LiNbO$_3$ and which makes the attenuation constant α smaller than or equal to about 0.02 when the IDT electrode is composed of Pt and the wavelength-normalized thickness of the AlN film is larger than or equal to about 0.225 and smaller than about 0.275.
Figure 27:
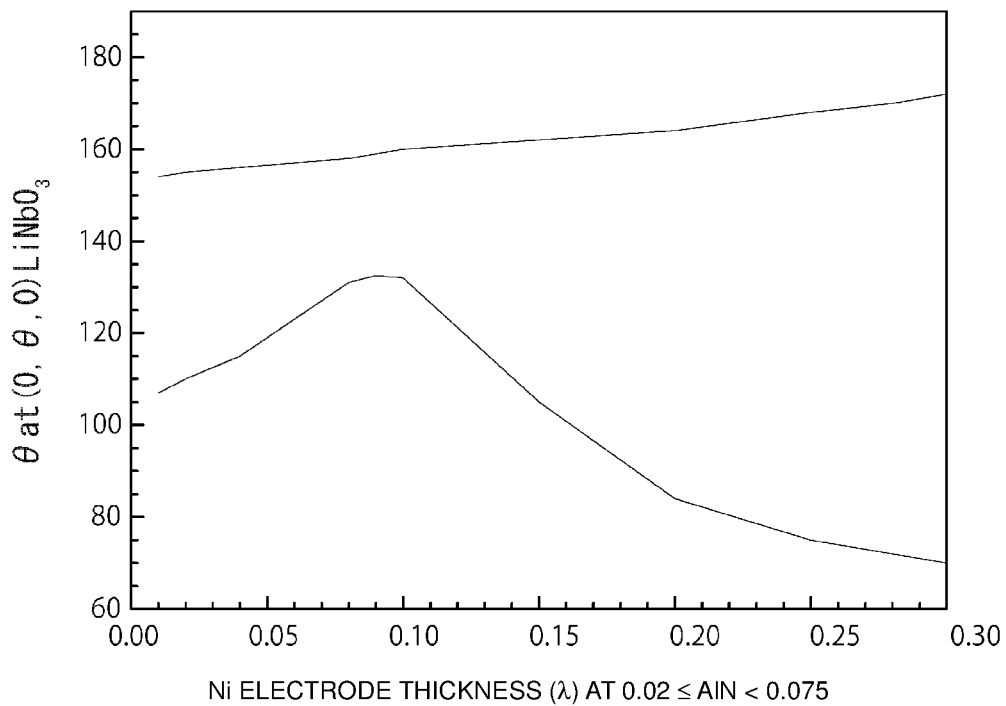
FIG. 27 is a diagram illustrating a line representing the lower limit and a line representing the upper limit of Y which is θ of the Euler angles of LiNbO$_3$ and which makes the attenuation constant α smaller than or equal to about 0.02 when the IDT electrode is composed of Ni and the wavelength-normalized thickness of the AlN film is larger than or equal to about 0.02 and smaller than about 0.075.
Figure 28:
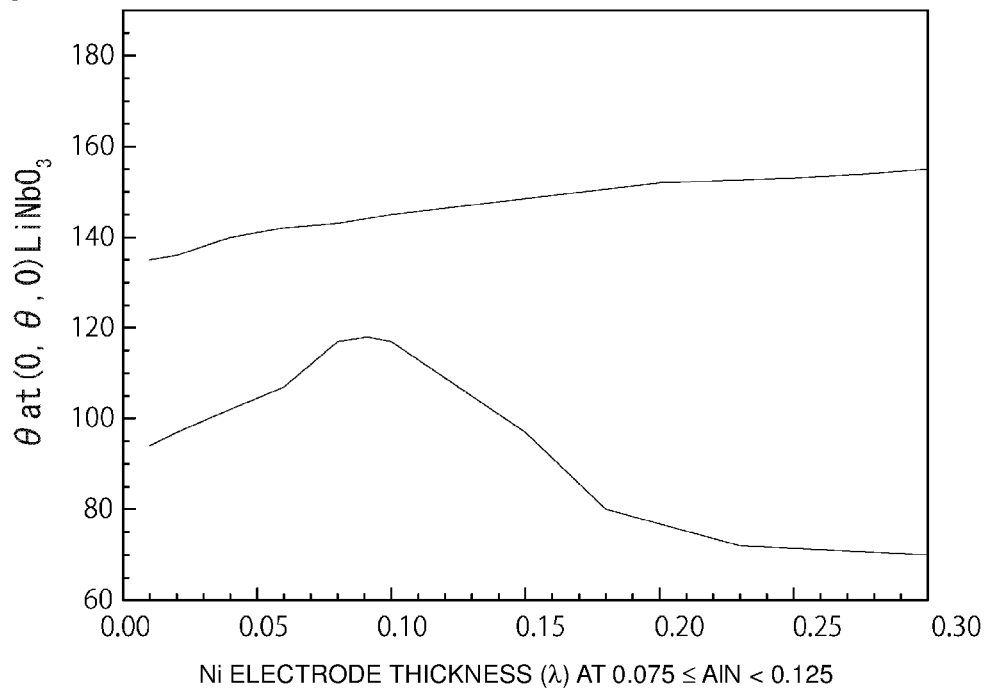
FIG. 28 is a diagram illustrating a line representing the lower limit and a line representing the upper limit of Y which is θ of the Euler angles of LiNbO$_3$ and which makes the attenuation constant α smaller than or equal to about 0.02 when the IDT electrode is composed of Ni and the wavelength-normalized thickness of the AlN film is larger than or equal to about 0.075 and smaller than about 0.125.

Likewise, when the wavelength-normalized thickness of the AlN film is larger than or equal to about 0.075 and smaller than about 0.125, Y=132−13X illustrated in FIG. 16 represents the middle value. In this case, the lower limit of Y is 132−13X−18 and the upper limit thereof is 132−13X+18 in Table 12. As for the rest of the sets in Table 12, values obtained by adding −18 and +18 to the middle value denoted by each line in FIG. 16 are the lower limit and the upper limit, respectively.

Accordingly, the attenuation constant α is able to be made smaller than or equal to about 0.02 if Y is selected to be in a specific range illustrated in Table 12 also when the IDT electrode is composed of Al.

When the IDT electrode is composed of Au, a range of Y is selected to be one of the ranges illustrated in Table 13 described above, depending on the wavelength-normalized thickness of the AlN film and the wavelength-normalized thickness X of the IDT electrode.

In FIG. 17 to FIG. 21, a lower line in the graph is the line represented by the mathematical expression of the lower limit of Y in Table 13, and an upper line is the line represented by the mathematical expression of the upper limit of Y.

Also when the IDT electrode composed of Au is used, Y, i.e., θ of the Euler angles, is selected to be in a range from the lower limit to the upper limit depending on the range of the wavelength-normalized thickness of the AlN film and the wavelength-normalized thickness of the IDT electrode composed of Au. In this way, the attenuation constant α is able to be made smaller than or equal to about 0.02.

When the IDT electrode is composed of Pt, a range of Y is selected to be one of the ranges illustrated in Table 14 described above, depending on the wavelength-normalized thickness of the AlN film and the wavelength-normalized thickness X of the IDT electrode.

In FIG. 22 to FIG. 26, a lower line in the graph is the line represented by the mathematical expression of the lower limit of Y in Table 14, and an upper line is the line represented by the mathematical expression of the upper limit of Y.

Also when the IDT electrode composed of Pt is used, Y, i.e., θ of the Euler angles, is selected to be in a range from the lower limit to the upper limit depending on the range of the wavelength-normalized thickness of the AlN film and the wavelength-normalized thickness of the IDT electrode composed of Pt. In this way, the attenuation constant α is able to be made smaller than or equal to about 0.02.

When the IDT electrode is composed of Ni, a range of Y is selected to be one of the ranges illustrated in Table 15 described above, depending on the wavelength-normalized thickness of the AlN film and the wavelength-normalized thickness X of the IDT electrode.

In FIG. 27 to FIG. 31, a lower line in the graph is the line represented by the mathematical expression of the lower limit of Y in Table 15, and an upper line is the line represented by the mathematical expression of the upper limit of Y.

Also when the IDT electrode composed of Ni is used, Y, i.e., θ of the Euler angles, is selected to be in a range from the lower limit to the upper limit depending on the range of the wavelength-normalized thickness of the AlN film and the wavelength-normalized thickness of the IDT electrode composed of Ni. In this way, the attenuation constant α is able to be made smaller than or equal to about 0.02.

Second Preferred Embodiment

In the first preferred embodiment, the aluminum nitride film 4 preferably is used as a high acoustic velocity film. In a second preferred embodiment of the present invention, a silicon nitride film is preferably used as the high acoustic velocity film instead of the aluminum nitride film. Since the rest of the structure of an elastic wave device according to the second preferred embodiment is substantially the same, the structure illustrated in FIG. 1 is also used in the second preferred embodiment. Note that a $Si_3N_4$ film preferably is used as the silicon nitride film in the second preferred embodiment; however, the silicon nitride film is not limited to the $Si_3N_4$ film and may be $Si_xN_y$ (where x and y are integers).

FIG. 32 is a diagram illustrating relationships between the wavelength-normalized thickness of the $Si_3N_4$ film and acoustic velocities in a structure in which Euler angles of the $LiNbO_3$ substrate are (0°, 160°, 0°), the IDT electrode is composed of Cu having a wavelength-normalized thickness of about 0.22, and the $Si_3N_4$ film is stacked.

As is apparent from FIG. 32, the acoustic velocity is able to be increased by increasing the film thickness of the $Si_3N_4$ film. In particular, FIG. 32 indicates that the acoustic velocity in the free state is able to be made higher than about 4080 m/s, which is the acoustic velocity of the slow transversal wave, by increasing the film thickness of the $Si_3N_4$ film. Accordingly, since the $Si_3N_4$ film is stacked to cover the IDT electrode in the second preferred embodiment, a high acoustic velocity is able to be achieved.

The inventor investigated how the attenuation constant α changes in a structure using the $Si_3N_4$ film by changing θ of the Euler angles of the $LiNbO_3$ substrate and the wavelength-normalized thickness of the $Si_3N_4$ film. FIG. 33 to FIG. 37 illustrate the results.

FIG. 33 to FIG. 37 illustrate how the attenuation constant α changes when the wavelength-normalized thickness of the $Si_3N_4$ film is set to about 0.05, about 0.10, about 0.15, about 0.20, or about 0.25, θ of the Euler angles is changed, and the metal of which the IDT electrode is composed and the wavelength-normalized thickness of the IDT electrode are fixed.

As is apparent from FIG. 33, when the IDT electrode is composed of Cu and has a wavelength-normalized thickness of about 0.08, the attenuation constant α greatly changes if θ of the Euler angles changes. FIG. 33 also indicates that the attenuation constant α can be made smaller than or equal to about 0.02 if θ of the Euler angles is set in a specific range in each case.

The same applies to FIG. 34 to FIG. 37. FIG. 34 illustrates a result of the case where the IDT electrode is composed of Au and has a wavelength-normalized thickness of about 0.038. FIG. 35 illustrates a result of the case where the IDT electrode is composed of Pt and has a wavelength-normalized thickness of about 0.034. FIG. 36 illustrates a result of the case where the IDT electrode is composed of Ni and has a wavelength-normalized thickness of about 0.08. FIG. 37 illustrates a result of the case where the IDT electrode is composed of Al and has a wavelength-normalized thickness of about 0.264.

Based on the aforementioned results, the inventor confirmed that the attenuation constant α is able to be made smaller than or equal to about 0.02 if Y which is θ of the Euler angles is set in a specific range depending on the range of the wavelength-normalized thickness of the $Si_3N_4$ film, the kind of metal which the IDT electrode is composed, and the wavelength-normalized thickness X of the IDT electrode also in the case of using the silicon nitride film, as in the case of using the aluminum nitride film. The result is any of the ranges illustrated in Table 16 to Table 20.

TABLE 16

| | Cu electrode |
|---|---|
| 0.02 ≤ <0.075 | $Y = 111 - 498X + 41204X^2 - 506285X^3 + 2.1 \times 10^6 X^4 - 2.9X^5$ to $Y = 150 + 376X - 1867X^2 + 3151X^3$ |
| 0.075 ≤ <0.125 | $Y = 96.3 - 854X + 42082X^2 - 459289X^3 + 1.86 \times 10^6 X^4 - 2.55 \times 10^6 X^5$ to $Y = 135 + 333X - 868X^2 + 621X^3$ |
| 0.125 ≤ <0.175 | $Y = 58.42 + 3058X - 122626X^2 + 2.55 \times 10^6 X^3 - 2.61 \times 10^7 X^4 + 1.35 \times 10^8 X^5 - 3.43 \times 10^8 X^6 + 3.38 \times 10^8 X^7$ to $Y = 125 + 322X - 568X^2$ |
| 0.175 ≤ <0.225 | $Y = 69.36 + 1741X - 69965X^2 + 1.51 \times 10^6 X^3 - 1.56 \times 10^7 X^4 + 8.037 \times 10^7 X^5 - 2.01 \times 10^8 X^6 + 1.95 \times 10^8 X^7$ to $Y = 126 + 263X - 424X^2$ |
| 0.225 ≤ <0.275 | $Y = 76.57 - 46.58X + 10865X^2 - 95112X^3 + 272166X^4 - 249810X^5$ to $Y = 121 + 263X - 424X^2$ |

TABLE 17

| | Al electrode |
|---|---|
| 0.02 ≤ <0.075 | $Y = 106 + 124X - 204X^2$ to $Y = 163 - 105X + 714X^2 - 1122X^3$ |
| 0.075 ≤ <0.125 | $Y = 92 + 98X - 72X^2$ to $Y = 153 - 88X + 423X^2$ |
| 0.125 ≤ <0.175 | $Y = 85 + 188X - 409X^2$ to $Y = 144 + 76X - 235X^2$ |
| 0.175 ≤ <0.225 | $Y = 80 + 197X - 433X^2$ to $Y = 141 + 67X - 188X^2$ |
| 0.225 ≤ <0.275 | $Y = 76.7 + 133.1X - 239X^2$ to $Y = 136 + 53X - 134X^2$ |

TABLE 18

| | Au electrode |
|---|---|
| 0.02 ≤ <0.075 | $Y = 138.8 - 521.5X + 59626X^2 - 1.6 \times 10^6 X^3 + 9.7 \times 10^6 X^4$ to $Y = 154.6 + 323X - 1005X^2$ |
| 0.075 ≤ <0.125 | $Y = 78.95 - 2244X + 308668X^2 - 9.23 \times 10^6 X^3 + 1.03 \times 10^8 X^4 - 3.92 \times 10^8 X^5$ to $Y = 121.5 + 1406X - 8286X^2$ |
| 0.125 ≤ <0.175 | $Y = 75.14 - 972X + 163196X^2 - 4.73 \times 10^6 X^3 + 5.02 \times 10^7 X^4 - 1.83X^5$ to $Y = 150.8 + 103.8X + 1446.4X^2$ |
| 0.175 ≤ <0.225 | $Y = 95.46 - 381X + 38962X^2 - 766242X^3 + 3.89 \times 10^6 X^4$ to $Y = 139.1 + 191.4X - 215.1X^2$ |
| 0.225 ≤ <0.275 | $Y = 90.23 - 363.8X + 15154X^2 - 181875X^3 - 8.63 \times 10^6 X^4 + 5.45 \times 10^7 X^5$ to $Y = 118.5 + 1461.9X - 8600.4X^2$ |

TABLE 19

Pt electrode

| | |
|---|---|
| 0.02 ≤ <0.075 | $Y = 137.8 + 1045.9X - 35270X^2 + 182370X^3$ to $Y = 178.8 - 459.9X + 2654.2X^2$ |
| 0.075 ≤ <0.125 | $Y = 85.3 + 1563.5X - 13505X^2 - 334251X^3 + 2.9 \times 10^6 X^4$ to $Y = 126.2 + 841.4X + 3530.7X^2 - 64451X^3$ |
| 0.125 ≤ <0.175 | $Y = 80.25 + 1737.6X - 29616X^2 + 116182X^3$ to $Y = 134.1 + 233X + 1288X^2$ |
| 0.175 ≤ <0.225 | $Y = 102 - 2120X + 171560X^2 - 4.29 \times 10^6 X^3 + 4.1 \times 10^7 X^4 - 1.35 \times 10^8 X^5$ to $Y = 143.8 + 106.3X + 681.3X^2$ |
| 0.225 ≤ <0.275 | $Y = 85.45 + 2448X - 171170X^2 + 4.82 \times 10^6 X^3 - 5.56 \times 10^7 X^4 + 2.19 \times 10^8 X^5$ to $Y = 172.2 - 496.4X + 3216X^2$ |

TABLE 20

Ni electrode

| | |
|---|---|
| 0.02 ≤ <0.075 | $Y = 77.39 + 889X - 10413X^2 + 39192X^3 - 48758X^4$ to $Y = 133.7 + 570.1X - 2561X^2 + 39863587X^3$ |
| 0.075 ≤ <0.125 | $Y = 96.1 - 265.4X + 17881X^2 - 193077X^3 + 724808X^4 - 910916X^5$ to $Y = 143.1 + 148X - 216.8X^2$ |
| 0.125 ≤ <0.175 | $Y = 83.26 - 139X + 17433X^2 - 212387X^3 + 874177X^4 - 1.2 \times 10^6 X^5$ to $Y = 143.7 + 208.6X - 275.3X^2$ |
| 0.175 ≤ <0.225 | $Y = 72.04 - 196.1X + 23821X^2 - 258686X^3 + 977904X^4 - 1.2 \times 10^6 X^5$ to $Y = 126.2 + 498.9X - 1958X^2 + 2608X^3$ |
| 0.225 ≤ <0.275 | $Y = 69.12 - 307.4X + 22905X^2$ to $Y = 120.9 + 428.9X - 1427X^2 + 1528X^3$ |

Details will be described below for each metal of which the IDT electrode is composed.

When the IDT electrode is composed of Cu, Y which is θ of the Euler angles is set to be larger than or equal to the lower limit and smaller than or equal to the upper limit illustrated in Table 16, depending on the range of the wavelength-normalized thickness of the $Si_3N_4$ film illustrated in Table 16. For example, referring to Table 16, when the wavelength-normalized thickness of $Si_3N_4$ film is larger than or equal to about 0.02 and smaller than about 0.075, Y is set to be larger than or equal to about $111-498X+41204X^2-506285X^3+2.1\times10^6X^4-2.9X^5$ and smaller than or equal to about $150+376X-1867X^2+3151X^3$. A lower line in FIG. 38 is the line represented by this mathematical expression of the lower limit, and an upper line therein is the line represented by the mathematical expression of the upper limit.

Accordingly, the value of θ of the Euler angles is set in a range from the lower line to the upper line, that is, is set to be larger than or equal to the lower limit and smaller than or equal to the upper limit, depending on the wavelength-normalized thickness of the IDT electrode composed of Cu. In this way, the attenuation constant α is able to be made smaller than or equal to about 0.02.

Lower and upper lines in FIG. 39 are the line represented by the mathematical expression of the lower limit and the line represented by the mathematical expression of the upper limit of Y, respectively, when the wavelength-normalized thickness of the $Si_3N_4$ film is larger than or equal to about 0.075 and smaller than about 0.125 in Table 16. A lower line in FIG. 40 is the line represented by the mathematical expression of the lower limit of Y that makes the attenuation constant α smaller than or equal to about 0.02 when the wavelength-normalized thickness of the $Si_3N_4$ film is larger than or equal to about 0.125 and smaller than about 0.175. An upper line is the line represented by the mathematical expression of the upper limit of Y. Accordingly, when the wavelength-normalized thickness of the $Si_3N_4$ film is larger than or equal to about 0.125 and smaller than about 0.175, Y which is θ of the Euler angles is selected to be at or above the lower line and at or below the upper line depending on the wavelength-normalized thickness of the IDT electrode composed of Cu. In this way, the attenuation constant α is able to be made smaller than or equal to about 0.02.

Likewise, FIG. 41 and FIG. 42 also illustrate the line represented by the mathematical expression of the lower limit of Y and the line represented by the mathematical expression of the upper limit of Y when the wavelength-normalized thickness of the $Si_3N_4$ film is larger than or equal to about 0.175 and smaller than about 0.225 and is larger than or equal to about 0.225 and smaller than about 0.275 illustrated in Table 16, respectively.

Also when the wavelength-normalized thickness of the $Si_3N_4$ film is larger than or equal to about 0.175 and smaller than about 0.225 or is larger than or equal to about 0.225 and smaller than about 0.275, θ of the Euler angles is selected to be in a range from the lower line to the upper line. In this way, the attenuation constant α is able to be made smaller than or equal to about 0.02.

When the IDT electrode is composed of Al, Y which is θ of the Euler angles is set to be larger than or equal to the lower limit and smaller than or equal to the upper limit illustrated in Table 17, depending on the range of the wavelength-normalized thickness of the $Si_3N_4$ film illustrated in Table 17. For example, referring to Table 17, when the wavelength-normalized thickness of the $Si_3N_4$ film is larger than or equal to about 0.02 and smaller than about 0.075, Y is set to be larger than or equal to about $106+124X-204X^2$ and smaller than or equal to about $163-105X+714X^2-1122X^3$. A lower line in FIG. 43 is the line represented by this mathematical expression of the lower limit, and an upper line therein is the line represented by the mathematical expression of the upper limit. Accordingly, the value of θ of the Euler angles is set to be larger than or equal to the lower limit and smaller than or equal to the upper limit depending on the wavelength-normalized thickness of the IDT electrode composed of Al so that the value of θ is in the range from the lower line to the upper line. In this way, the attenuation constant α is able to be made smaller than or equal to about 0.02.

Lower and upper lines in FIG. 44 are the line representing the lower limit of Y and the line represented by the mathematical expression of the upper limit of Y, respectively, when the wavelength-normalized thickness of the $Si_3N_4$ film is larger than or equal to about 0.075 and smaller than about 0.125 in Table 17. A lower line in FIG. 45 is the line represented by the mathematical expression of the lower limit of Y that makes the attenuation constant α smaller than or equal to about 0.02 when the wavelength-normalized thickness of the $Si_3N_4$ film is larger than or equal to about 0.125 and smaller than about 0.175. An upper line is the line represented by the mathematical expression of the upper limit of Y.

Likewise, FIG. 46 and FIG. 47 also illustrate the line represented by the mathematical expression of the lower limit of Y and the line represented by the mathematical expression of the upper limit of Y when the wavelength-normalized thickness of the $Si_3N_4$ film is larger than or equal to about 0.175 and smaller than about 0.225 and is larger than or equal to about 0.225 and smaller than about 0.275 in Table 17, respectively.

By selecting θ of the Euler angles to be in a range from the lower line to the upper line illustrated in FIG. 43 to FIG. 47 depending on the wavelength-normalized thickness of the $Si_3N_4$ film, the attenuation constant α is able to be made smaller than or equal to about 0.02.

When the IDT electrode is composed of Au, Y which is θ of the Euler angles is set to be larger than or equal to the lower limit and smaller than or equal to the upper limit illustrated in Table 18 depending on the range of the wavelength-normalized thickness of the $Si_3N_4$ film illustrated in Table 18. For example, referring to Table 18, when the wavelength-normalized thickness of the $Si_3N_4$ film is larger than or equal to about 0.02 and smaller than about 0.075, Y is set to be larger than or equal to about $138.8 - 521.5X + 59626X^2 - 1.6 \times 10^6 X^3 + 9.7 \times 10^6 X^4$ and smaller than or equal to about $154.6 + 323X - 1005X^2$. A lower line in FIG. 48 is the line represented by this mathematical expression of the lower limit, and an upper line is the line represented by the mathematical expression of the upper limit. Accordingly, the value of θ of the Euler angles is set to be larger than or equal to the lower limit and smaller than or equal to the upper limit depending on the wavelength-normalized thickness of the IDT electrode composed of Au so that the value θ is in the range from the lower line to the upper line. In this way, the attenuation constant α is able to be made smaller than or equal to about 0.02.

Lower and upper lines in FIG. 49 are the line representing the lower limit of Y and the line represented by the mathematical expression of the upper limit of Y, respectively, when the wavelength-normalized thickness of the $Si_3N_4$ film is larger than or equal to about 0.075 and smaller than about 0.125 in Table 18. A lower line in FIG. 50 is the line represented by the mathematical expression of the lower limit of Y that makes the attenuation constant α smaller than or equal to about 0.02 when the wavelength-normalized thickness of the $Si_3N_4$ film is larger than or equal to about 0.125 and smaller than about 0.175. An upper line is the line represented by the mathematical expression of the upper limit of Y.

Likewise, FIG. 51 and FIG. 52 also illustrate the line represented by the mathematical expression of the lower limit of Y and the line represented by the mathematical expression of the upper limit of Y when the wavelength-normalized thickness of the $Si_3N_4$ film is larger than or equal to about 0.175 and smaller than about 0.225 and is larger than or equal to about 0.225 and smaller than about 0.275 illustrated in Table 18, respectively.

By selecting θ of the Euler angles to be in a range from the lower line to the upper line illustrated in FIG. 48 to FIG. 52 depending on the range of the wavelength-normalized thickness of the $Si_3N_4$ film, the attenuation constant α is able to be made smaller than or equal to about 0.02.

When the IDT electrode is composed of Pt, Y which is θ of the Euler angles is set to be larger than or equal to the lower limit and smaller than or equal to the upper limit illustrated in Table 19 in accordance with the range of the wavelength-normalized thickness of the $Si_3N_4$ film illustrated in Table 19. For example, referring to Table 19, when the wavelength-normalized thickness of the $Si_3N_4$ film is larger than or equal to about 0.02 and smaller than about 0.075, Y is set to be larger than or equal to about $137.8 + 1045.9X - 35270X^2 + 182370X^3$ and smaller than or equal to about $178.8 - 459.9X + 2654.2X^2$. A lower line in FIG. 53 is the line represented by this mathematical expression of the lower limit, and an upper line is the line represented by the mathematical expression of the upper limit. Accordingly, the value of θ of the Euler angles is set to be larger than or equal to the lower limit and smaller than or equal to the upper limit depending on the wavelength-normalized thickness of the IDT electrode composed of Pt so that the value of θ is in the range from the lower line to the upper line. In this way, the attenuation constant α is able to be made smaller than or equal to about 0.02.

Lower and upper lines in FIG. 54 are the line representing the lower limit of Y and the line represented by the mathematical expression of the upper limit of Y, respectively, when the wavelength-normalized thickness of the $Si_3N_4$ film is larger than or equal to about 0.075 and smaller than about 0.125 in Table 19. A lower line in FIG. 55 is the line represented by the mathematical expression of the lower limit of Y that makes the attenuation constant α smaller than or equal to about 0.02 when the wavelength-normalized thickness of the $Si_3N_4$ film is larger than or equal to about 0.125 and smaller than about 0.175. An upper line is the line represented by the mathematical expression of the upper limit of Y.

Likewise, FIG. 56 and FIG. 57 also illustrate the line represented by the mathematical expression of the lower limit of Y and the line represented by the mathematical expression of the upper limit of Y when the wavelength-normalized thickness of the $Si_3N_4$ film is larger than or equal to about 0.175 and smaller than about 0.225 and is larger than or equal to about 0.225 and smaller than about 0.275 illustrated in Table 19, respectively.

By selecting θ of the Euler angles to be in a range from the lower line to the upper line illustrated in FIG. 53 to FIG. 57 depending on the wavelength-normalized thickness of the $Si_3N_4$ film, the attenuation constant α is able to be made smaller than or equal to about 0.02.

When the IDT electrode is composed of Ni, Y which is θ of the Euler angles is set to be larger than or equal to the lower limit and smaller than or equal to the upper limit illustrated in Table 20 depending on the range of the wavelength-normalized thickness of the $Si_3N_4$ film illustrated in Table 20. For example, referring to Table 20, when the wavelength-normalized thickness of the $Si_3N_4$ film is larger than or equal to about 0.02 and smaller than about 0.075, Y is set to be larger than or equal to about $77.39 + 889X - 10413X^2 + 39192X^3 - 48758X^4$ and smaller than or equal to about $133.7 + 570.1X - 2561X^2 + 39863587X^3$. A lower line in FIG. 58 is the line represented by this mathematical expression of the lower limit, and an upper line is the line represented by the mathematical expression of the upper limit. Accordingly, the value of θ of the Euler angles is set to be larger than or equal to the lower limit and smaller than or equal to the upper limit depending on the wavelength-normalized thickness of the IDT electrode composed of Ni so that the value of θ is in the range from the lower line to the upper line. In this way, the attenuation constant α is able to be made smaller than or equal to about 0.02.

Lower and upper lines in FIG. 59 are the line representing the lower limit of Y and the line represented by the mathematical expression of the upper limit of Y, respectively, when the wavelength-normalized thickness of the $Si_3N_4$ film is larger than or equal to about 0.075 and smaller than about 0.125 in Table 20. A lower line in FIG. 60 is the line represented by the mathematical expression of the lower limit of Y that makes the attenuation constant α smaller than or equal to about 0.02 when the wavelength-normalized thickness of the $Si_3N_4$ film is larger than or equal to about 0.125 and smaller than about 0.175. An upper line is the line represented by the mathematical expression of the upper limit of Y.

Likewise, FIG. 61 and FIG. 62 also illustrate the line represented by the mathematical expression of the lower limit of Y and the line represented by the mathematical expression of the upper limit of Y when the wavelength-normalized thickness of the $Si_3N_4$ film is larger than or equal to about 0.175 and smaller than about 0.225 and is larger than or equal to about 0.225 and smaller than about 0.275 illustrated in Table 20, respectively.

By selecting θ of the Euler angles to be in a range from the lower line to the upper line illustrated in FIG. 58 to FIG. 62 depending on the wavelength-normalized thickness of the $Si_3N_4$ film, the attenuation constant α is able to be made smaller than or equal to about 0.02 similarly.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An elastic wave device comprising:
a $LiNbO_3$ substrate;
an IDT electrode disposed on the $LiNbO_3$ substrate; and
an aluminum nitride film disposed on the $LiNbO_3$ substrate to cover the IDT electrode such that the elastic wave device utilizes a leaky elastic wave that propagates on the $LiNbO_3$ substrate; wherein
the IDT electrode is composed of a metal including, as a main component, one material selected from a group consisting of Cu, Al, Au, Pt, and Ni;
Euler angles of the $LiNbO_3$ substrate are (0°±5°, θ, 0°±5°);
when X denotes a wavelength-normalized thickness of the IDT electrode and Y denotes θ of the Euler angles, Y is in any of ranges in Table 1 to Table 5 depending on a kind of the metal of which the IDT electrode is composed and a range of a wavelength-normalized thickness of the aluminum nitride film:

TABLE 1

Cu electrode

| | |
|---|---|
| 0.02 ≤ <0.075 | Y = 119.8 − 1644X + 64107$X^2$ − 820434$X^3$ + 4.5 × $10^6 X^4$ − 1.2 × $10^7 X^5$ + 1.1$X^6$ to Y = 153 + 169X − 363$X^2$ |
| 0.075 ≤ <0.125 | Y = 106.7 − 1278X + 53014$X^2$ − 700901$X^3$ + 4.1 × $10^6 X^4$ − 1.1 × $10^7 X^5$ + 1.1 × $10^7 X^6$ to Y = 143 + 209X − 739$X^2$ + 907$X^3$ |
| 0.125 ≤ <0.175 | Y = 89.6 − 493X + 25919$X^2$ − 255926$X^3$ + 911653$X^4$ − 1.1$X^5$ to Y = 132 + 207X − 195$X^2$ |
| 0.175 ≤ <0.225 | Y = 79.4 − 207.6X + 21115$X^2$ − 220752$X^3$ + 803734$X^4$ − 988585$X^5$ to Y = 124 + 547X − 2351$X^2$ + 3513$X^3$ |
| 0.225 ≤ <0.275 | Y = 70.4 − 35.7X + 13366$X^2$ − 125408$X^3$ + 392064$X^4$ − 406193$X^5$ to Y = 125.8 + 547.4X − 2351$X^2$ + 3513$X^3$ |

TABLE 2

Al electrode

| | |
|---|---|
| 0.02 ≤ <0.075 | Y = 154 − 17X − 18 to Y = 154 − 17X + 18 |
| 0.075 ≤ <0.125 | Y = 132 − 13X − 18 to Y = 132 − 13X + 18 |
| 0.125 ≤ <0.175 | Y = 116 − 13X − 18 to Y = 116 − 13X + 18 |
| 0.175 ≤ <0.225 | Y = 101 − 13X − 18 to Y = 101 − 13X + 18 |
| 0.225 ≤ <0.275 | Y = 88 − 13X − 18 to Y = 88 − 13X + 18 |

TABLE 3

Au electrode

| | |
|---|---|
| 0.02 ≤ <0.075 | Y = 143.1 − 2591X + 221241$X^2$ − 6.66109 × $10^6 X^3$ + 7.5 × $10^7 X^4$ − 2.9 × $10^8 X^5$ to Y = 154 + 513X − 2508$X^2$ |
| 0.075 ≤ <0.125 | Y = 113.3 − 1613X + 173621$X^2$ − 5.4 × $10^6 X^3$ + 6.1 × $10^7 X^4$ − 2.4 × $10^8 X^5$ to Y = 151 + 187X + 1187$X^2$ |
| 0.125 ≤ <0.175 | Y = 91.57 − 1590X + 203628$X^2$ − 5.7 × $10^6 X^3$ + 5.8 × $10^7 X^4$ − 2.1 × $10^8 X^5$ to Y = 140 + 265X + 623$X^2$ |
| 0.175 ≤ <0.225 | Y = 103.7 − 559.1X + 42955$X^2$ − 704717$X^3$ + 3 × $10^6 X^4$ to Y = 146 + 191X − 215$X^2$ |
| 0.225 ≤ <0.275 | Y = 88.8 + 26.8X + 66840$X^2$ − 4.45 × $10^6 X^3$ + 1.15 × $10^8 X^4$ − 1.25 × $10^9 X^5$ + 4.8 × $10^9 X^6$ to Y = 176 − 450X + 2317$X^2$ |

TABLE 4

Pt electrode

| | |
|---|---|
| 0.02 ≤ <0.075 | Y = 134 + 303X + 2874$X^2$ − 445059$X^3$ + 3$X^4$ to Y = 159 + 333X − 1040$X^2$ |
| 0.075 ≤ <0.125 | Y = 101 − 345X + 66704$X^2$ − 1.4 × $10^6 X^3$ + 7.6 × $10^6 X^4$ to Y = 147 + 350X + 281$X^2$ |
| 0.125 ≤ <0.175 | Y = 94.45 − 2780X + 313312$X^2$ − 9.1 × $10^6 X^3$ + 10 × $10^7 X^4$ − 3.8 × $10^8 X^5$ to Y = 140 + 258X + 918$X^2$ |
| 0.175 ≤ <0.225 | Y = 101.1 + 1132X − 94867$X^2$ + 3.4 × $10^6 X^3$ − 4.8 × $10^7 X^4$ + 2.2 × $10^8 X^5$ to Y = 154 − 66X + 1563$X^2$ |
| 0.225 ≤ <0.275 | Y = 91.1 − 793.7X + 132135$X^2$ − 6.4 × $10^6 X^3$ + 1.4 × $10^8 X^4$ − 1.4 × $10^9 X^5$ + 5.1 × $10^9 X^6$ to Y = 175 − 527X + 4617$X^2$ − 13850$X^3$ |

TABLE 5

Ni electrode

| | |
|---|---|
| 0.02 ≤ <0.075 | Y = 115.9 − 1162X + 47603X2 − 584771$X^3$ + 3.1 × $10^6 X^4$ − 7.4 × $10^6 X^5$ + 6.7 × $10^6 X^6$ to Y = 154 + 51X + 19.5$X^2$ |
| 0.075 ≤ <0.125 | Y = 100.3 − 769X + 30871$X^2$ − 326052$X^3$ + 1.3 × $10^6 X^4$ − 1.7 × $10^6 X^5$ to Y = 134 + 154X − 300$X^2$ |
| 0.125 ≤ <0.175 | Y = 67.99 + 1440X − 46900$X^2$ + 917682$X^3$ − 9.1 × $10^6 X^4$ + 4.5 × $10^7 X^5$ − 1.1 × $10^8 X^6$ + 1.1 × $10^8 X^7$ to Y = 139 + 194X − 177$X^2$ |
| 0.175 ≤ <0.225 | Y = 68.79 + 618.4X − 15149$X^2$ + 215569$X^3$ − 1.35 × $10^6 X^4$ + 3.64 × $10^6 X^5$ − 3.51 × $10^6 X^6$ to Y = 129 + 642X − 3232$X^2$ + 5479$X^3$ |
| 0.225 ≤ <0.275 | Y = 59.867 + 826.5X − 15571$X^2$ + 176484$X^3$ − 985113$X^4$ + 2.5 × $10^6 X^5$ − 2.3 × $10^6 X^6$ to Y = 118 + 576X − 2604$X^2$ + 4075$X^3$. |

2. An elastic wave device comprising:
a $LiNbO_3$ substrate;
an IDT electrode disposed on the $LiNbO_3$ substrate; and
a silicon nitride film disposed on the $LiNbO_3$ substrate to cover the IDT electrode such that the elastic wave device utilizes a leaky elastic wave that propagates on the $LiNbO_3$ substrate; wherein
the IDT electrode is composed of a metal including, as a main component, one material selected from a group consisting of Cu, Al, Au, Pt, and Ni;
Euler angles of the $LiNbO_3$ substrate are (0°±5°, θ, 0°±5°);
when X denotes a wavelength-normalized thickness of the IDT electrode and Y denotes θ of the Euler angles, Y is in any of ranges in Table 6 to Table 10 depending on a kind of the metal of which the IDT electrode is composed and a range of a wavelength-normalized thickness of the silicon nitride film:

TABLE 6

Cu electrode

| | |
|---|---|
| $0.02 \leq <0.075$ | $Y = 111 - 498X + 41204X^2 - 506285X^3 + 2.1 \times 10^6 X^4 - 2.9X^5$ to $Y = 150 + 376X - 1867X^2 + 3151X^3$ |
| $0.075 \leq <0.125$ | $Y = 96.3 - 854X + 42082X^2 - 459289X^3 + 1.86 \times 10^6 X^4 - 2.55 \times 10^6 X^5$ to $Y = 135 + 333X - 868X^2 + 621X^3$ |
| $0.125 \leq <0.175$ | $Y = 58.42 + 3058X - 122626X^2 + 2.55 \times 10^6 X^3 - 2.61 \times 10^7 X^4 + 1.35 \times 10^8 X^5 - 3.43 \times 10^8 X^6 + 3.38 \times 10^8 X^7$ to $Y = 125 + 322X - 568X^2$ |
| $0.175 \leq <0.225$ | $Y = 69.36 + 1741X - 69965X^2 + 1.51 \times 10^6 X^3 - 1.56 \times 10^7 X^4 + 8.037 \times 10^7 X^5 - 2.01 \times 10^8 X^6 + 1.95 \times 10^8 X^7$ to $Y = 126 + 263X - 424X^2$ |
| $0.225 \leq <0.275$ | $Y = 76.57 - 46.58X + 10865X^2 - 95112X^3 + 272166X^4 - 249810X^5$ to $Y = 121 + 263X - 424X^2$ |

TABLE 7

Al electrode

| | |
|---|---|
| $0.02 \leq <0.075$ | $Y = 106 - 124X - 204X^2$ to $Y = 163 - 105X + 714X^2 - 1122X^3$ |
| $0.075 \leq <0.125$ | $Y = 92 + 98X - 72X^2$ to $Y = 153 - 88X + 423X^2$ |
| $0.125 \leq <0.175$ | $Y = 85 + 188X - 409X^2$ to $Y = 144 + 76X - 235X^2$ |
| $0.175 \leq <0.225$ | $Y = 80 + 197X - 433X^2$ to $Y = 141 + 67X - 188X^2$ |
| $0.225 \leq <0.275$ | $Y = 76.7 + 133.1X - 239X^2$ to $Y = 136 + 53X - 134X^2$ |

TABLE 8

Au electrode

| | |
|---|---|
| $0.02 \leq <0.075$ | $Y = 138.8 - 521.5X + 59626X^2 - 1.6 \times 10^6 X^3 + 9.7 \times 10^6 X^4$ to $Y = 154.6 + 323X - 1005X^2$ |
| $0.075 \leq <0.125$ | $Y = 78.95 - 2244X + 308668X^2 - 9.23 \times 10^6 X^3 + 1.03 \times 10^8 X^4 - 3.92 \times 10^8 X^5$ to $Y = 121.5 + 1406X - 8286X^2$ |
| $0.125 \leq <0.175$ | $Y = 75.14 - 972X + 163196X^2 - 4.73 \times 10^6 X^3 + 5.02 \times 10^7 X^4 - 1.83X^5$ to $Y = 150.8 + 103.8X + 1446.4X^2$ |
| $0.175 \leq <0.225$ | $Y = 95.46 - 381X + 38962X^2 - 766242X^3 + 3.89 \times 10^6 X^4$ to $Y = 139.1 + 191.4X - 215.1X^2$ |
| $0.225 \leq <0.275$ | $Y = 90.23 - 363.8X + 15154X^2 - 181875X^3 - 8.63 \times 10^6 X^4 + 5.45 \times 10^7 X^5$ to $Y = 118.5 + 1461.9X - 8600.4X^2$ |

TABLE 9

Pt electrode

| | |
|---|---|
| $0.02 \leq <0.075$ | $Y = 137.8 + 1045.9X - 35270X^2 + 182370X^3$ to $Y = 178.8 - 459.9X + 2654.2X^2$ |
| $0.075 \leq <0.125$ | $Y = 85.3 + 1563.5X - 13505X^2 - 334251X^3 + 2.9 \times 10^6 X^4$ to $Y = 126.2 + 841.4X + 3530.7X^2 - 64451X^3$ |
| $0.125 \leq <0.175$ | $Y = 80.25 + 1737.6X - 29616X^2 + 116182X^3$ to $Y = 134.1 + 233X + 1288X^2$ |
| $0.175 \leq <0.225$ | $Y = 102 - 2120X + 171560X^2 - 4.29 \times 10^6 X^3 + 4.1 \times 10^7 X^4 - 1.35 \times 10^8 X^5$ to $Y = 143.8 + 106.3X + 681.3X^2$ |
| $0.225 \leq <0.275$ | $Y = 85.45 + 2448X - 171170X^2 + 4.82 \times 10^6 X^3 - 5.56 \times 10^7 X^4 + 2.19 \times 10^8 X^5$ to $Y = 172.2 - 496.4X + 3216X^2$ |

TABLE 10

Ni electrode

| | |
|---|---|
| $0.02 \leq <0.075$ | $Y = 77.39 + 889X - 10413X^2 + 39192X^3 - 48758X^4$ to $Y = 133.7 + 570.1X - 2561X^2 + 39863587X^3$ |
| $0.075 \leq <0.125$ | $Y = 96.1 - 265.4X + 17881X^2 - 193077X^3 + 724808X^4 - 910916X^5$ to $Y = 143.1 + 148X - 216.8X^2$ |
| $0.125 \leq <0.175$ | $Y = 83.26 - 139X + 17433X^2 - 212387X^3 + 874177X^4 - 1.2 \times 10^6 X^5$ to $Y = 143.7 + 208.6X - 275.3X^2$ |
| $0.175 \leq <0.225$ | $Y = 72.04 - 196.1X + 23821X^2 - 258686X^3 + 977904X^4 - 1.2 \times 10^6 X^5$ to $Y = 126.2 + 498.9X - 1958X^2 + 2608X^3$ |
| $0.225 \leq <0.275$ | $Y = 69.12 - 307.4X + 22905X^2$ to $Y = 120.9 + 428.9X - 1427X^2 + 1528X^3$ |

3. The elastic wave device according to claim 1, wherein an attenuation constant is about 0.2 or less.

4. The elastic wave device according to claim 2, wherein an attenuation constant is about 0.2 or less.

\* \* \* \* \*